(12) United States Patent
Baek

(10) Patent No.: US 11,895,838 B2
(45) Date of Patent: Feb. 6, 2024

(54) VERTICAL MEMORY DEVICES

(71) Applicant: SAMSUNG ELECTRONICS CO., LTD., Suwon-si (KR)

(72) Inventor: Seokcheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 17/158,107

(22) Filed: Jan. 26, 2021

(65) Prior Publication Data

US 2021/0384218 A1 Dec. 9, 2021

(30) Foreign Application Priority Data

Jun. 3, 2020 (KR) ........................ 10-2020-0067209

(51) Int. Cl.
| | | |
|---|---|---|
| *H10B 43/27* | (2023.01) | |
| *H01L 23/522* | (2006.01) | |
| *H10B 41/10* | (2023.01) | |
| *H10B 41/27* | (2023.01) | |
| *H10B 43/10* | (2023.01) | |

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02)

(58) Field of Classification Search
CPC ......... H01L 27/11519; H01L 27/11556; H01L 27/11565; H01L 27/11578; H01L 27/11866; H01L 27/11563–11582; H01L 23/5227; H10B 43/27; H10B 43/10; H10B 43/20; H10B 41/27; H10B 41/10; H10B 51/00
See application file for complete search history.

(56) References Cited

U.S. PATENT DOCUMENTS

| | | | |
|---|---|---|---|
| 9,673,213 B1 | 6/2017 | Yu et al. | |
| 9,865,540 B2 | 1/2018 | Kim et al. | |
| 9,911,692 B2 | 3/2018 | Smith et al. | |
| 9,960,181 B1 * | 5/2018 | Cui | H01L 29/40117 |
| 10,355,009 B1 | 7/2019 | Kai et al. | |
| 2019/0326316 A1 * | 10/2019 | Son | H01L 27/11582 |
| 2019/0378857 A1 | 12/2019 | Lee | |
| 2020/0127003 A1 * | 4/2020 | Hua | H01L 27/1157 |

FOREIGN PATENT DOCUMENTS

| | | |
|---|---|---|
| CN | 108417576 A | 8/2018 |
| CN | 110800109 A | 2/2020 |
| KR | 10-2017-0046892 A | 5/2017 |

* cited by examiner

*Primary Examiner* — Christopher A Johnson
(74) *Attorney, Agent, or Firm* — Muir Patent Law, PLLC

(57) ABSTRACT

A vertical memory device includes a first gate structure on a substrate, the first gate structure including first gate electrodes spaced from each other in a first direction and stacked in a staircase shape, a second gate structure on the first gate structure and including second gate electrodes spaced from each other in the first direction and stacked in the staircase shape, a channel extending through the first and second gate structures, and a contact plug extending in the first direction through the first and second gate structures, wherein second steps at end portions of the second gate electrodes overlap first steps at end portions of the first gate electrodes, and wherein the contact plug extends through at least one of the first steps and through at least one of the second steps, while being electrically connected only to the first steps or to the second steps.

20 Claims, 72 Drawing Sheets

VERTICAL MEMORY DEVICES

CROSS-REFERENCE TO RELATED APPLICATION

Korean Patent Application No. 10-2020-0067209, filed on Jun. 3, 2020, in the Korean Intellectual Property Office, and entitled: "Vertical Memory Devices," is incorporated by reference herein in its entirety.

BACKGROUND

1. Field

Embodiments relate to a vertical memory device.

2. Description of the Related Art

In a method of manufacturing a VNAND flash memory device, a contact plug may be formed to contact some vertically stacked gate electrodes. A method of forming the contact plug efficiently is needed.

SUMMARY

According to an aspect of embodiments, there is provided a vertical memory device including a first gate electrode structure, a second gate electrode structure, a channel, and a contact plug. The first gate electrode structure may be formed on a first substrate, and may include first gate electrodes spaced apart from each other in a first direction substantially perpendicular to an upper surface of the first substrate and sequentially stacked in a staircase shape. The second gate electrode structure may be formed on the first gate electrode structure, and may include second gate electrodes spaced apart from each other in the first direction and sequentially stacked in a staircase shape. The channel may extend on the first substrate in the first direction through the first and second gate electrode structures. The contact plug may extend in the first direction through the first and second gate electrode structures. Second steps at end portions of the second gate electrodes, respectively, may overlap in the first direction first steps at end portions of the first gate electrodes, respectively. The contact plug may extend through one of the first steps and one of the second steps, and may be electrically connected to only the one of the first steps or only the one of the second steps.

According to another aspect of embodiments, there is provided a vertical memory device including gate electrode structures, a channel, and a division pattern structure. The gate electrode structures may be formed on a substrate, and each of the gate electrode structures may include gate electrodes spaced apart from each other in a first direction substantially perpendicular to an upper surface of the substrate and sequentially stacked in a staircase shape. Each of the gate electrodes may extend in a second direction substantially parallel to the upper surface of the substrate, and the gate electrode structures may be spaced apart from each other in a third direction substantially parallel to the upper surface of the substrate and crossing the second direction. The channel may extend on the substrate in the first direction through each of the gate electrode structures. The division pattern structure may be formed on the substrate, and may include vertical portions and a horizontal portion. The vertical portions may be spaced apart from each other in the second direction and arranged in a zigzag pattern, and each of the vertical portions may extend in the first direction. The horizontal portion may extend from a sidewall of each of the vertical portions in a horizontal direction substantially parallel to the upper surface of the substrate. The vertical portions of the division pattern structure may be connected with each other via the horizontal portion, such that the division pattern structure may extend in the second direction to divide the gate electrode structures in the third direction.

According to yet another aspect of embodiments, there is provided a vertical memory device including a first gate electrode structure, a second gate electrode structure, a channel, first contact plugs, and second contact plugs. The first gate electrode structure may be formed on a substrate, and may include first gate electrodes spaced apart from each other in a first direction substantially perpendicular to an upper surface of the substrate and sequentially stacked in a staircase shape. Each of the first gate electrodes may extend in a second direction substantially parallel to the upper surface of the substrate. The second gate electrode structure may be formed on the first gate electrode structure, and may include second gate electrodes spaced apart from each other in the first direction and sequentially stacked in a staircase shape. Each of the second gate electrodes may extend in the second direction. The channel may extend on the substrate in the first direction through the first and second gate electrode structures. Each of the first contact plugs may extend in the first direction at least through the first gate electrode structure among the first and second gate electrode structures. Each of the second contact plugs may extend in the first direction at least through the second gate electrode structure among the first and second gate electrode structures. Second steps at end portions in the second direction of the second gate electrodes, respectively, may overlap in the first direction first steps at end portions in the second direction of the first gate electrodes, respectively. Each of the first contact plugs may include a first vertical portion extending in the first direction at least through the first gate electrode structure and a first protrusion portion protruding from the first vertical portion in a horizontal direction substantially parallel to the upper surface of the substrate. The first protrusion portion of each of the first contact plugs may contact an upper surface of a corresponding one of the first gate electrodes to be electrically connected thereto. Each of the second contact plugs may include a second vertical portion extending in the first direction at least through the second gate electrode structure and a second protrusion portion protruding from the second vertical portion in the horizontal direction. The second protrusion portion of each of the second contact plugs may contact an upper surface of a corresponding one of the second gate electrodes to be electrically connected thereto.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter in the specification (and not necessarily in the claims), a direction substantially perpendicular to an upper surface of a first substrate may be referred to as a first direction D1, and two directions substantially parallel to the upper surface of the first substrate and crossing each other may be referred to as second and third directions D2 and D3, respectively. In example embodiments, the second and third directions D2 and D3 may be substantially perpendicular to each other. Further, two directions substantially parallel to the upper surface of the first substrate and crossing each other, which may have an acute angle with respect to the second and third directions D2 and D3, may be referred to as fourth and fifth directions D4 and D5, respectively. In example embodiments, the fourth and fifth directions D4 and D5 may be substantially perpendicular to each other, and may have 45 degrees with respect to the second and third directions D2 and D3.

Figure 40:
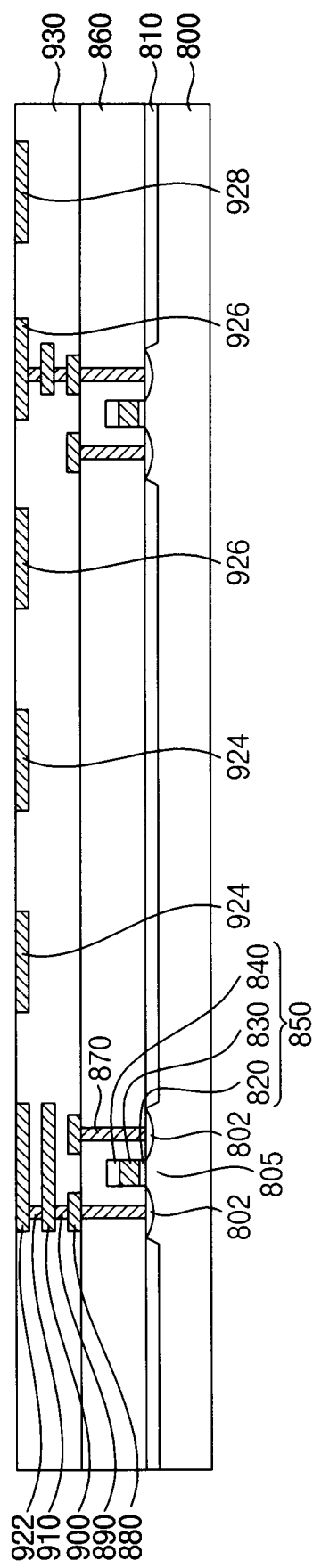
Figure 41:
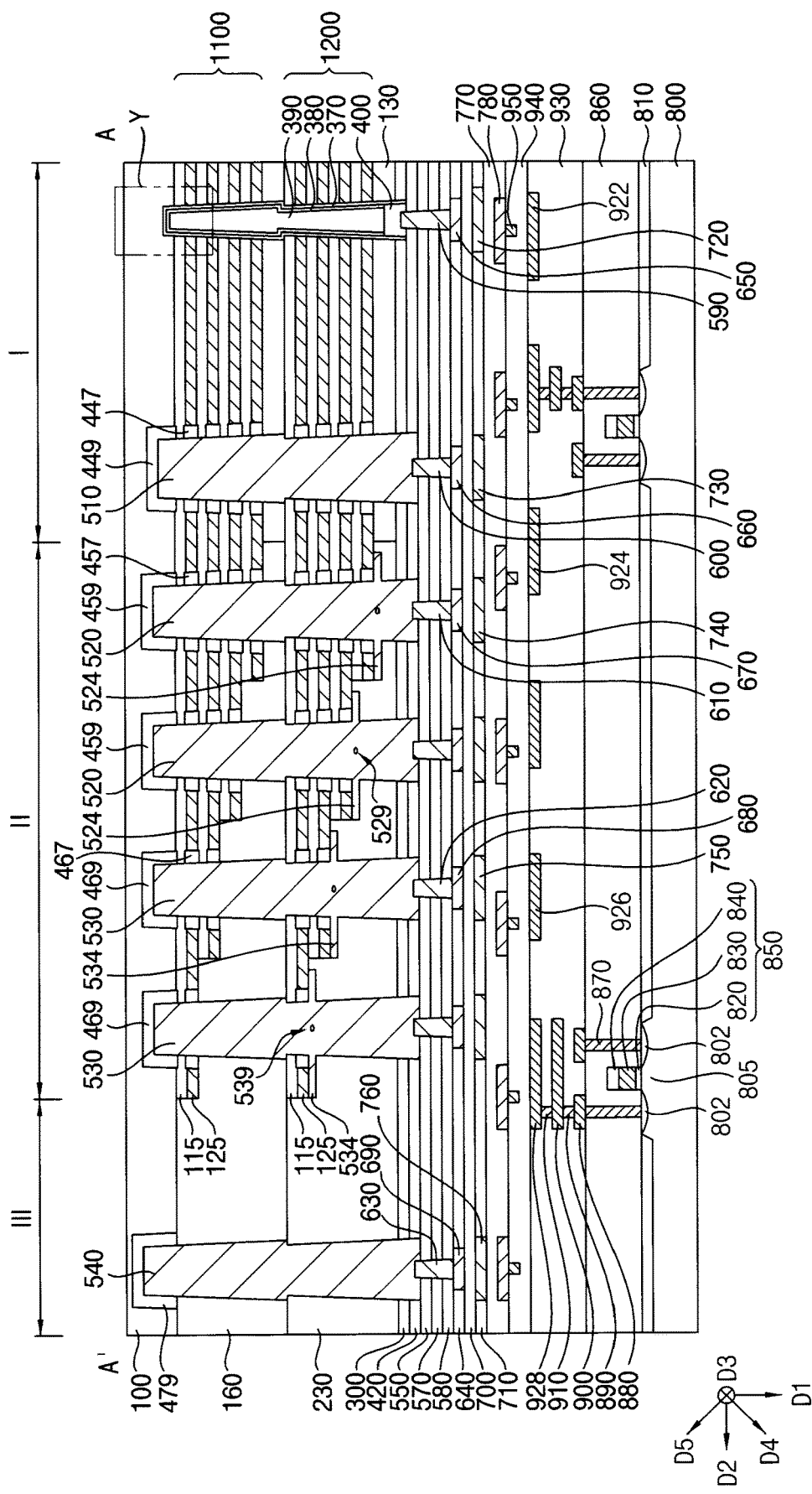

FIGS. 1 to 46 are plan views and cross-sectional views illustrating stages in a method of manufacturing a vertical memory device in accordance with example embodiments. Particularly, FIGS. 1, 3, 6, 10, 13-14, 19, 22, 27, 32 and 37 are the plan views. FIGS. 2, 4, 7, 11, 15, 18, 20, 23, 25, 28, 30, 33, 39 and 41 are cross-sectional views taken along lines A-A', respectively, of corresponding plan views. FIGS. 5, 8, 12, 16, 31, 34 and 42 are cross-sectional views taken along lines B-B', respectively, of corresponding plan views, and FIGS. 9, 17, 24, 26, 29, 35-36, 38 and 43 are cross-sectional views taken along lines C-C', respectively, of corresponding plan views. FIG. 21 is an enlarged cross-sectional view of region X of FIG. 20, FIGS. 44 to 46 are enlarged cross-sectional views of region Y of FIG. 41, and FIG. 40 is a drawing of a second substrate.

Figure 1:
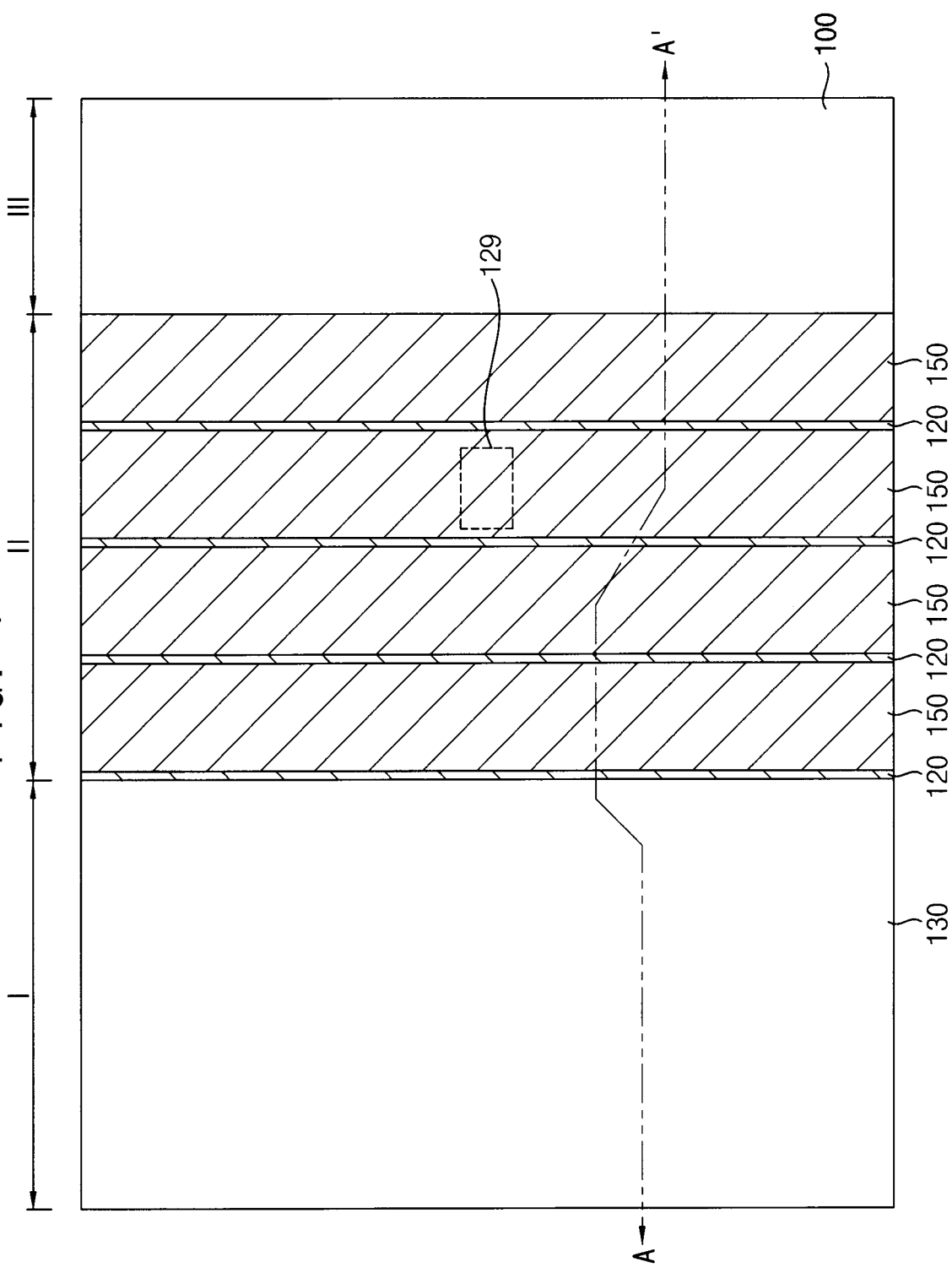
FIGS. 1 to 46 are plan views and cross-sectional views of stages in a method of manufacturing a vertical memory device in accordance with example embodiments.
Figure 2:
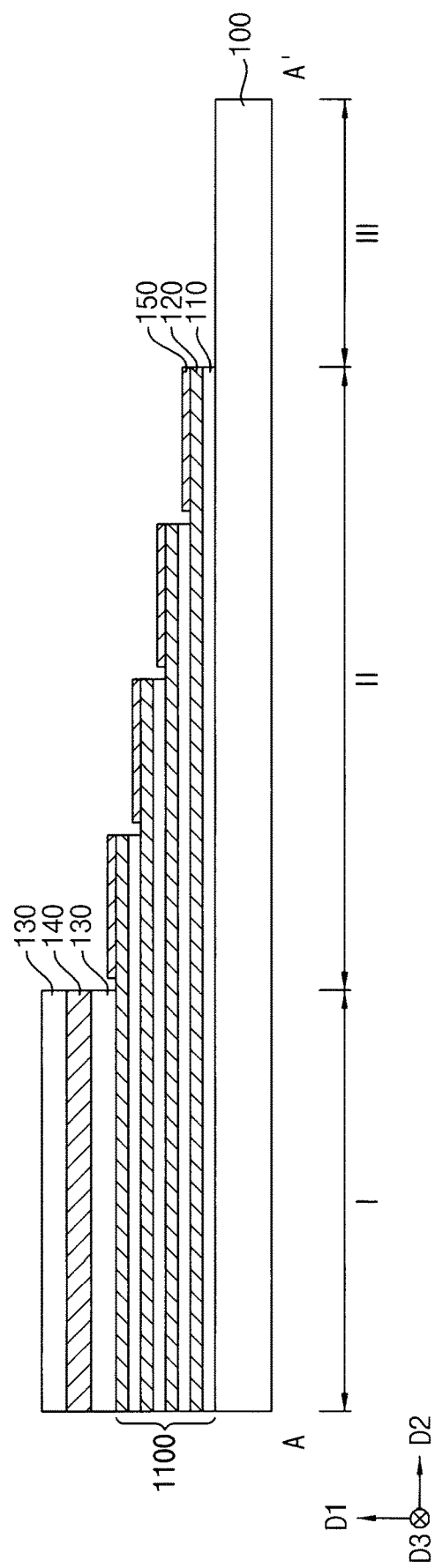

Referring to FIGS. 1 and 2, a first insulation layer 110 and a gate electrode layer 120 may be alternately and repeatedly stacked in the first direction D1 on a first substrate 100 to form a first mold layer structure. A second insulation layer 130, a first etch stop layer 140, and another second insulation layer 130 may be stacked on the first mold layer structure.

The first substrate 100 may include, e.g., silicon, germanium, silicon-germanium or a III-V compound such as GaP, GaAs, GaSb, etc. In some embodiments, the first substrate 100 may be a silicon-on-insulator (SOI) substrate or a germanium-on-insulator (GOI) substrate. P-type impurities or n-type impurities may be doped into the first substrate 100.

The first substrate 100 may include first, second and third regions I, II and III. The first region I may be a cell array region, i.e., a region in which memory cells are formed. The second region II may at least partially surround the first region I, and may be a pad region or an extension region, i.e., a region in which contact plugs for transferring electrical signals to the memory cells are formed. The third region III may at least partially surround the second region II, and may be a peripheral circuit region, i.e., a region in which peripheral circuits for applying electrical signals to the memory cells are formed.

The vertical memory device may include a plurality of memory blocks disposed in the third direction D3 on the first substrate 100, and FIG. 1 shows a portion of the first substrate 100 on which one memory block is formed. That is, each of the memory blocks may extend in the second direction D2 on the first substrate 100, and may be formed in the second direction D2 on the third region III, the second region II, and the first region I of the first substrate 100. FIG. 1 shows an end portion in the second direction D2 of one memory block, i.e., an end portion in the second direction D2 of the first region I and portions of the second and third regions II and III adjacent thereto in the second direction D2.

In example embodiments, each of the memory blocks may include two portions disposed in the third direction D3, which may be referred to as first and second portions, respectively.

The first and second insulation layers 110 and 130 may include an oxide, e.g., silicon oxide, the gate electrode layer 120 may include, e.g., polysilicon doped with n-type or p-type impurities, and the first etch stop layer 140 may include a material having a high etching selectivity with respect to the second insulation layer 130, e.g., a nitride such as silicon nitride.

FIG. 2 shows that the first mold layer structure includes the first insulation layers 110 and the gate electrode layers 120 at four levels, e.g., each of the first insulation layers 110 and the gate electrode layers 120 may alternate repeatedly four times to define a stack of four pairs of the first insulation layers 110 and the gate electrode layers 120. However, embodiments are not limited thereto, e.g., the first mold layer structure may include the first insulation layers 110 and the gate electrode layers 120 at more than four levels, respectively.

In an example embodiment, a portion of a lowermost one of the gate electrode layers 120 on the second region II of the first substrate 100 may be removed to form a first opening exposing a lowermost one of the first insulation layers 110, and a first division pattern 129 may be formed in the first opening. The first division pattern 129 may be formed at a boundary area between the first and second portions of each of the memory blocks, and may overlap in the first direction D1 a step at a third level from above among steps of a first mold 1100, which will be described below. The first division pattern 129 may include an oxide, e.g., silicon oxide.

After forming a photoresist pattern partially covering the second insulation layer 130, the second insulation layer 130, the first etch stop layer 140, an uppermost one of the gate electrode layers 120, and one of the first insulation layers 110 directly thereunder may be etched using the photoresist pattern as an etching mask. Thus, one of the gate electrode layers 120 directly under the uppermost one of the gate electrode layers 120 may be partially exposed.

After performing a trimming process in which an area of the photoresist pattern is reduced, the second insulation layer 130, the first etch stop layer 140, the uppermost one of the gate electrode layer 120, the uppermost one of the first insulation layer 110, the partially exposed one of the gate electrode layers 120, and one of the first insulation layers 110 directly thereunder may be etched using the reduced photoresist pattern as an etching mask to form the first mold 1100 having a staircase shape and including a plurality of steps each of which may consist of one of the first insulation layers 110 and one of the gate electrode layers 120 directly thereon.

Hereinafter, a "step layer" may be referred to as an entire portion of the first insulation layer 110 and the gate electrode layer 120 at the same level, e.g., an entirety of a pair of the first insulation layer 110 and the gate electrode layer 120 having a same length in the second direction D2, which may include not only an exposed portion but also a non-exposed portion. Further, a "step" may be referred to as the exposed portion of the step layer that may not be covered by upper step layers. In example embodiments, the steps may be arranged in the second direction D2, and further arranged in the third direction D3. For example, the step layers may be stacked in a staircase shape, so each step layer, e.g., each gate electrode layer 120, may have a shorter length, e.g., in the second direction D2, with an increasing height, e.g., along the first direction D1.

The first mold 1100 may be formed on the first and second regions I and II of the first substrate 100, and the third region III of the first substrate 100 may not be covered by the first mold 1100. The steps of the first mold 1100 may be formed on the second region II of the first substrate 100.

A sacrificial pad layer 150 may be formed on the first substrate 100 having the first mold 1100, the second insulation layer 130, and the first etch stop layer 140 thereon, and portions of the sacrificial pad layer 150 on upper surfaces of the first substrate 100 and the second insulation layer 130 and portions of the sacrificial pad layer 150 adjacent to sidewalls of the steps of the first mold 1100 may be removed. Thus, the sacrificial pad layer 150 may remain, e.g., only, on each of the steps, and may be spaced apart from the sidewall of each of the steps, e.g., the sacrificial pad layer 150 may be spaced apart from an adjacent first insulation layer 110 along the second direction D2. The sacrificial pad layer 150 may extend in the third direction D3, and may include a nitride, e.g., silicon nitride.

Figure 3:
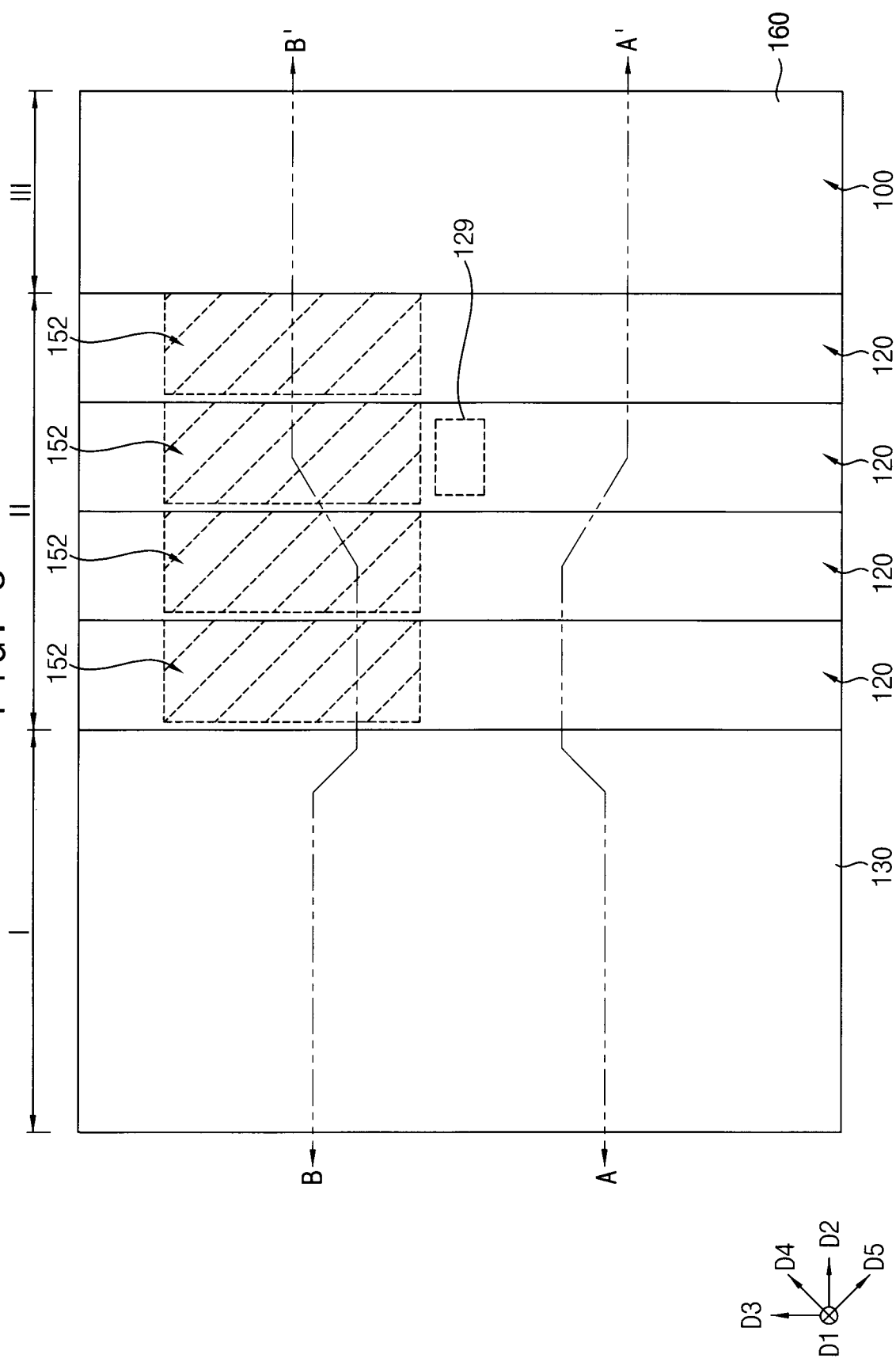
Figure 4:
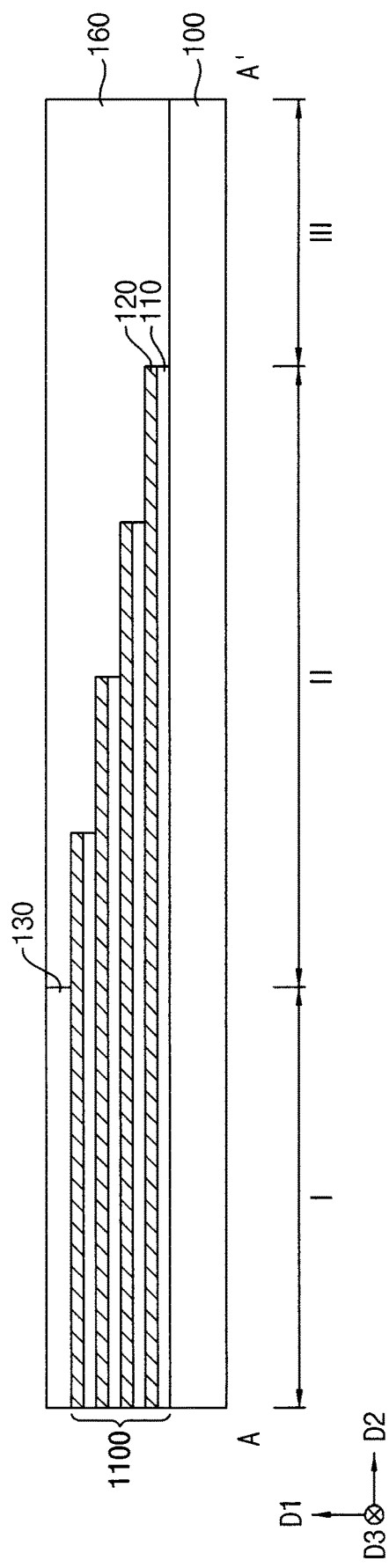
Figure 5:
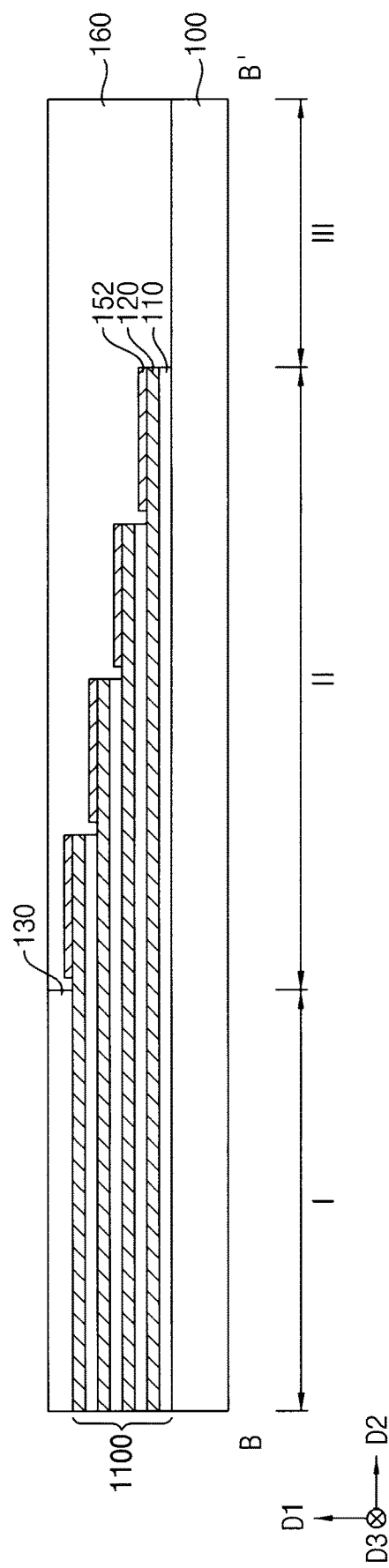
Figure 6:
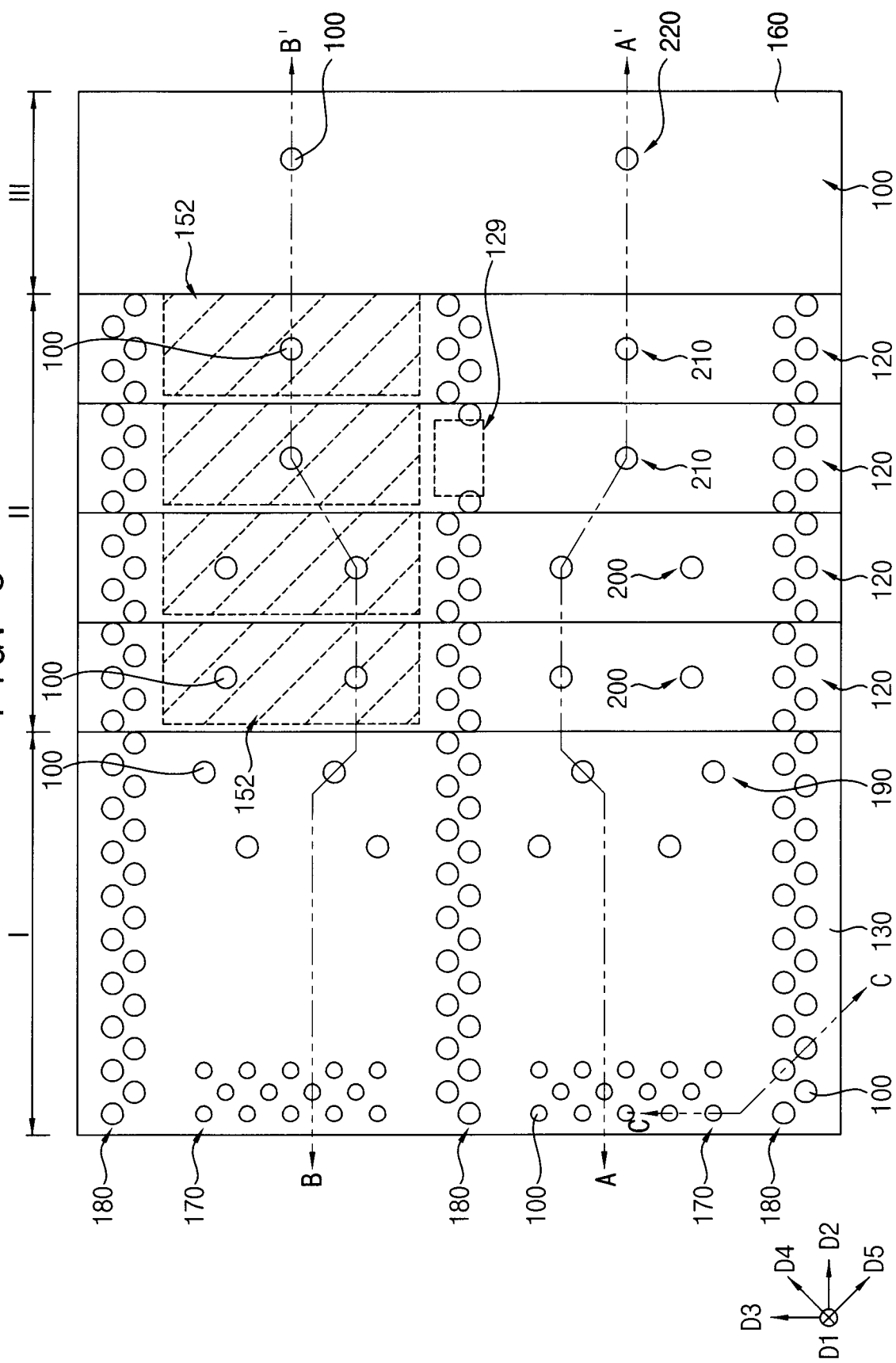
Figure 7:
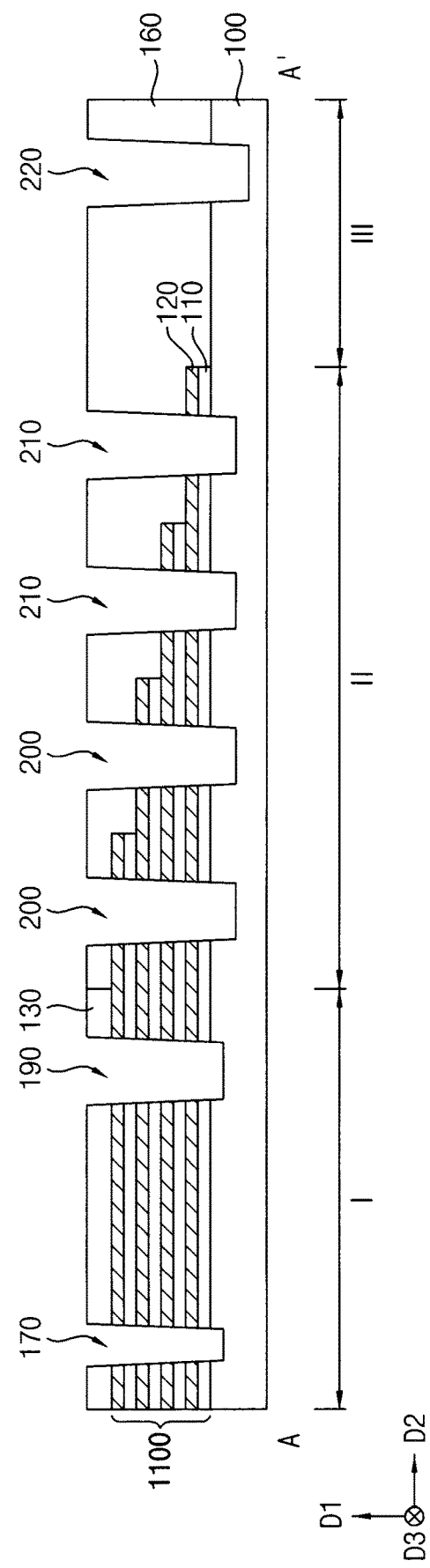
Figure 8:
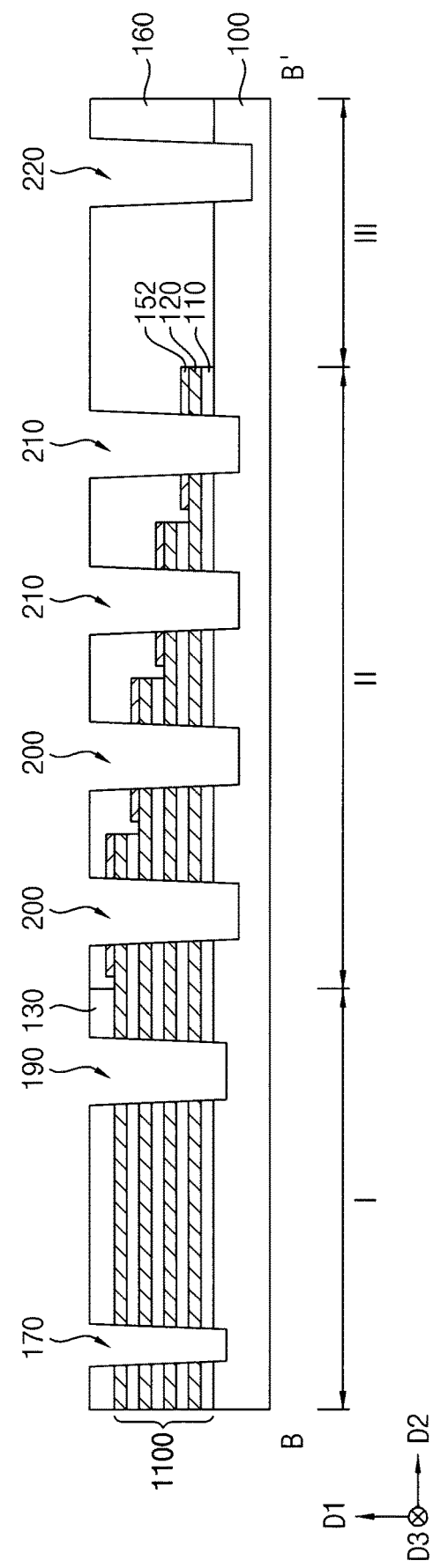
Figure 9:
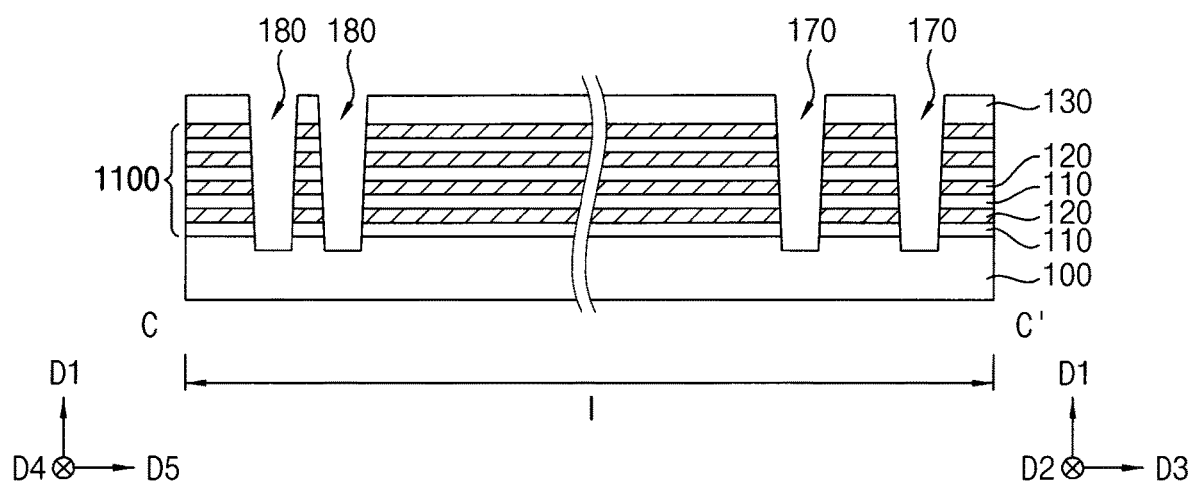

Referring to FIGS. 3 to 5, the sacrificial pad layer 150 may be partially removed to form a first sacrificial pad 152.

In example embodiments, a portion of the sacrificial pad layer 150 in one of the first and second portions of each of the memory blocks, e.g., the second portion thereof, may be removed, so that a portion of the sacrificial pad layer 150 in the first portion of each of the memory blocks may remain to form the first sacrificial pad 152. For example, a portion of the sacrificial pad layer 150 may remain only in a region indicated in FIG. 3 (to have the first sacrificial pads 152 therein), while the remainder of the first substrate 100 may not include the first sacrificial pads 152 (FIG. 4).

A first insulating interlayer 160 may be formed on the first substrate 100 having the first mold 1100 and the first sacrificial pads 152 thereon, and may be planarized until an upper surface of the first etch stop layer 140 is exposed. Thus, the first etch stop layer 140 and a portion of the first insulating interlayer 160 at the same height as the first etch stop layer 140 may be removed, and the upper surface of the second insulation layer 130 may be exposed. For example, referring to FIG. 5, the uppermost second insulation layer 130 and the first etch stop layer 140 may be removed, such that only a single second insulation layer 130 may remain to have an upper surface coplanar with that of the first insulating interlayer 160. The first mold 1100 may be covered by the first insulating interlayer 160.

Referring to FIGS. 6 to 9, the first mold 1100, the second insulation layer 130, and the first insulating interlayer 160 may be partially removed to form first to sixth holes 170, 180, 190, 200, 210, and 220, each of which may expose an upper surface of the first substrate 100. A number of each of the first to sixth holes 170, 180, 190, 200, 210, and 220 may be different from each other.

In example embodiments, a plurality of first holes 170 may be formed in each of the second and third directions D2 and D3 on the first region I of the first substrate 100, which may form a first hole array, e.g., the first hole array may include all the first holes 170 in the first region I. The first hole array may include a plurality of first hole blocks spaced apart from each other in the third direction D3, and each of the first hole blocks may include a plurality of first hole groups spaced apart from each other in the third direction D3. For example, referring to FIG. 6, one memory block including one first hole block may include two first hole groups, e.g., the two first hole groups of the first holes 170 may be separated from each other by second holes 180.

In example embodiments, a plurality of second holes 180 may be formed on the first and second regions I and II of the first substrate 100 in the second direction D2 at each of opposite sides of each of the memory blocks, and at a central portion in the third direction D3 in each of the memory blocks, i.e., at a boundary area between the first and second portions of each of the memory blocks. The second holes 180 may be arranged in a zigzag pattern in the second direction D2, and may be spaced apart from each other in the fourth and fifth directions D4 and D5. In an example embodiment, the second holes 180 arranged in the second direction D2 at the boundary area between the first and second portions of the memory block may not be disposed at an area overlapping the first division pattern 129 in the first direction D1, i.e., at a third step from above among the steps of the first mold 1100.

The third hole 190 may be formed on the first region I of the first substrate 100, and the fourth and fifth holes 200 and 210 may be formed on the second region II of the first substrate 100. In example embodiments, the fourth hole 200 may extend through steps at upper two levels, respectively, of the first mold 1100, and the fifth hole 210 may extend through steps at other levels, respectively, of the first mold 1100. In an example embodiment, two fourth holes 200 may be formed at each step in each of the first and second portions of each memory block, and one fifth hole 210 may be formed at each step in each of the first and second portions of each memory block, however, embodiments are not limited thereto. The sixth hole 220 may be formed on the third region III of the first substrate 100.

Figure 10:
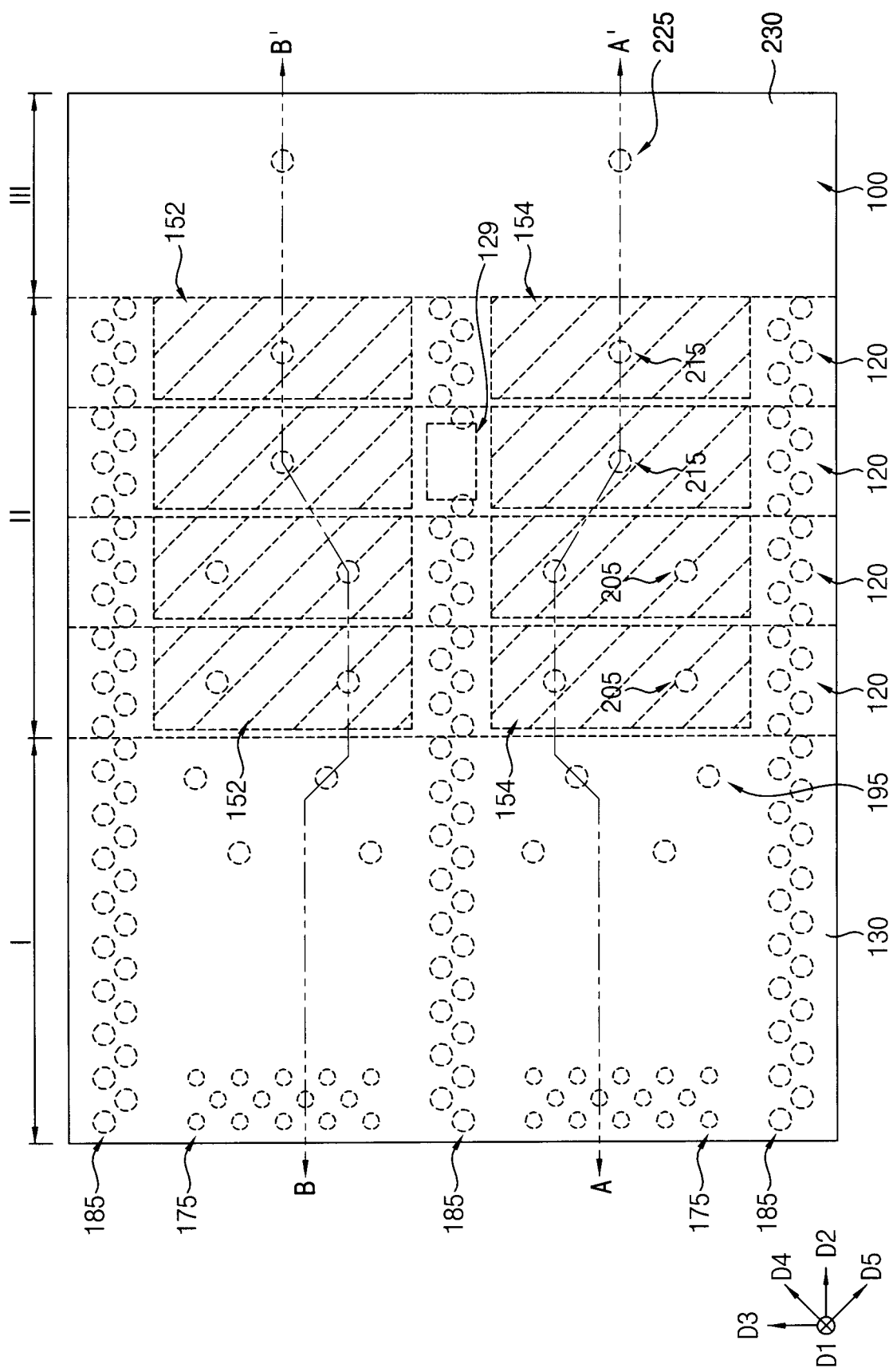
Figure 11:
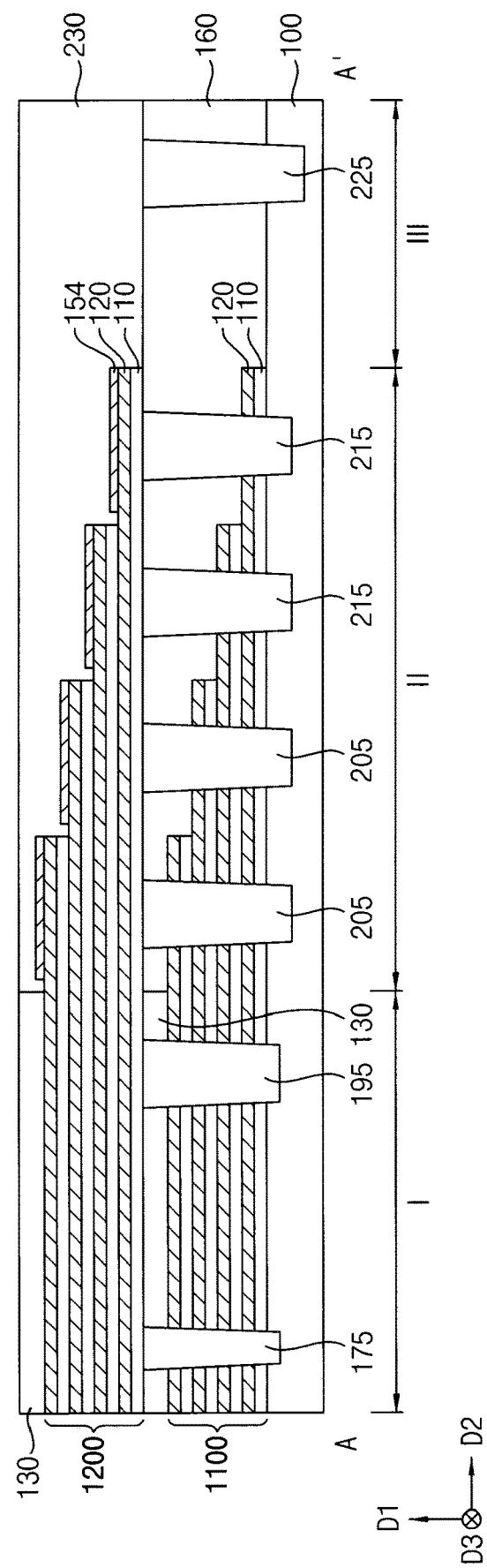
Figure 12:
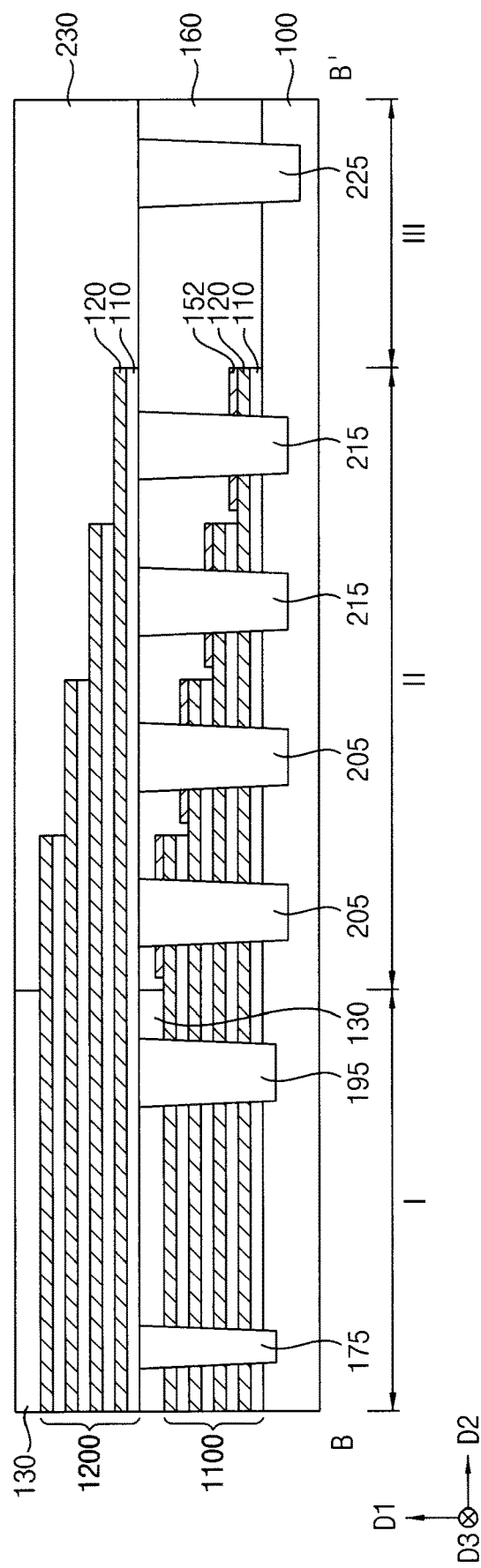

Referring to FIGS. 10 to 12, first to sixth sacrificial layers 175, 185, 195, 205, 215, and 225 may be formed in the first to sixth holes 170, 180, 190, 200, 210 and 220, respectively. The first to sixth sacrificial layers 175, 185, 195, 205, 215 and 225 may include a material having an etching selectivity with respect to the first insulation layer 110, the gate electrode layer 120, and the first sacrificial pad 152. The first to sixth sacrificial layers 175, 185, 195, 205, 215 and 225 may include, e.g., silicon-germanium (SiGe) or silicon-germanium oxide (SiGe—O).

Processes substantially the same as or similar to those illustrated with reference to FIGS. 1 to 5 may be performed. Thus, a second mold 1200, an additional second insulation layer 130, and a second insulating interlayer 230 may be, e.g., sequentially, formed on the second insulation layer 130 (of FIG. 5), the first insulating interlayer 160 and the first to sixth sacrificial layers 175, 185, 195, 205, 215 and 225, and steps of the second mold 1200 may overlap the steps of the first mold 1100 in the first direction D1.

However, a second sacrificial pad 154 may be formed on each step of the second mold 1200 in one of the first and second portions of each memory block in which the first sacrificial pad 152 is not formed in the first mold 1100, i.e., in the second portion of each memory block. In an example embodiment, the first division pattern 129 may be further formed in the second mold 1200 at a position corresponding to that of the first division pattern 129 in the first mold 1100, i.e., at a position in the second mold 1200 overlapping the first division pattern 129 in the first mold 1100 in the first direction D1.

Figure 13:
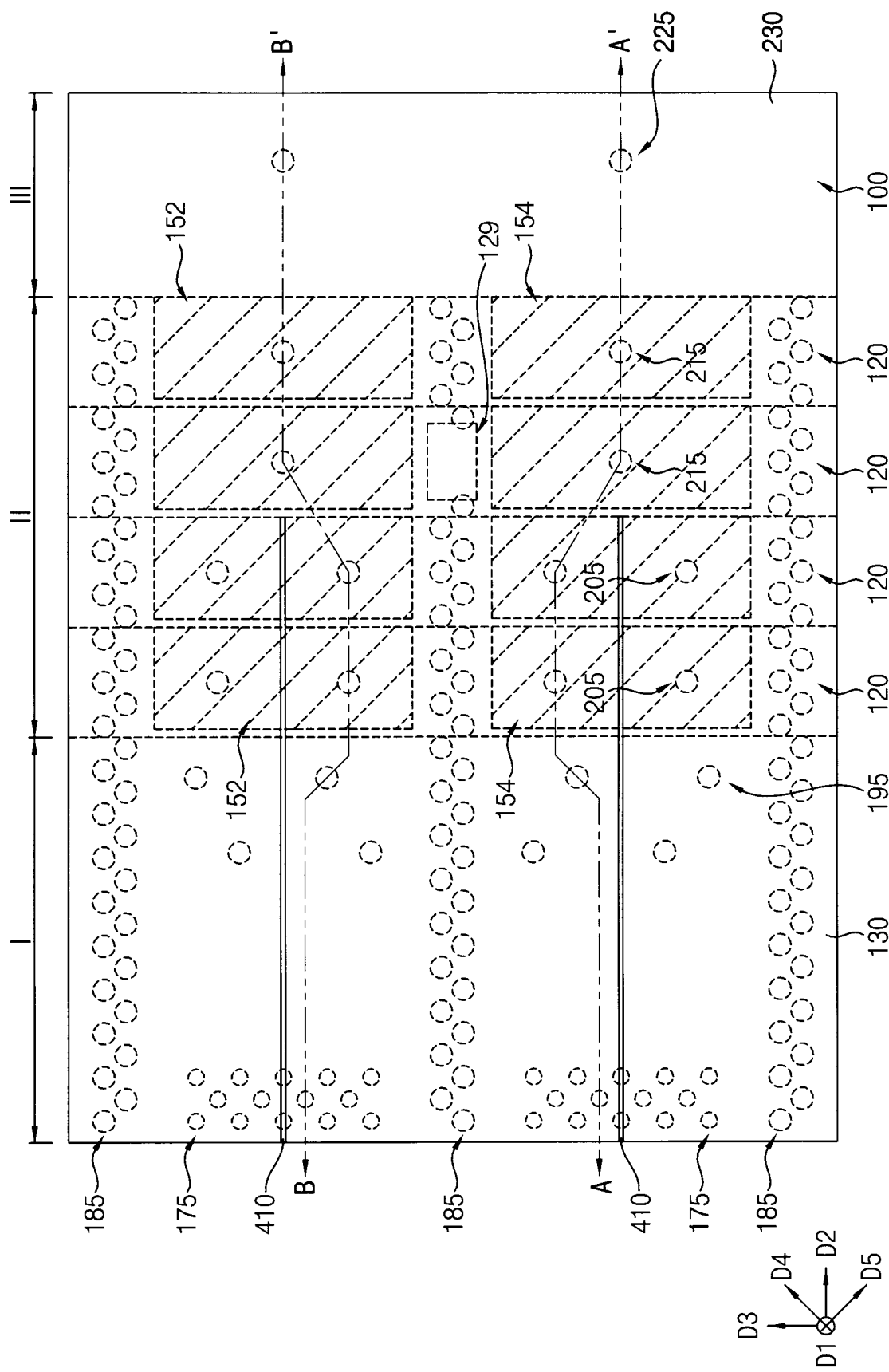
Figure 14:
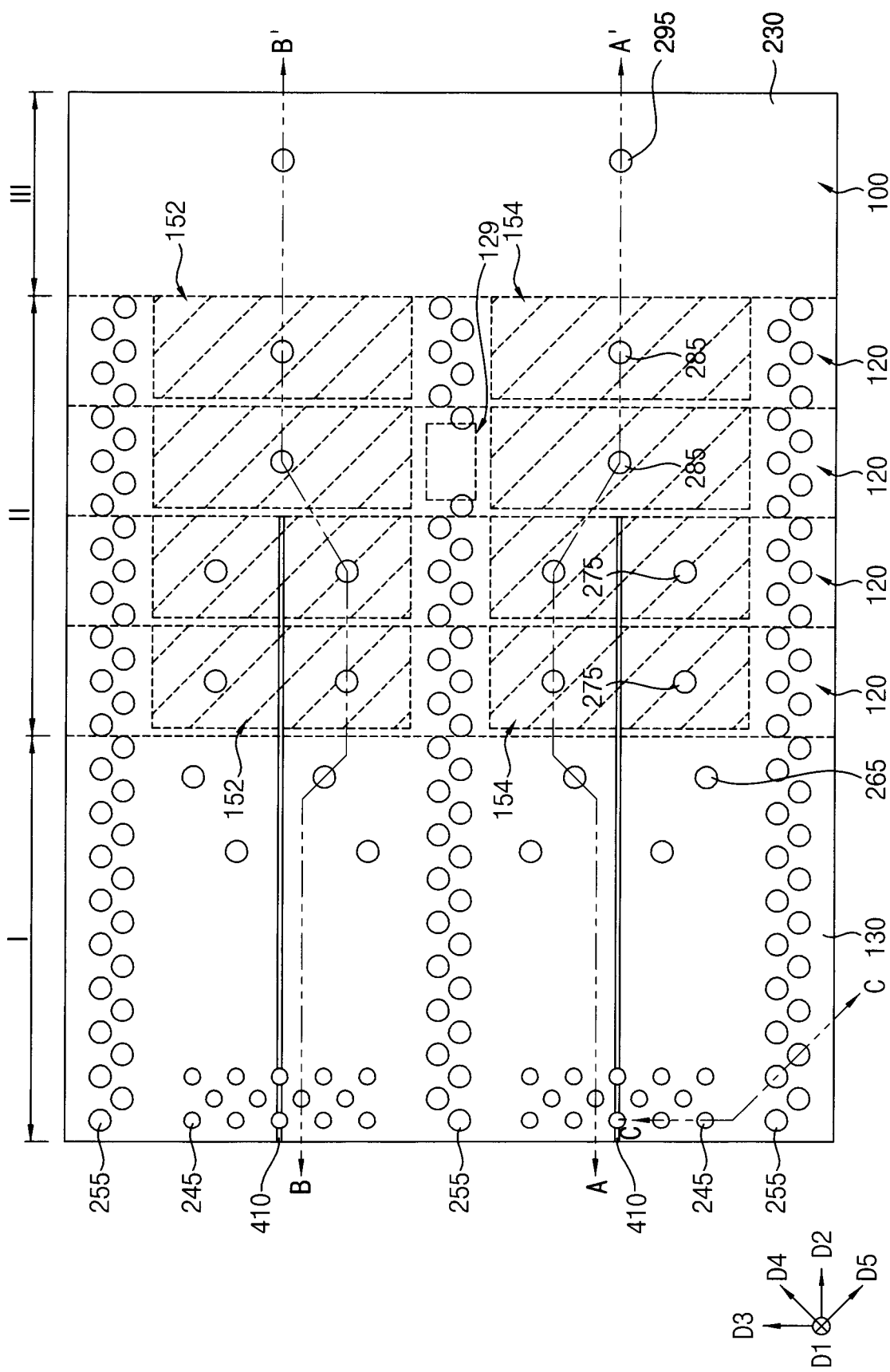
Figure 15:
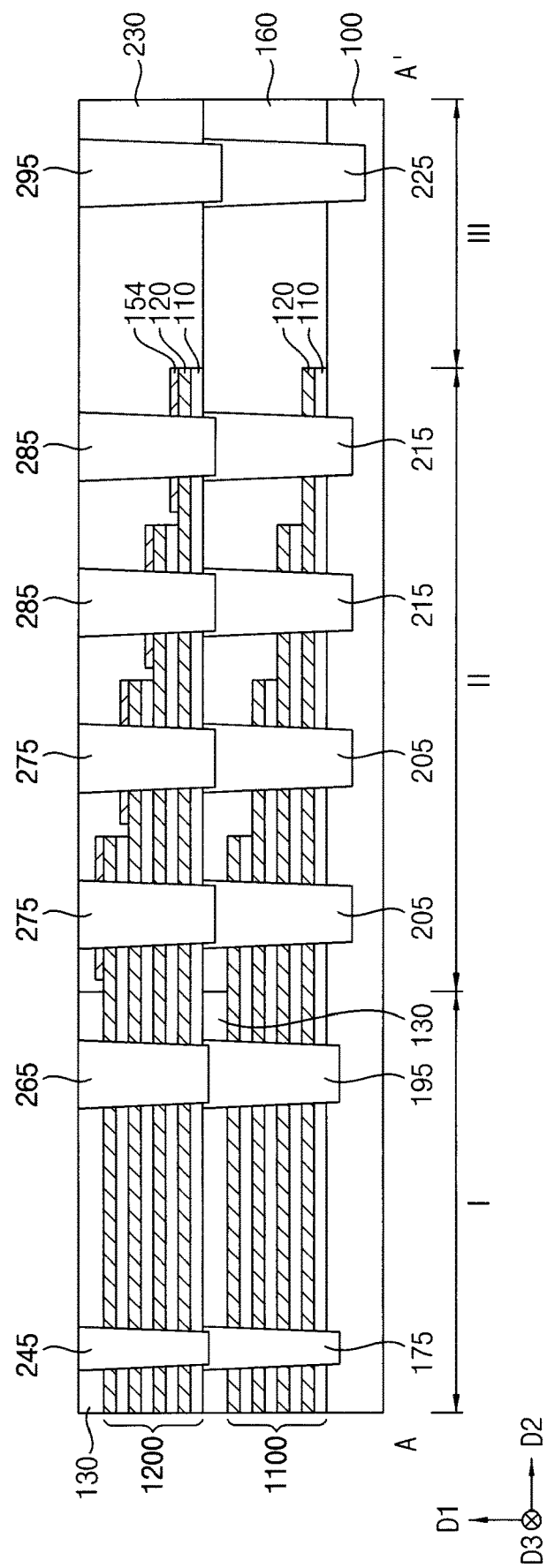
Figure 16:
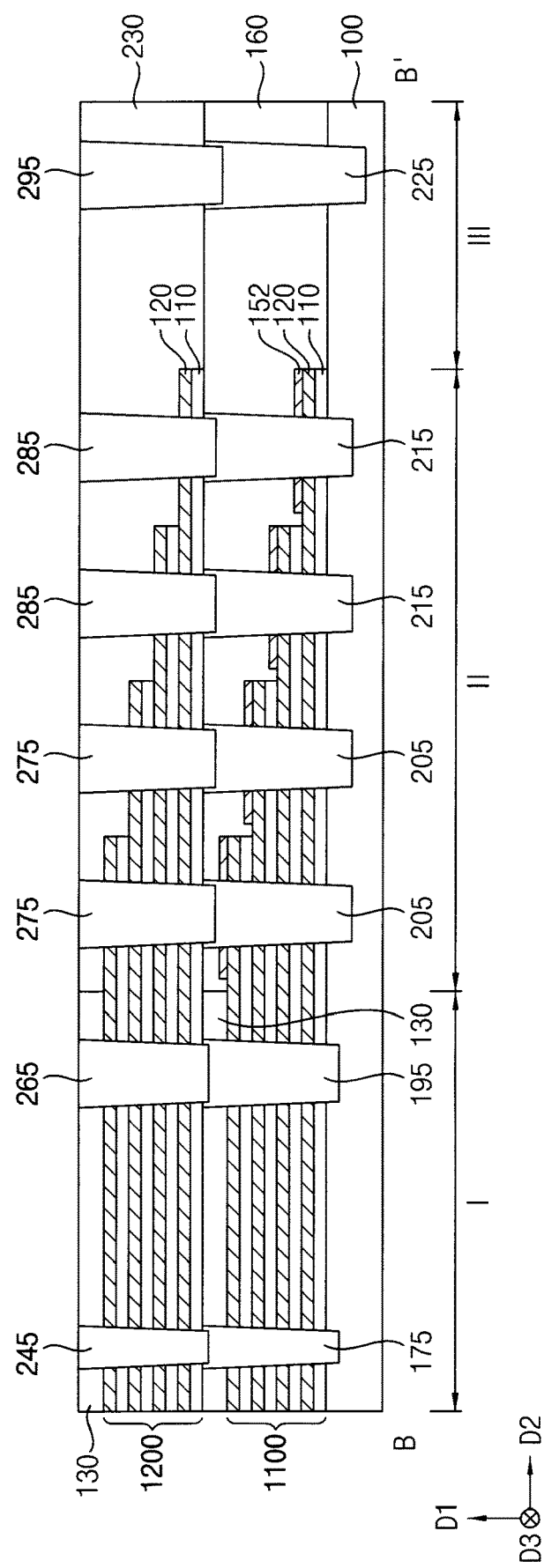
Figure 17:
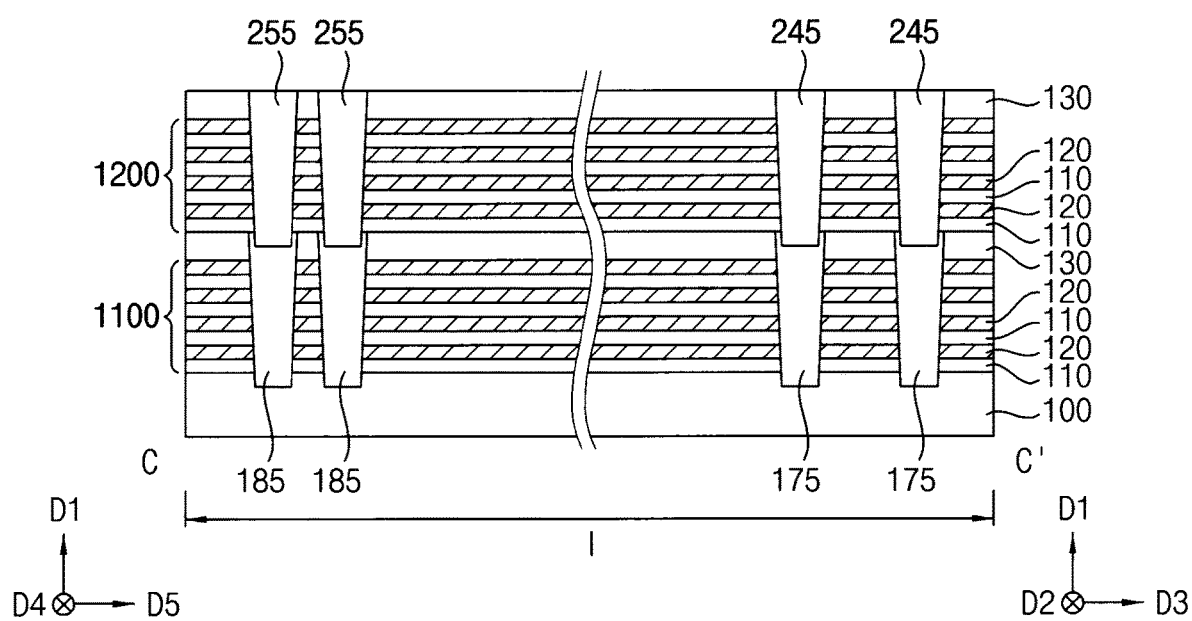

Referring to FIG. 13, the second insulating interlayer 230, the second insulation layer 130, some ones of the first insulation layers 110, and some ones of the gate electrode layers 120 may be etched to form a second opening extending in the second direction D2, and a second division pattern 410 may be formed in the second opening.

The second division pattern 410 may extend in the second direction D2 on the first and second regions I and II of the first substrate 100, and may extend through, e.g., steps at upper two levels, respectively, of the second mold 1200. Thus, ones of the gate electrode layers 120 at upper two levels, respectively, of the second mold 1200 may be divided in the third direction D3 by the second division pattern 410. In an example embodiment, the second division pattern 410 may overlap in the first direction D1 portions of the first sacrificial layers 175 at a central portion in the third direction D3 in each of the first and second portions of each memory block.

In an example embodiment, the second division pattern 410 may be further formed to extend through steps at upper two levels, respectively, of the first mold 1100, before forming the second mold 1200. Thus, ones of the gate electrode layers 120 at upper two levels, respectively, of the first mold 1100 may be also divided in the third direction D3 by the second division pattern 410.

Referring to FIGS. 14 to 17, processes substantially the same as or similar to those described with reference to FIGS. 6 to 9 may be performed so that seventh to twelfth holes may be formed to expose upper surfaces of the first to sixth sacrificial layers 175, 185, 195, 205, 215 and 225, respectively, and that seventh to twelfth sacrificial layers 245, 255, 265, 275, 285 and 295 may be formed in the seventh to twelfth holes, respectively. The seventh to twelfth sacrificial layers 245, 255, 265, 275, 285 and 295 may include substantially the same material as the first to sixth sacrificial layers 175, 185, 195, 205, 215 and 225.

Figure 18:
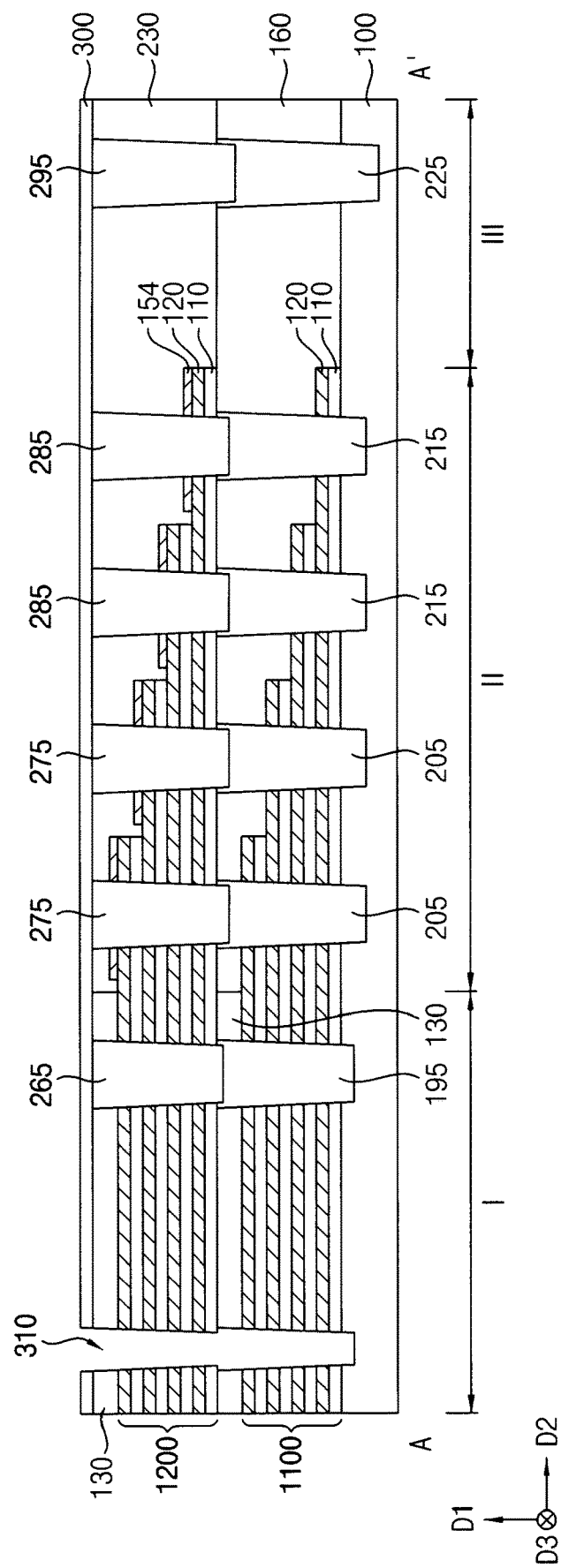

Referring to FIG. 18, a third insulating interlayer 300 may be formed on the additional second insulation layer 130 (which was formed on top of the second mold 1200), the second insulating interlayer 230, the second division pattern 410, and the seventh to twelfth sacrificial layers 245, 255, 265, 275, 285 and 295. The third insulating interlayer 300 may be partially etched to form a third opening exposing an upper surface of the seventh sacrificial layer 245, and the seventh sacrificial layer 245 exposed by the third opening and the first sacrificial layer 175 thereunder may be removed. Thus, a thirteenth hole 310 may be formed to expose an upper surface of the first substrate 100.

Figure 19:
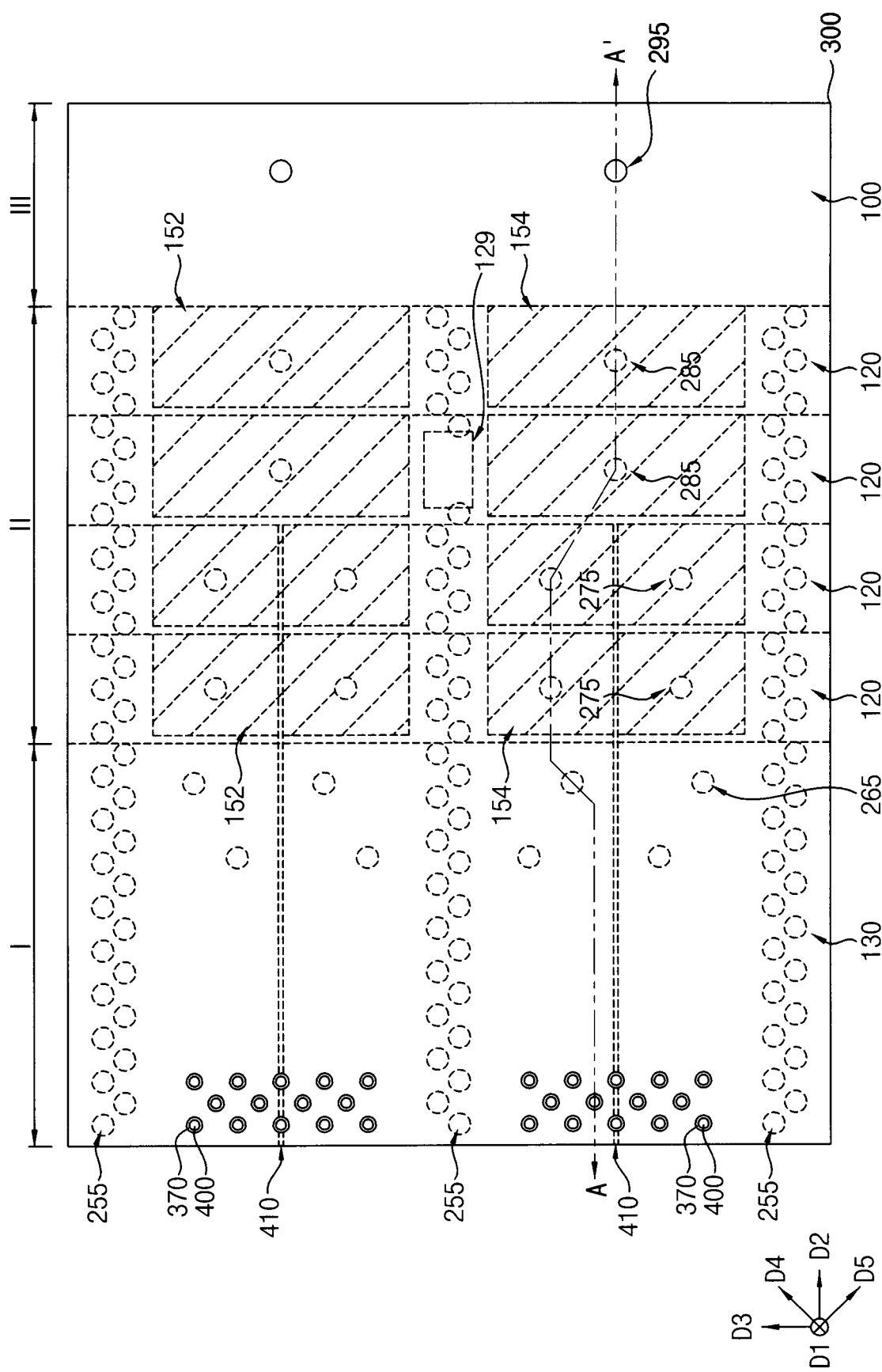
Figure 20:
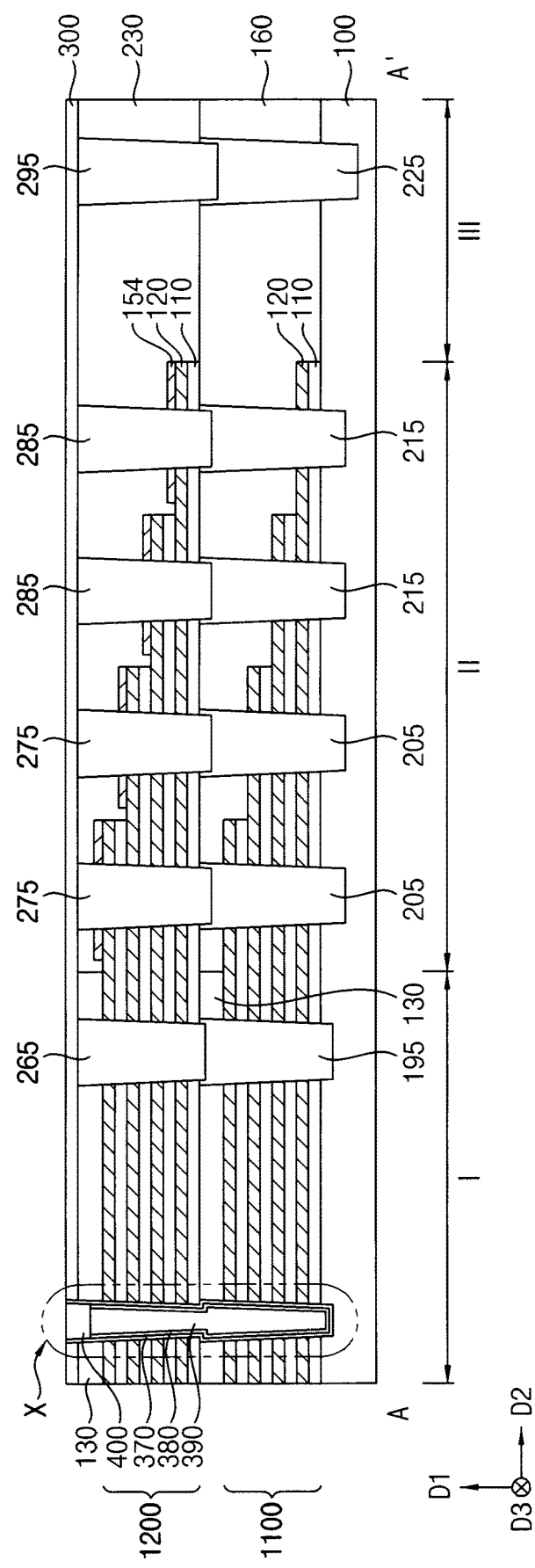
Figure 21:
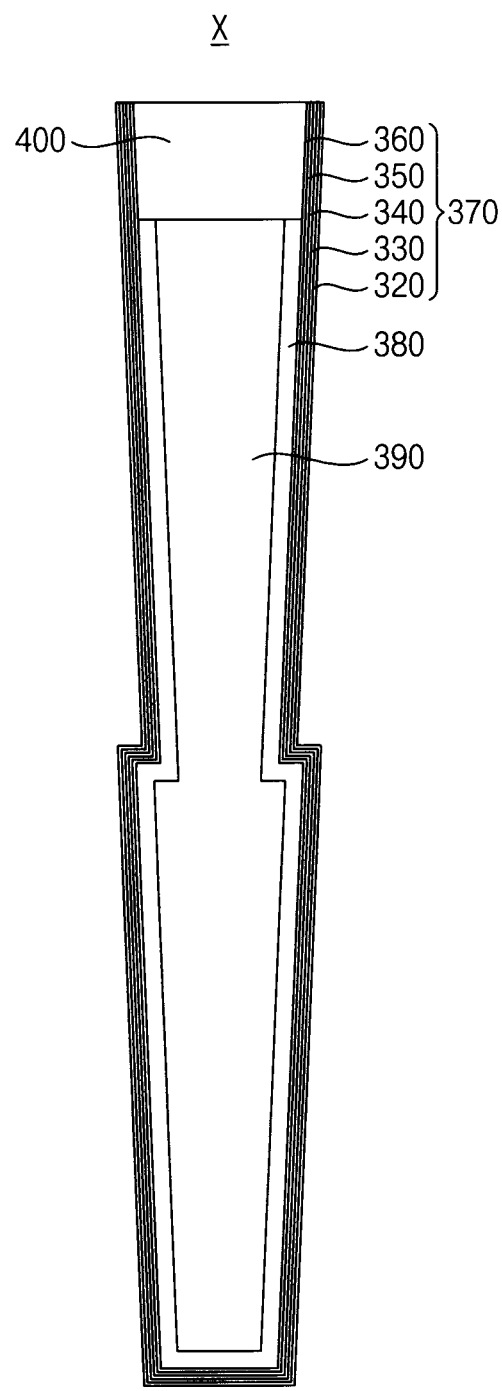

Referring to FIGS. 19 to 21, a charge storage structure layer and a channel layer may be sequentially formed on a sidewall of thirteenth hole 310, the upper surface of the first substrate 100 exposed by the thirteenth hole 310, and an upper surface of the third insulating interlayer 300. A filling layer may be formed on the channel layer to fill the thirteenth holes 310, and the filling layer, the channel layer, and the charge storage structure layer may be planarized until the upper surface of the third insulating interlayer 300 is exposed to form a charge storage structure 370 and a channel 380 sequentially stacked on the sidewall of the thirteenth hole 310 and the upper surface of the first substrate 100 to have a cup-like shape, and a filling pattern 390 filling a remaining portion of the thirteenth hole 310 and having a pillar shape. Upper portions of the filling pattern 390 and the channel 380 may be removed to form a first recess, and a capping pattern 400 may be formed to fill the first recess.

In example embodiments, the charge storage structure 370 may include a tunnel insulation pattern 360, charge storage pattern 350, a first blocking pattern 340, a second blocking pattern 330, and an oxidation prevention pattern 320 sequentially stacked from an outer sidewall of the channel 380. The tunnel insulation pattern 360 may include an oxide, e.g., silicon oxide, the charge storage pattern 350 may include a nitride, e.g., silicon nitride, the first blocking pattern 340 may include, e.g., silicon oxide, the second blocking pattern 330 may include a metal oxide, e.g., aluminum oxide, and the oxidation prevention pattern 320 may include a metal nitride, e.g., aluminum nitride. The channel 380 may include, e.g., undoped polysilicon, the filling pattern 390 may include an oxide, e.g., silicon oxide, and the capping pattern 400 may include, e.g., polysilicon doped with n-type or p-type impurities.

Figure 22:
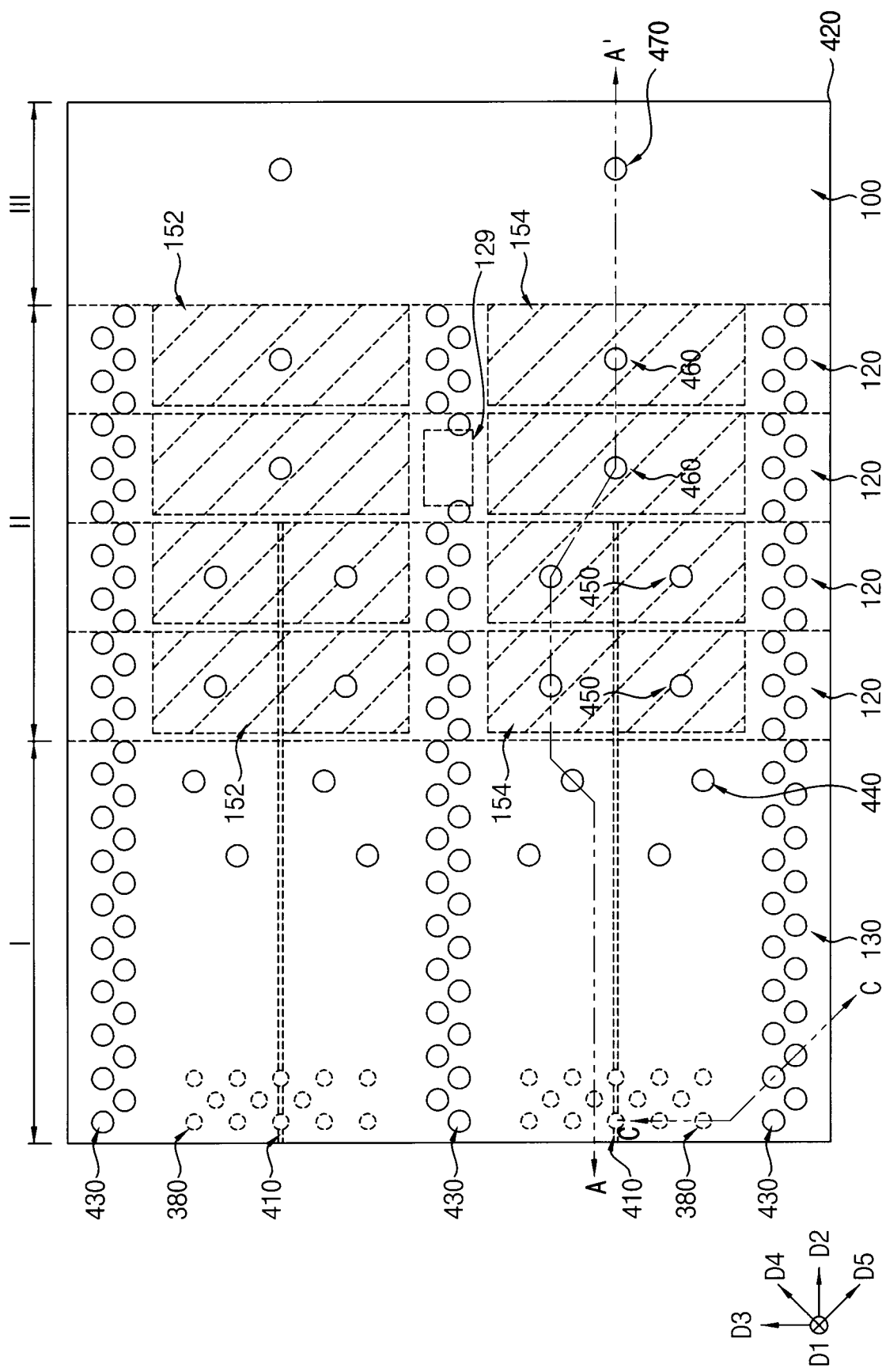
Figure 23:
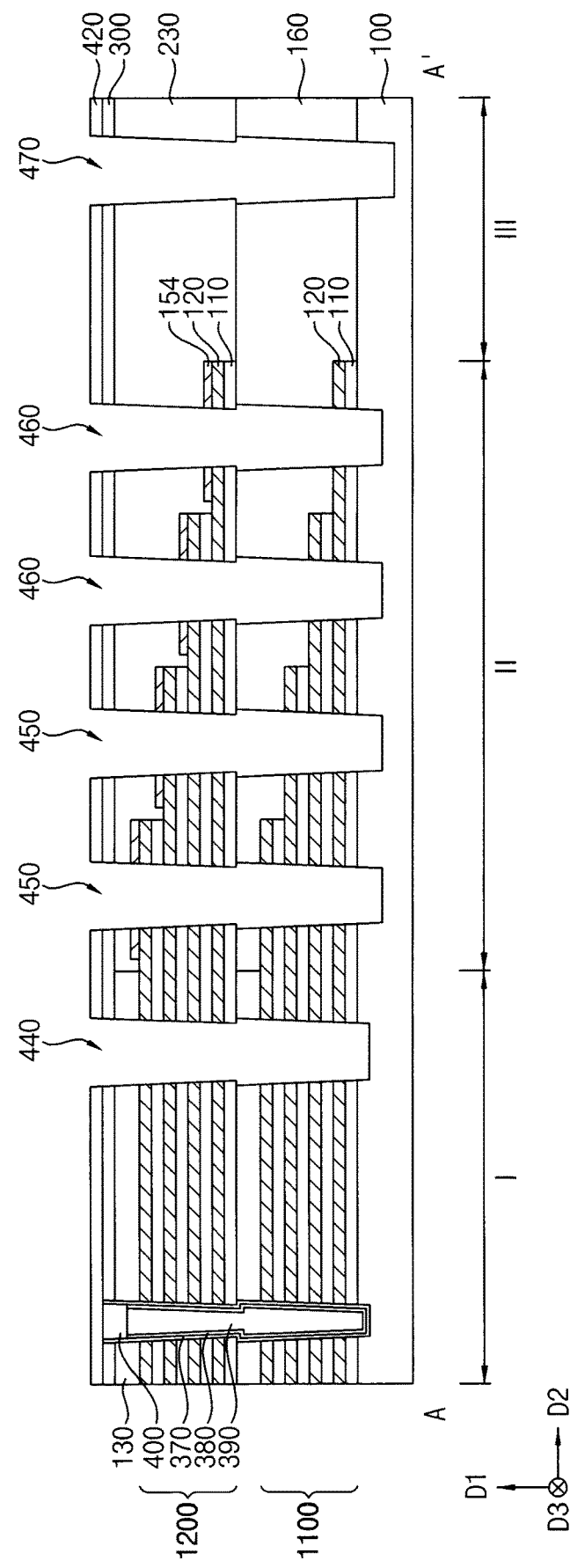
Figure 24:
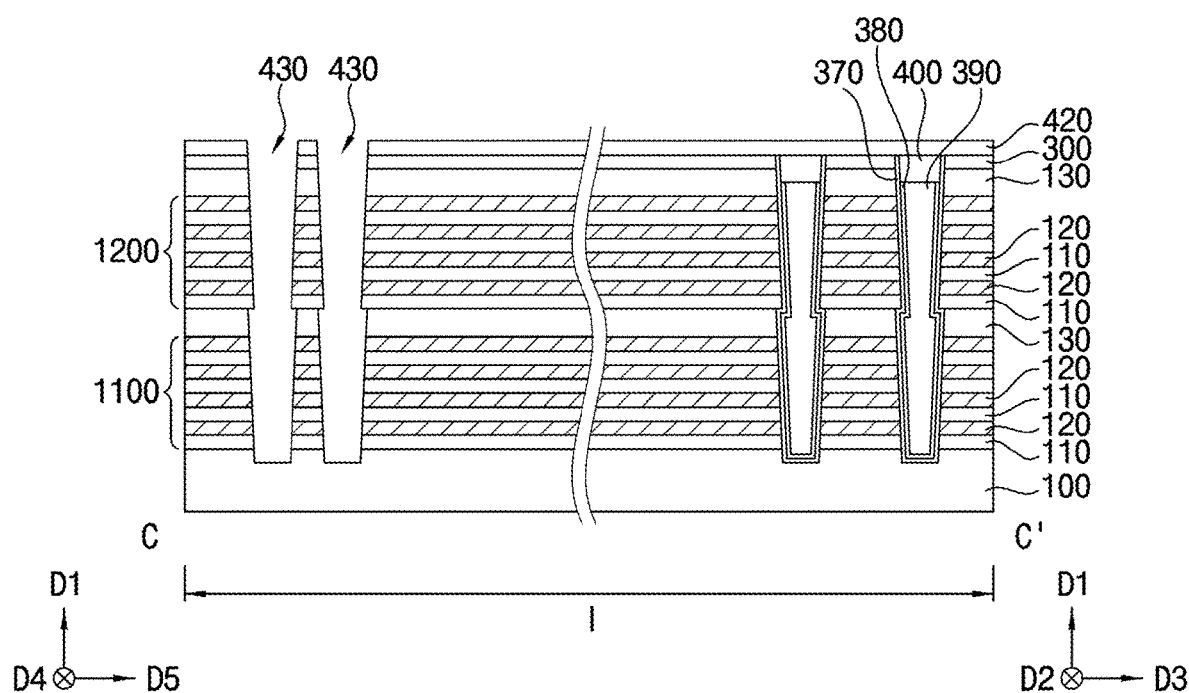

Referring to FIGS. 22 to 24, a fourth insulating interlayer 420 may be formed on the third insulating interlayer 300, the capping pattern 400, the charge storage structure 370, and the second division pattern 410, the fourth insulating interlayer 420 may be partially etched to form fourth to eighth openings exposing upper surfaces of the eighth to twelfth sacrificial layers 255, 265, 275, 285 and 295, respectively, and the eighth to twelfth sacrificial layers 255, 265, 275, 285 and 295 exposed by the fourth to eighth openings and the second to sixth sacrificial layers 185, 195, 205, 215 and 225 may be removed. Thus, fourteenth to eighteenth holes 430, 440, 450, 460 and 470 may be formed to expose upper surfaces of the first substrate 100, and sidewalls of the first insulation layers 110, the gate electrode layers 120 and the first and second sacrificial pads 152 and 154 of the first and second molds 1100 and 1200 may be exposed.

Figure 25:
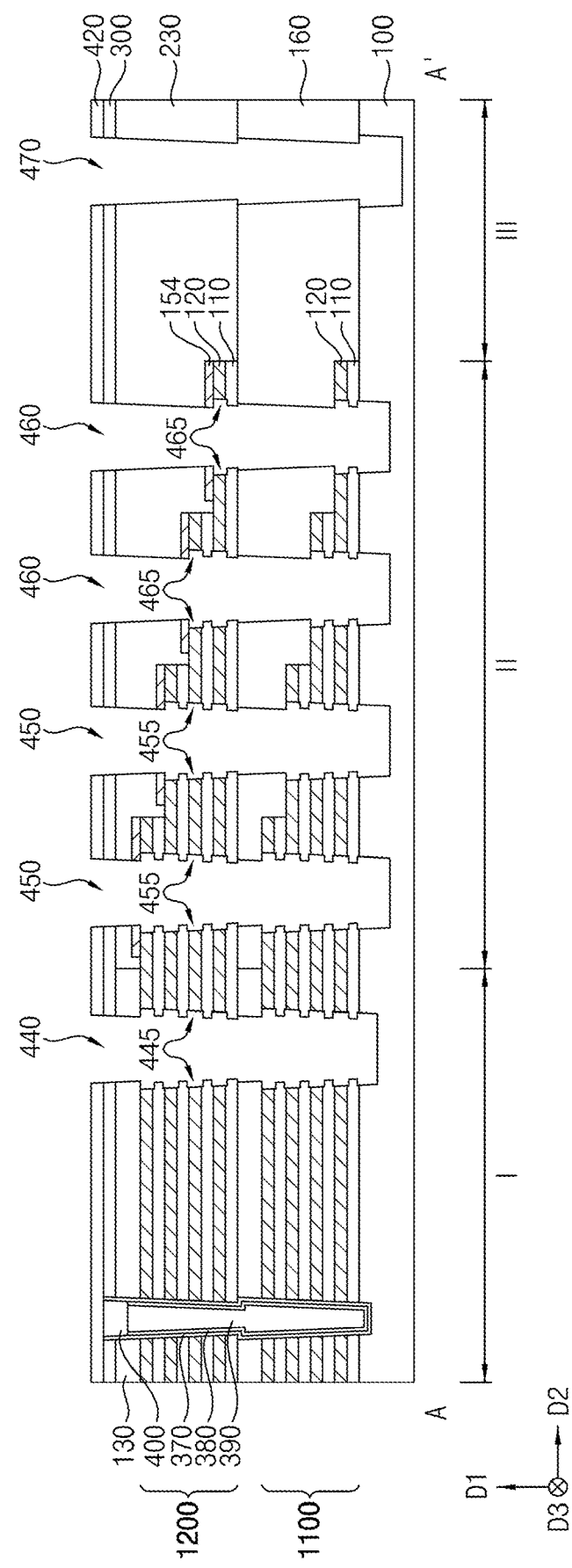
Figure 26:
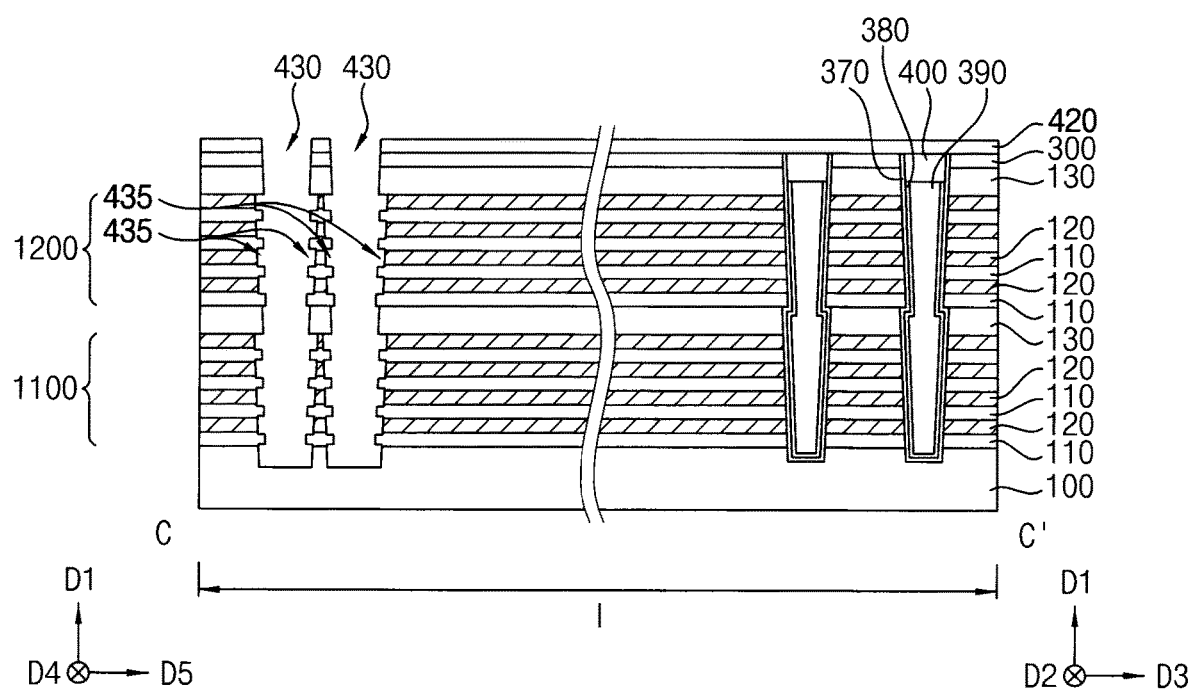

Referring to FIGS. 25 and 26, a cleaning process may be performed to remove a natural oxide layer on the exposed sidewalls of the gate electrode layers 120, and each of the sidewalls of the first insulation layers 110 may be partially removed. The cleaning process may be performed by a wet etching process using, e.g., hydrofluoric acid.

The sidewalls of the exposed gate electrode layers 120 may be partially removed to form second to fifth recesses 435, 445, 455 and 465 connected to the fourteenth to seventeenth holes 430, 440, 450 and 460, respectively. The first insulation layer 110 on and beneath each of the gate electrode layers 120 may be partially removed.

Figure 27:
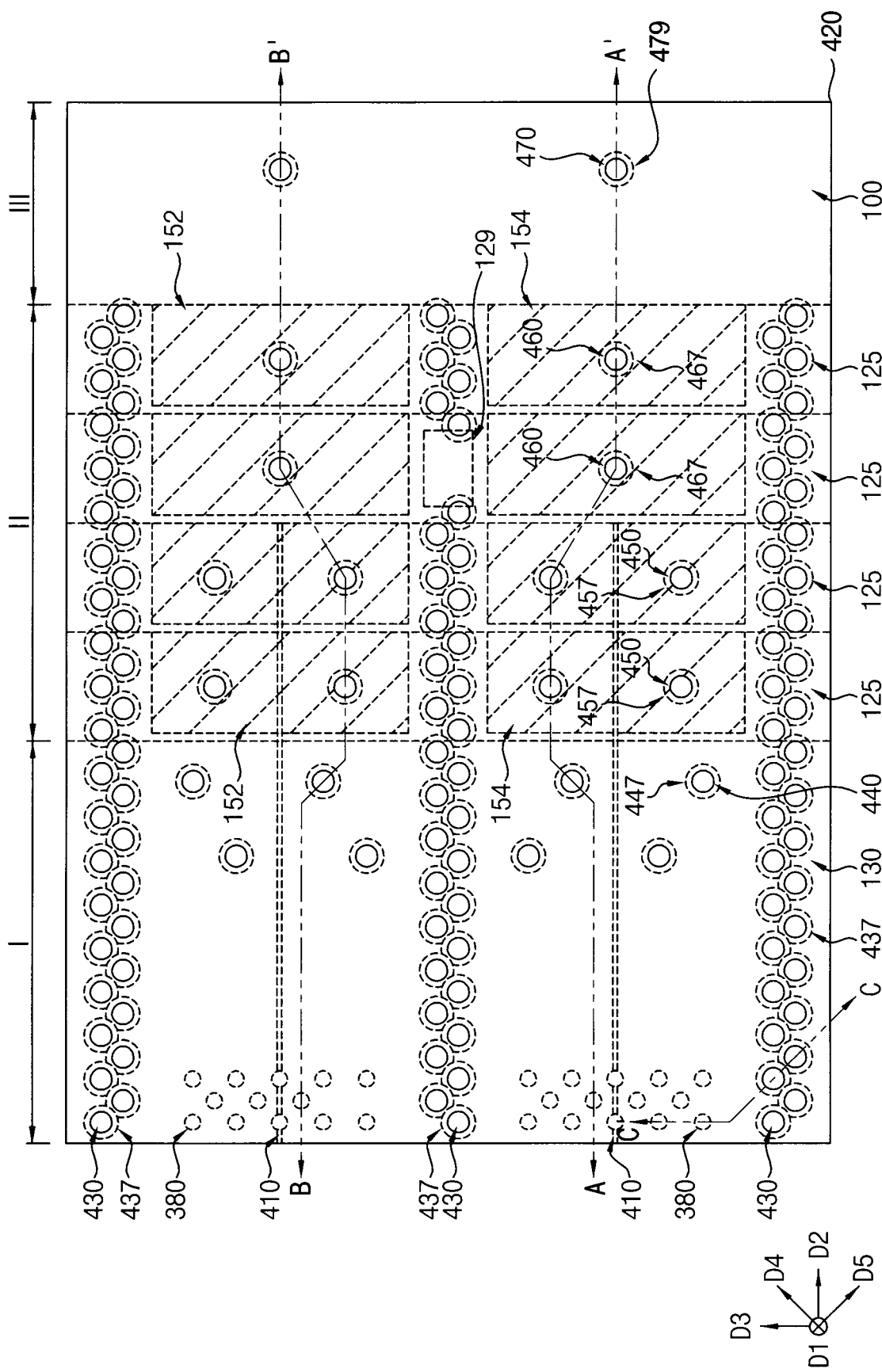
Figure 28:
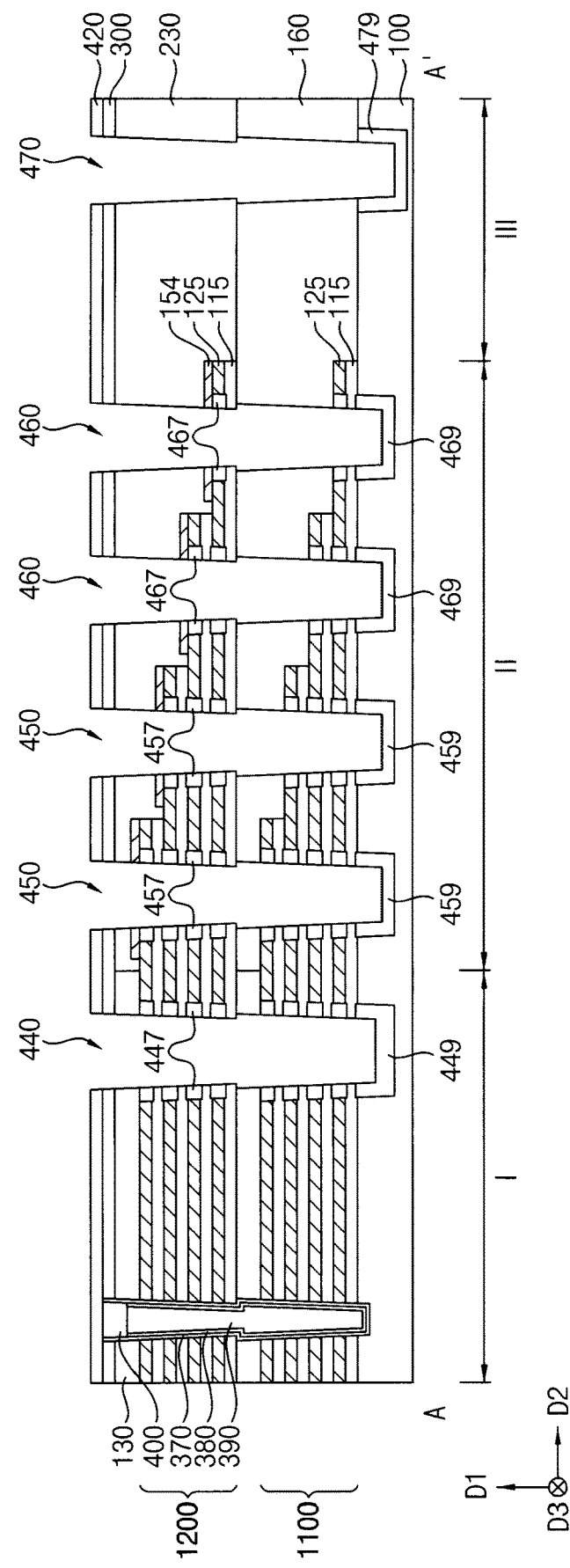
Figure 29:
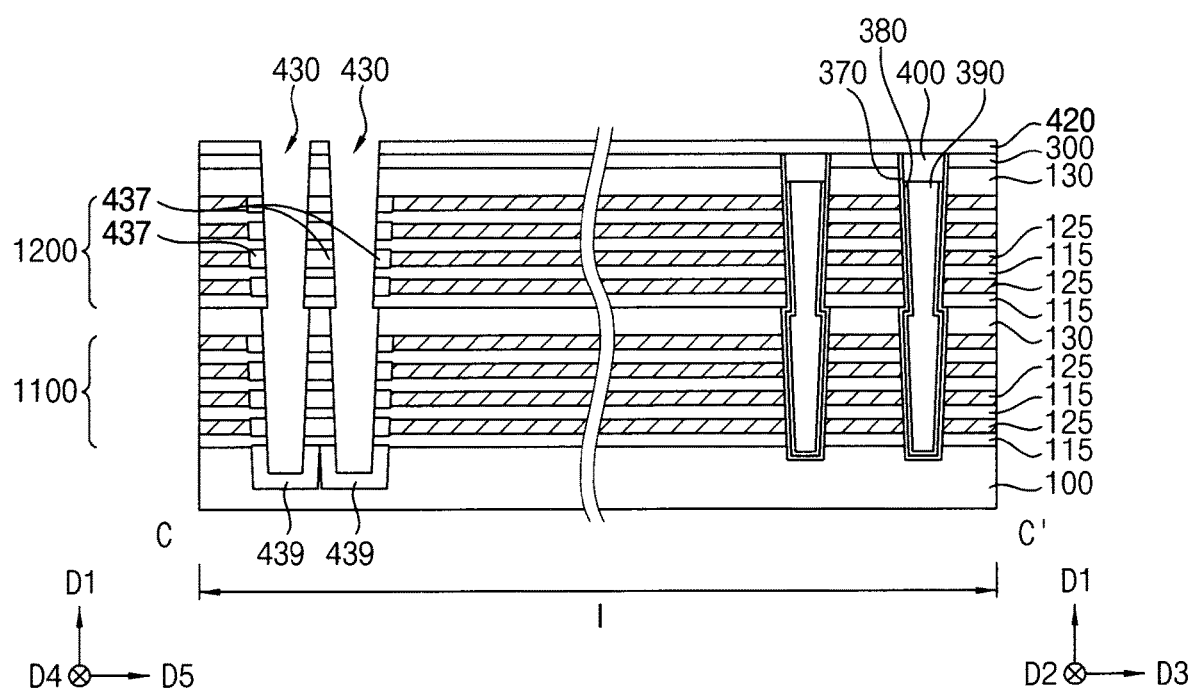

Referring to FIGS. 27 to 29, the sidewalls of the gate electrode layers 120 exposed by the fourteenth to eighteenth holes 430, 440, 450, 460 and 470 and including silicon and the upper surface of the first substrate 100 may be oxidized by an oxidation process. Thus, second to fifth insulation patterns 437, 447, 457 and 467 may be formed in the second to fifth recesses 435, 445, 455 and 465, respectively, connected to the fourteenth to seventeenth holes 430, 440, 450 and 460, and sixth to tenth insulation patterns 439, 449, 459, 469 and 479 may be formed on the upper surfaces of the first substrate 100 under the fourteenth to eighteenth holes 430, 440, 450, 460 and 470, respectively.

In example embodiments, the second to fifth insulation patterns 437, 447, 457 and 467 formed by the oxidation process may fill the second to fifth recesses 435, 445, 455 and 465, respectively, and may be also formed on lateral portions of corresponding gate electrode layers 120, respectively. Thus, the second insulation patterns 437 between the fourteenth holes 430 arranged in a zigzag pattern along the second direction D2 may contact each other to form a single pattern. In order to form the single pattern of the second insulation patterns 437 between the fourteenth holes 430, in consideration of volumes of the second insulation patterns 437 formed by the oxidation process, distances between the fourteenth holes 430 may be adjusted when the processes illustrated with reference to FIGS. 6 to 9 are performed.

As a result, the memory blocks may be separated from each other in the third direction D3 by the fourteenth holes 430 arranged in the second direction D2 at opposite sides in the third direction D3 and the second insulation pattern 437 adjacent thereto. Accordingly, the gate electrode layer 120 may be divided into gate electrodes 125, each of which may extend in the second direction D2, and the first insulation layer 110 may be also divided into first insulation patterns 115, each of which may extend in the second direction D2.

In an example embodiment, the gate electrode layer 120 in the first and second portions of each memory block may not be entirely divided by the fourteenth holes 430 and the second insulation pattern 437 on the second region II of the first substrate 100. However, the gate electrode layers 120 at upper two levels, respectively, of each of the first and second molds 1100 and 1200 in each memory block may be divided into two parts in the first and second portions, respectively, by the fourteenth holes 430 and the second insulation pattern 437. Additionally, the lowermost one of the gate electrode layers 120 of the first mold 1100 may be divided into two parts in the first and second portions, respectively, by the fourteenth hole 430 and the second insulation pattern 437 together with the first division pattern 129.

Figure 30:
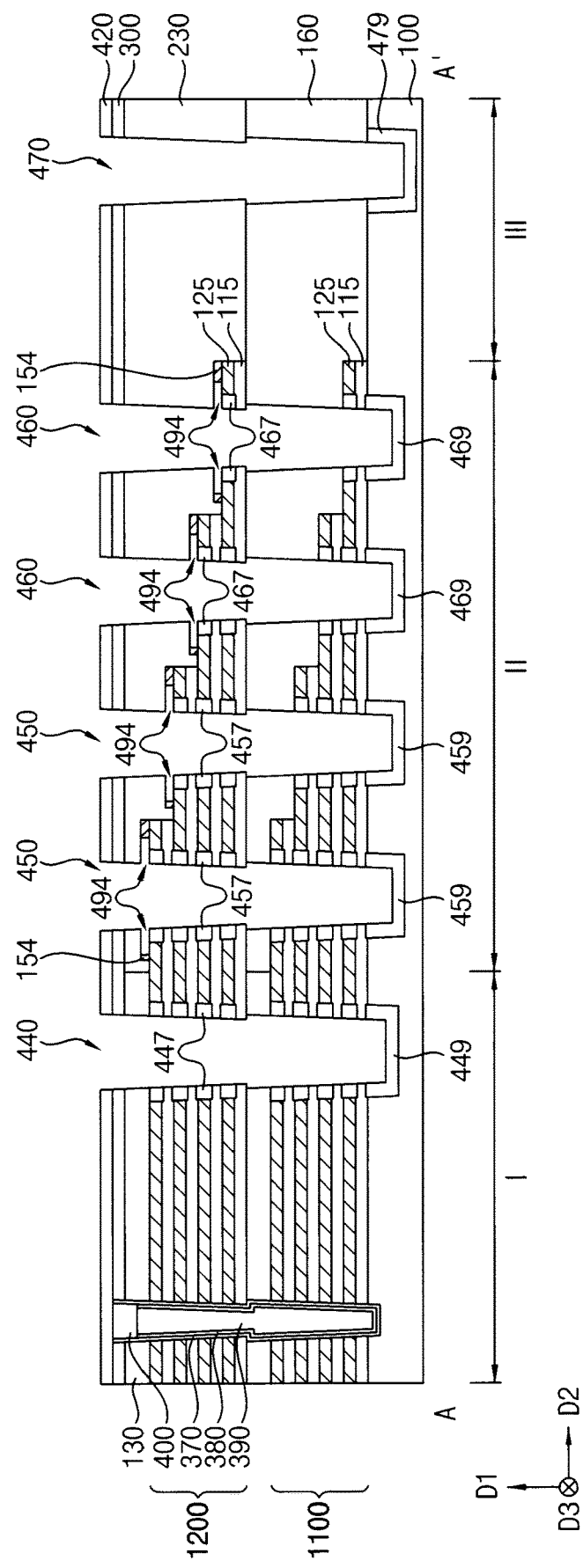
Figure 31:
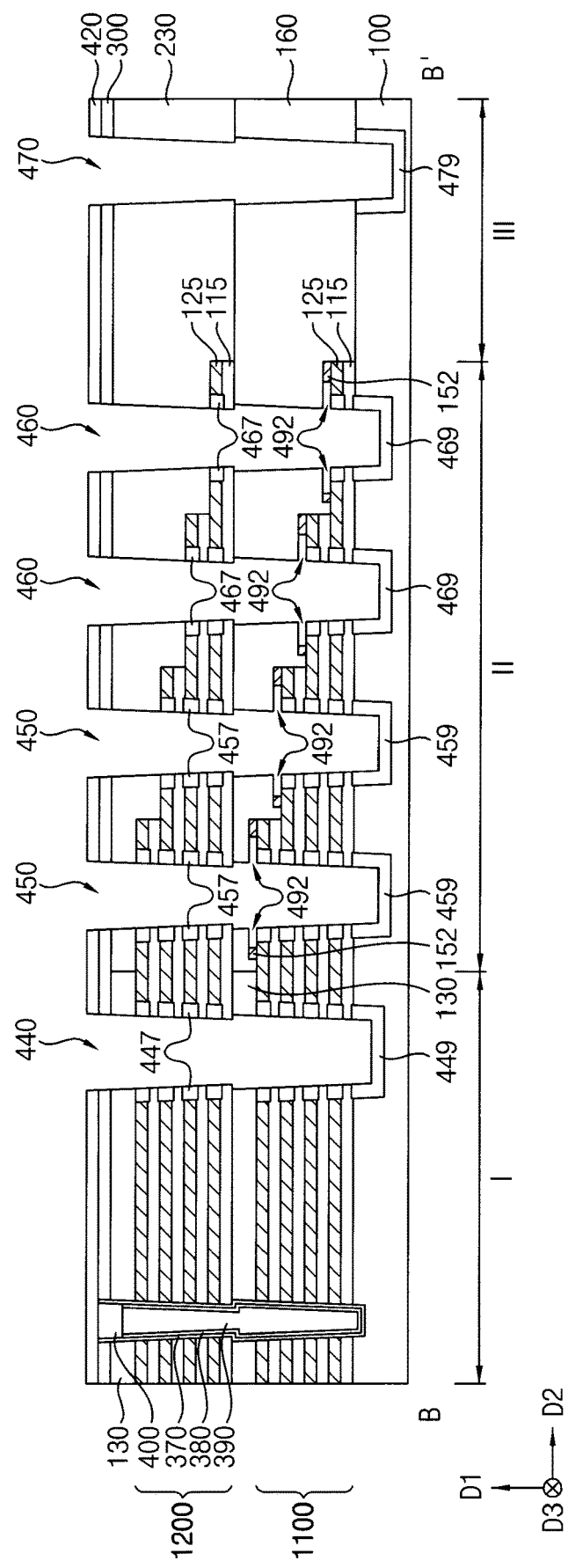
Figure 32A:
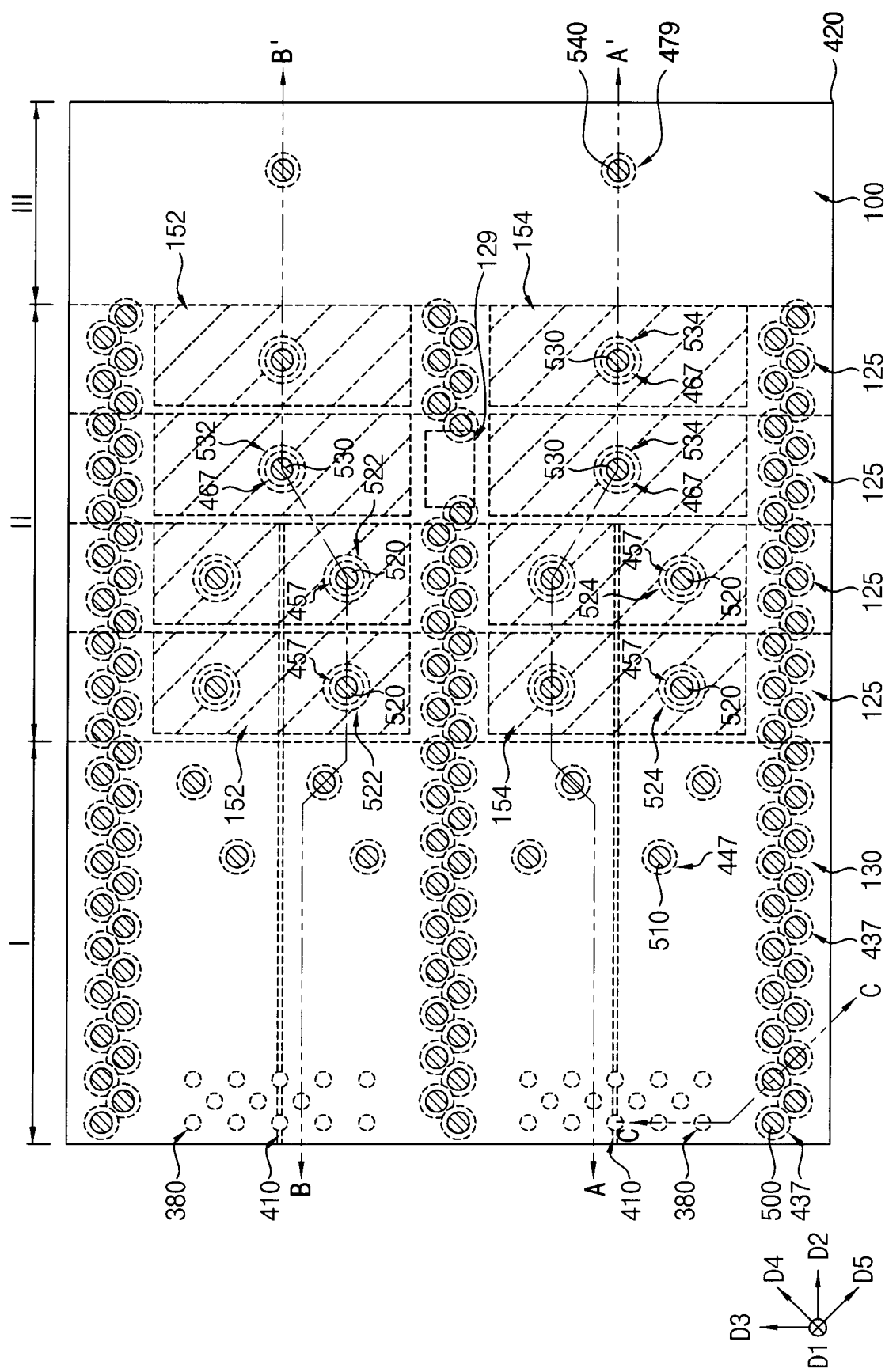
Figure 32B:
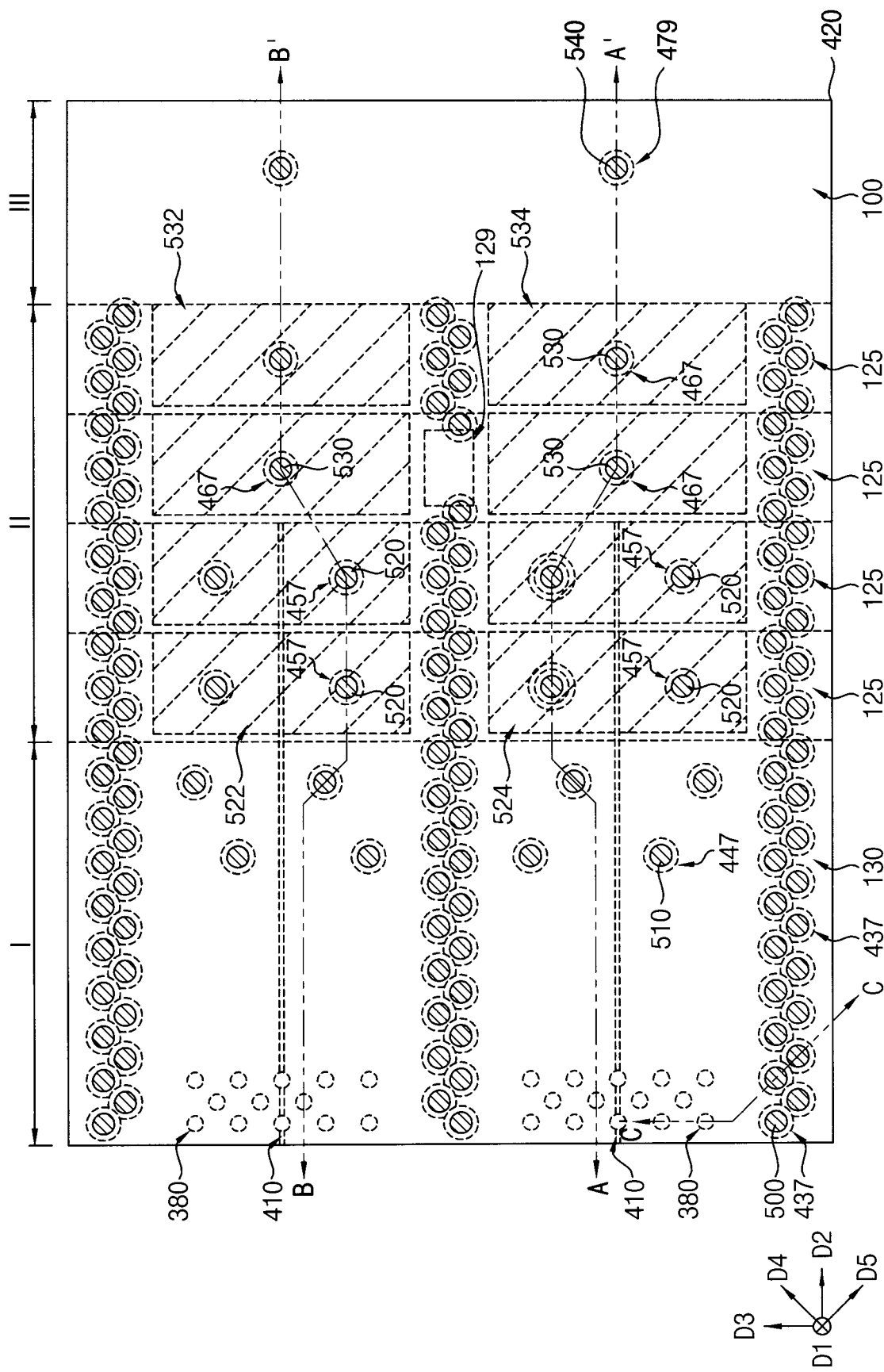
Figure 33A:
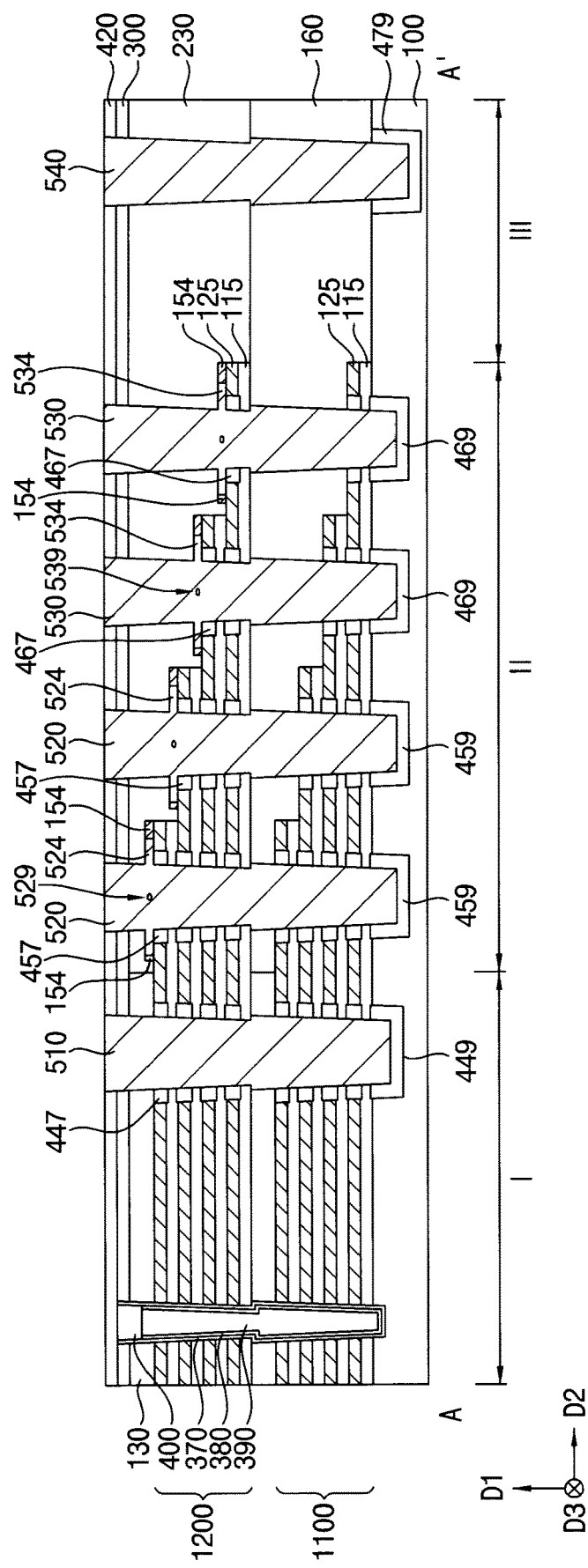
Figure 33B:
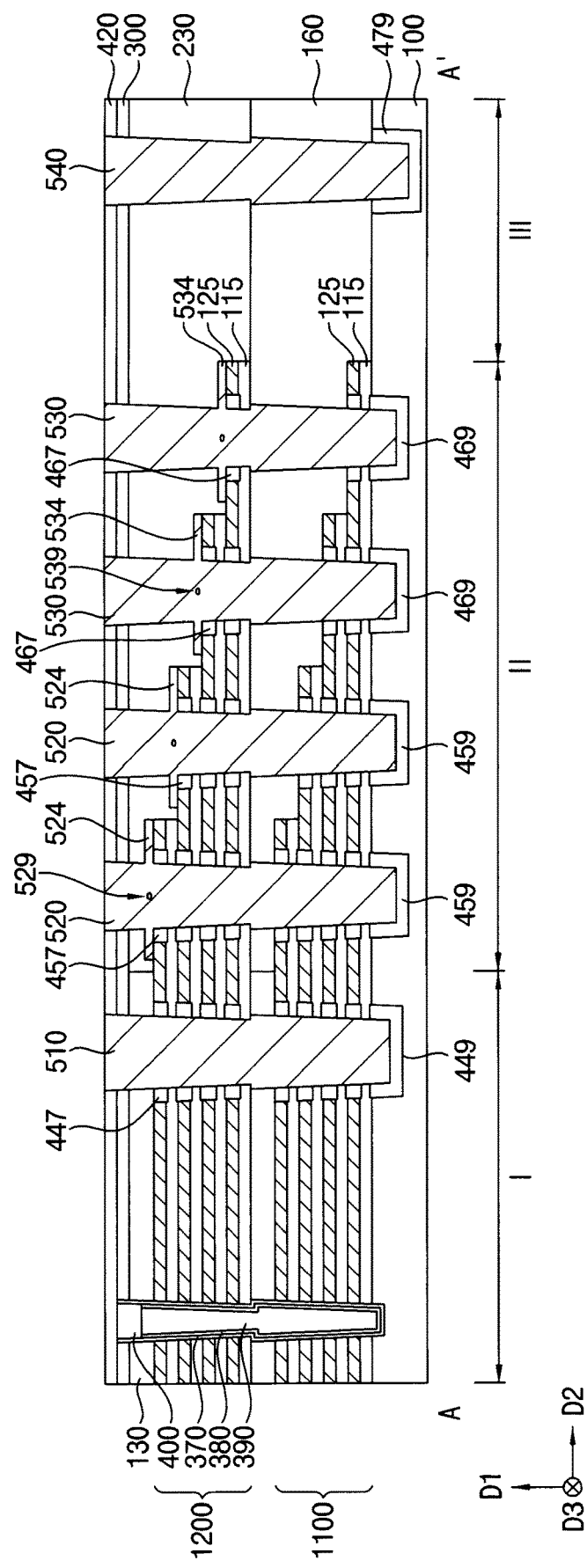
Figure 34A:
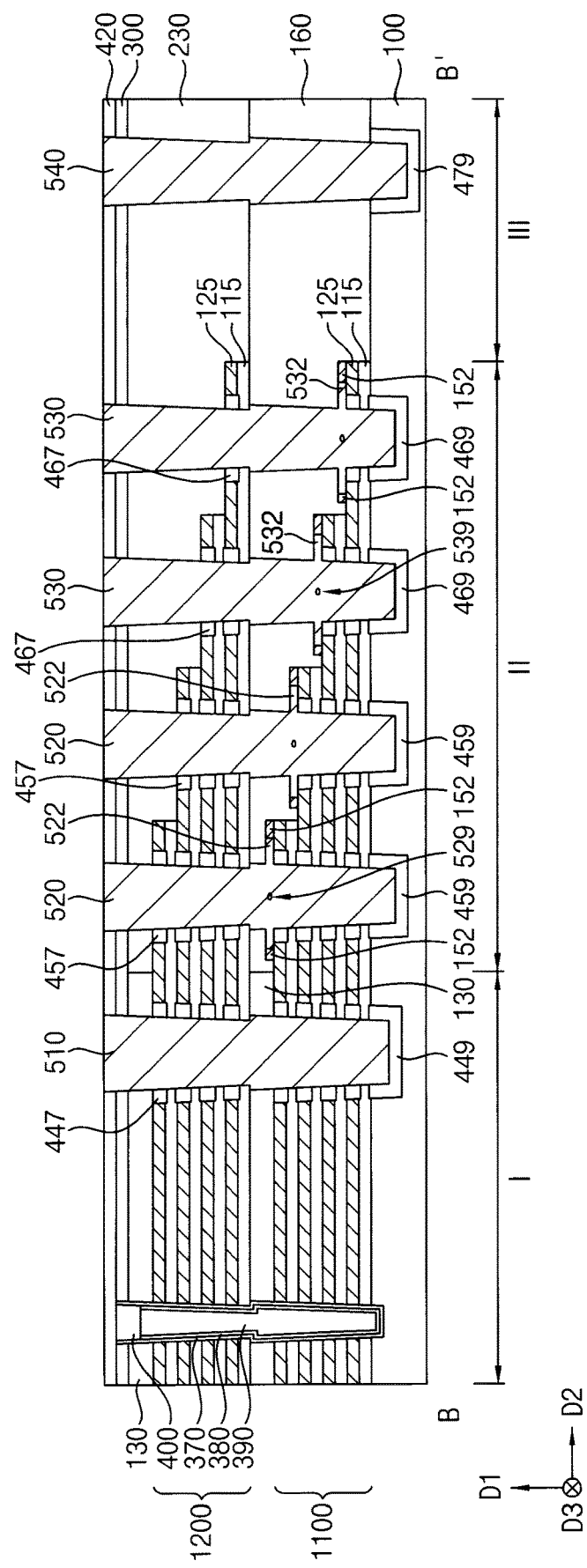
Figure 34B:
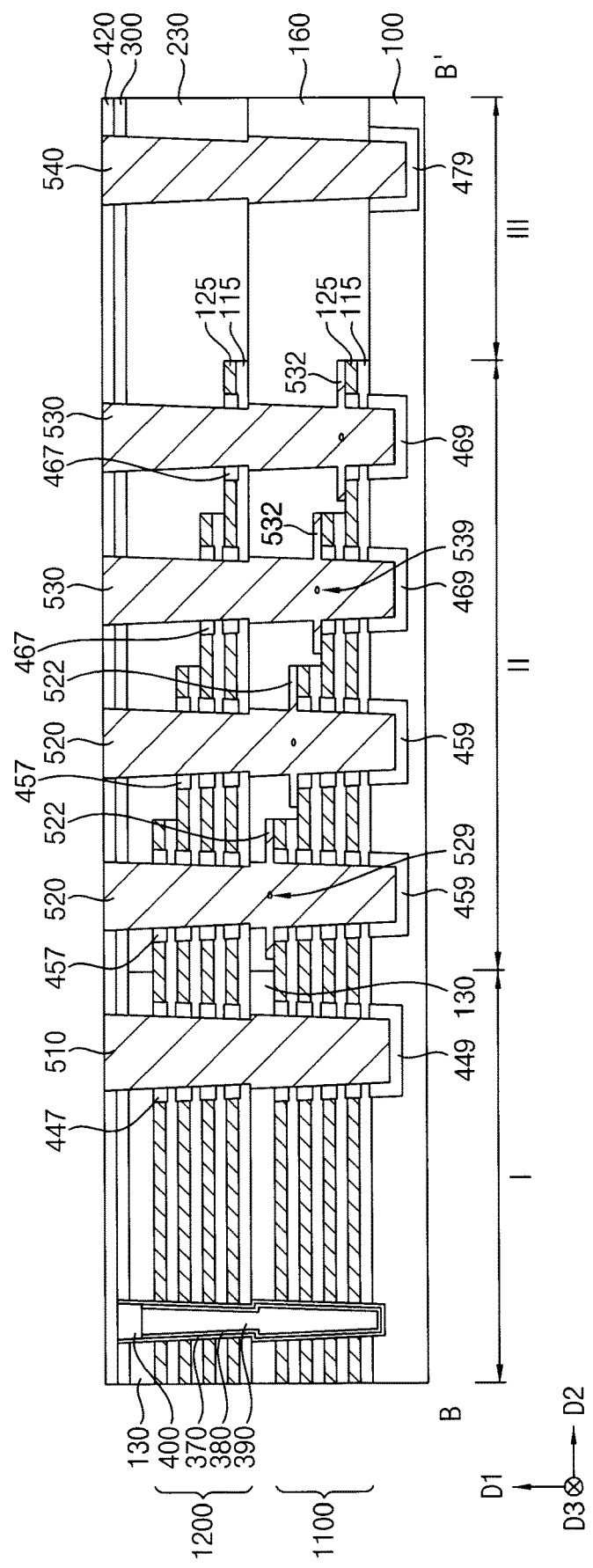
Figure 35:
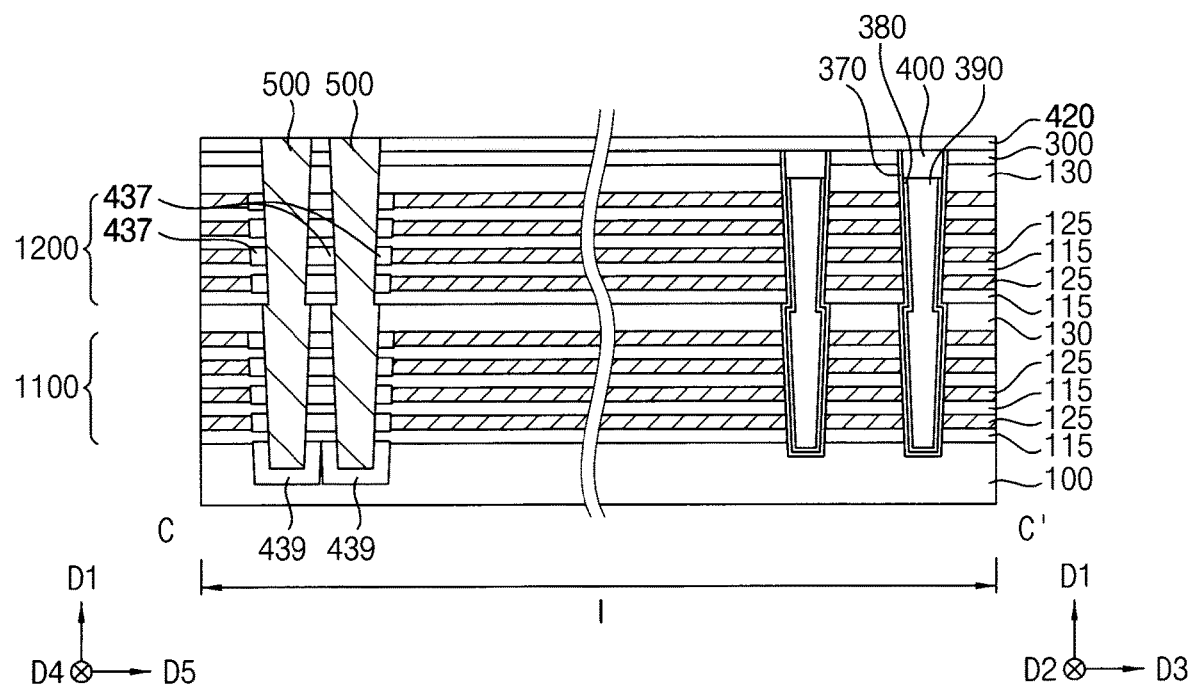

Referring to FIGS. 30 and 31, the first and second sacrificial pads 152 and 154 exposed by the sixteenth and seventeenth holes 450 and 460 may be removed to form sixth and seventh recesses 492 and 494, respectively. In example embodiments, the first and second sacrificial pads 152 and 154 including a nitride may be removed by a wet etching process using, e.g., phosphoric acid.

In example embodiments, portions of the first and second sacrificial pads 152 and 154, e.g., portions of the first and second sacrificial pads 152 and 154 adjacent to the sixteenth and seventeenth holes 450 and 460, respectively, may be removed to form the sixth and seventh recesses 492 and 494, respectively, which may have a circular shape or an elliptical shape in a plan view. The first and second sacrificial pads 152 and 154 may partially remain.

Referring to FIGS. 32A, 33A, 34A and 35, first to fifth conductive patterns 500, 510, 520, 530 and 540 may be formed in the fourteenth to eighteenth holes 430, 440, 450, 460 and 470, respectively. The first and second conductive patterns 500 and 510 may be formed on the first region I of the first substrate 100, the third and fourth conductive patterns 520 and 530 may be formed on the second region II of the first substrate 100, and the fifth conductive pattern 540 may be formed on the third region III of the first substrate 100. The first conductive pattern 500 may be removed later, and thus may be a sacrificial pattern. The second and fifth conductive patterns 510 and 540 may be through vias extending through memory cells or an insulating interlayer to transfer electrical signals between the first substrate 100 and wirings. The third and fourth conductive patterns 520 and 530 may be contact plugs for transferring electrical signals from the wirings to the gate electrodes 125 in the memory cells.

In example embodiments, each of the third and fourth conductive patterns 520 and 530 may extend through the first and second molds 1100 and 1200 where the memory cells are formed, however, may be electrically connected to only one of the gate electrodes 125 at a certain level. That is, in the first portion of each memory block, first and second conductive pads 522 and 532 may fill the sixth recesses 492 in the first mold 1100 to contact sidewalls of the third and fourth conductive patterns 520 and 530, respectively, and each of the third and fourth conductive patterns 520 and 530 may be electrically connected to only one of the gate electrodes 125 thereunder through a corresponding one of the first and second conductive pads 522 and 532.

Additionally, in the second portion of each memory block, third and fourth conductive pads 524 and 534 may fill the seventh recesses 494 in the second mold 1200 to contact sidewalls of the third and fourth conductive patterns 520 and 530, respectively, and each of the third and fourth conductive patterns 520 and 530 may be electrically connected to only one of the gate electrodes 125 thereunder through a corresponding one of the third and fourth conductive pads 524 and 534.

Each of the third and fourth conductive patterns 520 and 530 may be referred to as a vertical portion of the contact plug, and each of the first to conductive pads 522, 532, 524 and 534 may be referred to as a protrusion portion protruding from the vertical portion in a horizontal direction substantially parallel to the upper surface of the first substrate 100. In example embodiments, an edge of each of the first to fourth conductive pads 522, 532, 524 and 534 may have a circular shape or an elliptical shape in a plan view. That is, each of the first to fourth conductive pads 522, 532, 524 and 534 may have a circular ring shape or an elliptical ring shape surrounding, e.g., a perimeter of, the vertical portion in a plan view.

In some embodiments, first and second air gaps 529 and 539 may be formed in the third and fourth conductive patterns 520 and 530, respectively, adjacent to the first to fourth conductive pads 522, 532, 524 and 534. The first to fifth conductive patterns 500, 510, 520, 530 and 540 may include a metal, e.g., tungsten, titanium, tantalum, etc., and may further include a metal nitride covering a lower surface and a sidewall thereof.

Referring to FIGS. 32A, 33A, 34A and 35, each of the first to fourth conductive pads 522, 532, 524 and 534 may have a rectangular ring shape in a plan view. That is, each of the first to fourth conductive pads 522, 532, 524 and 534 may have a ring shape surrounding the vertical portion and having a circular inner sidewall and a rectangular outer sidewall in a plan view. Each of the first to fourth conductive pads 522, 532, 524 and 534 may have the above shape, in the processes described with reference to FIGS. 30 and 31, by removing not partially but entirely the first and second sacrificial pads 152 and 154 to form the sixth and seventh recesses 492 and 494, and filling the sixth and seventh recesses 492 and 494 with the first to fourth conductive pads 522, 532, 524 and 534.

Figure 36:
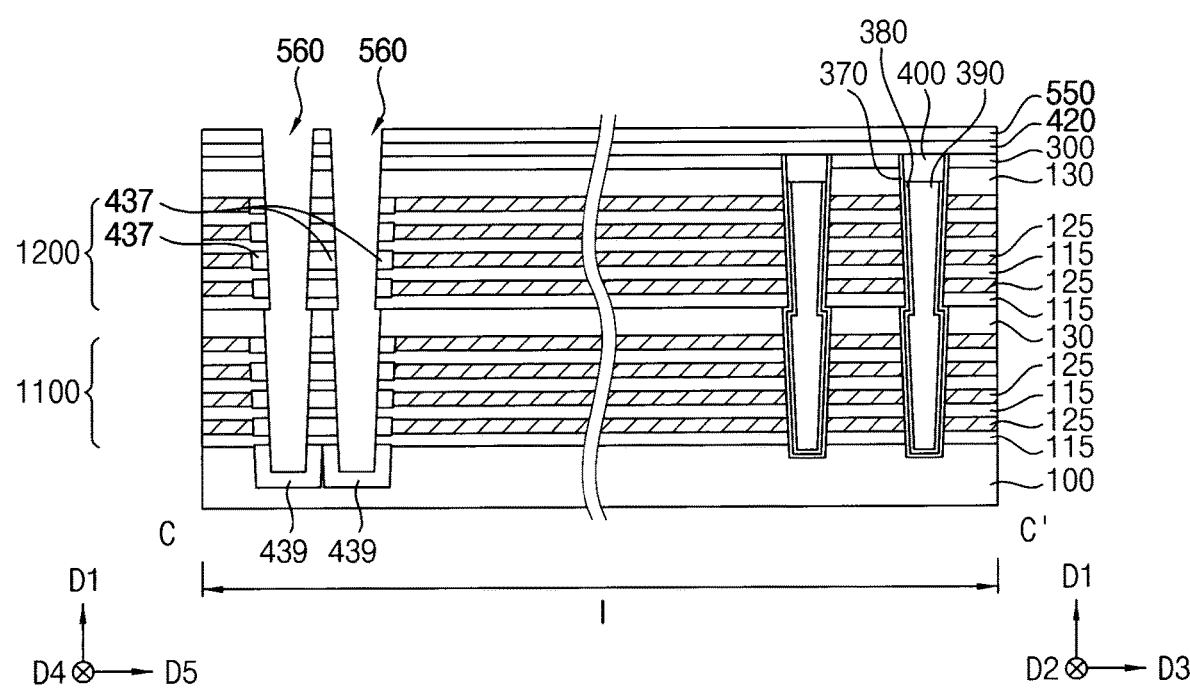

Referring to FIG. 36, a fifth insulating interlayer 550 may be formed on the fourth insulating interlayer 420 and the first to fifth conductive patterns 500, 510, 520, 530 and 540, a ninth opening may be formed through the fifth insulating interlayer 550 to expose an upper surface of the first conductive pattern 500, and the first conductive pattern 500 exposed by the ninth opening may be removed to form a nineteenth hole 560 exposing an upper surface of the sixth insulation pattern 439.

Figure 37:
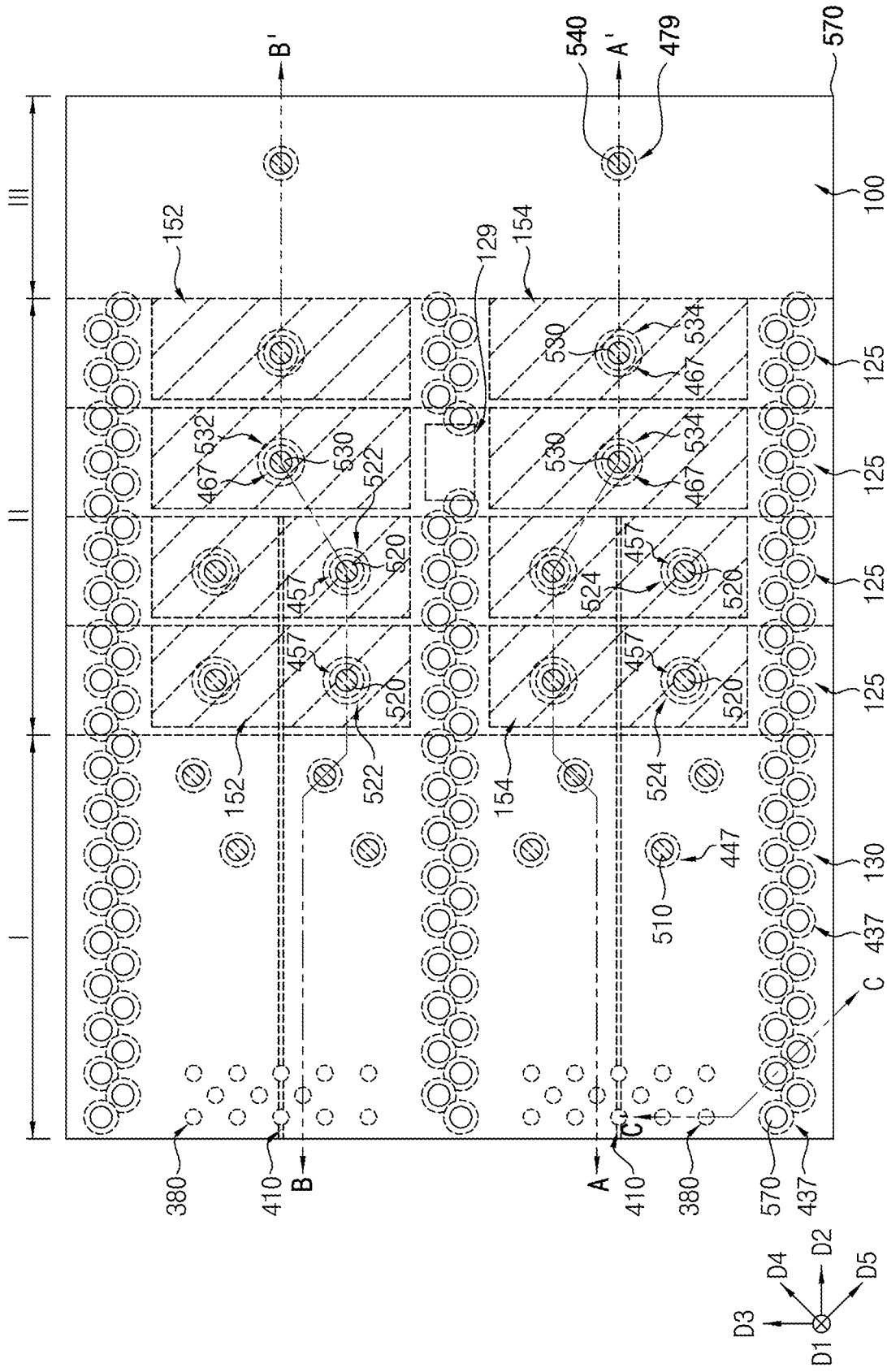
Figure 38:
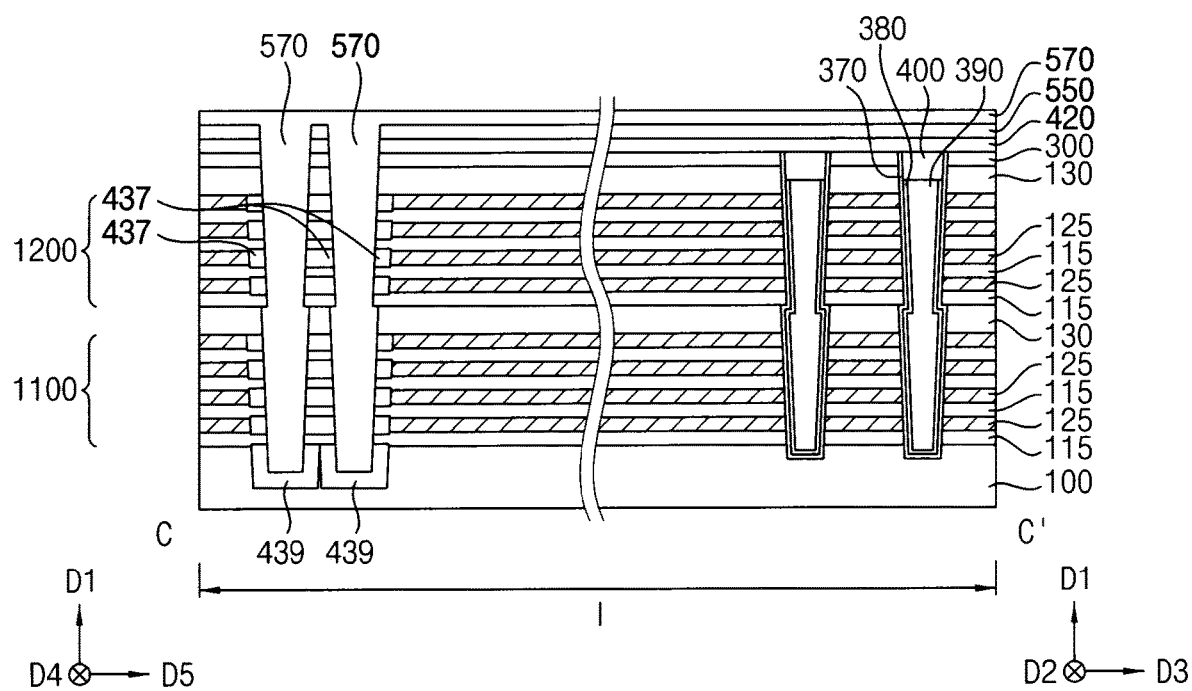

Referring to FIGS. 37 and 38, a third division layer 570 may be formed on the exposed upper surface of the sixth insulation pattern 439 and an upper surface of the fifth insulating interlayer 550. Hereinafter, a portion of the third division layer 570 in the nineteenth hole 560 may be referred to as a third division pattern. The memory blocks may be separated by the third division patterns arranged in a zigzag pattern in the second direction D2 and the second insulation pattern 437 contacting the third division patterns. For example, as illustrated in FIG. 37, the third division patterns may be adjacent to each other in the second direction D2 to form a zigzag pattern with sides having concave and convex portions, e.g., due to the circular holes, and memory blocks adjacent to each other in the third direction D3 may be, e.g., completely, separated from each other by the zigzag patterned third division patterns. The third division layer 570 may include an oxide, e.g., silicon oxide.

Figure 39:
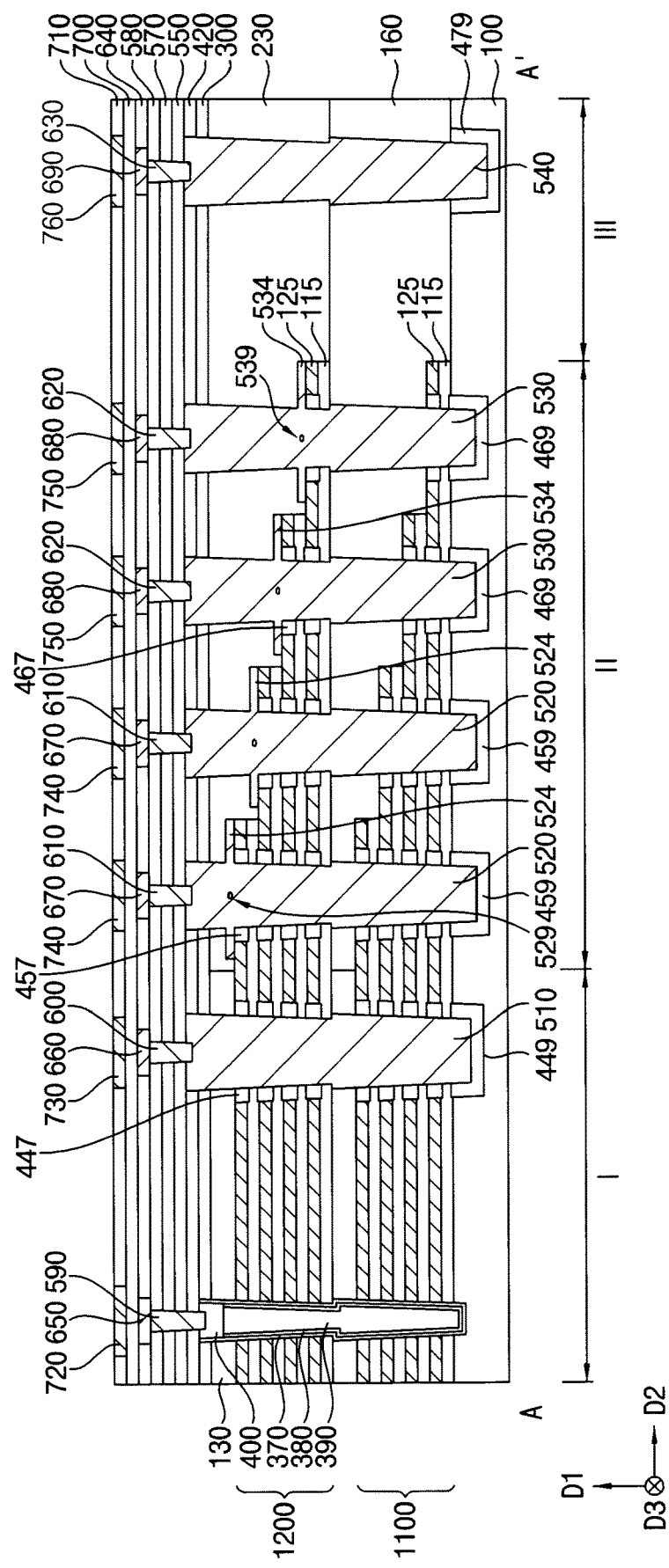

Referring to FIG. 39, a sixth insulating interlayer 580 may be formed on the third division layer 570, and first to fifth vias 590, 600, 610, 620 and 630 may be formed through the fifth and sixth insulating interlayers 550 and 580 and the third division layer 570 to contact upper surfaces of the capping pattern 400 and the second to fifth conductive patterns 510, 520, 530 and 540, respectively.

A seventh insulating interlayer 640 may be formed on the sixth insulating interlayer 580 and the first to fifth vias 590, 600, 610, 620 and 630, and first to fifth wirings 650, 660, 670, 680 and 690 may be formed through the seventh insulating interlayer 640 to contact upper surfaces of the first to fifth vias 590, 600, 610, 620 and 630, respectively.

An eighth insulating interlayer 700 may be formed on the seventh insulating interlayer 640 and the first to fifth wirings 650, 660, 670, 680 and 690, a ninth insulating interlayer 710 may be formed on the eighth insulating interlayer 700, and sixth to tenth wirings 720, 730, 740, 750 and 760 may be formed through the ninth insulating interlayer 710. Vias may be further formed through the eighth insulating interlayer 700 to connect the first to fifth wirings 650, 660, 670, 680 and 690 to corresponding ones of the sixth to tenth wirings 720, 730, 740, 750 and 760, respectively.

The first to fifth vias 590, 600, 610, 620 and 630 and the first to tenth wirings 650, 660, 670, 680, 690, 720, 730, 740, 750 and 760 may include a metal, e.g., tungsten, titanium, tantalum, etc., and may further include a metal nitride covering a lower surface and a sidewall thereof.

In example embodiments, the first wiring 650 or the sixth wiring 720 may be electrically connected to the capping pattern 400 to serve as a bit line. The first wiring 650 or the sixth wiring 720 may extend in the third direction D3, and a plurality of first wirings 650 or a plurality of sixth wirings 720 may be spaced apart from each other in the second direction D2.

The structures on the first substrate 100 formed by the above processes may have the following structural characteristics. Each memory block may include the first and second molds 1100 and 1200 sequentially stacked in the first direction D1 on the first and second regions I and II of the first substrate 100, the channels 380 and the charge storage structures 370 on the first region I of the first substrate 100, the second conductive pattern 510 on the first region I of the first substrate 100, the third and fourth conductive patterns 520 and 530 on the second region II of the first substrate 100, and the fifth conductive pattern 540 on the third region III of the first substrate 100, and first and second gate electrode structures may be formed in the first and second molds 1100 and 1200, respectively.

The first gate electrode structure may include the gate electrodes 125 spaced apart from each other in the first direction D1 and stacked in a staircase shape in the first mold 1100 (hereinafter, referred to as first gate electrodes), and the second gate electrode structure may include the gate electrodes 125 spaced apart from each other over the first gate electrode structure in the first direction D1 and stacked in a staircase shape in the second mold 1200 (hereinafter, referred to as second gate electrodes). Each of the channels 380 may extend in the first direction D1 through the first and second gate electrode structures on the first substrate 100, and each of the second and third conductive patterns 520 and 530, i.e., the contact plugs, may extend in the first direction D1 through the first and second gate electrode structures.

In example embodiments, second steps at end portions in the second direction D2 of the second gate electrodes, respectively, on the second region II of the first substrate 100 may overlap in the first direction D1 first steps at end portions in the second direction D2 of the first gate electrodes, respectively. In example embodiments, the contact plug may extend through corresponding ones of the first and second steps, respectively, but may be electrically connected to only one of the corresponding ones of the first and second steps.

In example embodiments, the contact plug may include the vertical portion extending in the first direction D1 and a protrusion portion protruding from the vertical portion in the horizontal direction, and the protrusion portion may contact an upper surface of the only one of the corresponding ones of the first and second steps to which the contact plug is electrically connected. In example embodiments, the fourth insulation pattern 457 or the fifth insulation pattern 467 may cover a sidewall of the vertical portion of the contact plug, and may contact a sidewall of each of the first and second gate electrodes facing the sidewall of the vertical portion of the contact plug.

In example embodiments, the first and second gate electrode structures may form a gate electrode stack structure, and a plurality of gate electrode stack structures may be spaced apart from each other in the third direction D3 by a third division pattern structure including the third division pattern of the third division layer 570 and the second insulation pattern 437 adjacent thereto. That is, a plurality of memory blocks may be spaced apart from each other in the third direction D3 by the third division pattern structure. The third division pattern structure may extend in the second direction D2, and each of opposite sidewalls in the third direction D3 may have an uneven surface. In example embodiments, a plurality of third division patterns may be spaced apart from each other in the second direction D2, and may be arranged in a zigzag pattern. The second insulation pattern 437 may cover sidewalls of the third division patterns, and may extend in the second direction D2.

In example embodiments, the third division pattern structure may be also formed at a central portion in the third direction D3 of each of the gate electrode stack structures on the first substrate 100, which may be referred to as a fifth division pattern structure hereinafter. The fifth division pattern structure may extend in the second direction D2, but may not extend to an end in the second direction D2 of each of the gate electrode stack structures. Thus, each of the gate electrode stack structures may be partially divided in the third direction D3 by the fifth division pattern structure. Each of the gate electrode stack structures may include first and second portions at opposite sides, respectively, in the third direction D3 of the fifth division pattern structure.

In example embodiments, the contact plug may include first and second contact plugs extending through the first and second portions, respectively, of each of the gate electrode stack structures. The first contact plug may be electrically connected to one of the first steps of the first gate electrode structure in the first portion of each of the gate electrode stack structures, and the second contact plug may be electrically connected to one of the second steps of the second gate electrode structure in the second portion of each of the gate electrode stack structures.

In example embodiments, a plurality of first contact plugs may be disposed in the second direction D2, and a plurality of second contact plugs may be disposed in the second direction D2. Each of the first contact plugs may be electrically connected to a first step among corresponding first and second steps in the first portion of each of the gate electrode stack structure, and each of the second contact plugs may be electrically connected to a second step among corresponding first and second steps in the second portion of each of the gate electrode stack structure.

In example embodiments, the second conductive pattern 510, i.e., the through via (hereinafter, referred to as a first through via) may extend in the first direction D1 through each of the gate electrode stack structures, however, may not extend through the steps. The fifth conductive pattern 540, i.e., the through via (hereinafter, referred to as a second through via) may extend in the first direction D1, however, may not extend through each of the gate electrode stack structures.

In example embodiments, upper surfaces of the first and second through vias may be substantially coplanar with an upper surface of the contact plug, and the first and second through vias may include substantially the same material as the contact plug. In example embodiments, an upper surface of each of the third division patterns may be higher than the upper surfaces of the first and second through vias and the contact plug, and upper surfaces of the channels may be lower than the upper surfaces of the first and second through vias and the contact plug.

The gate electrodes 125 included in each of the first and second gate electrode structures may serve as a ground selection line (GSL), a word line, and a string selection line (SSL) according to positions thereof. In an example embodiment, in each of the first and second gate electrode structures, one of the gate electrodes 125 at a lowermost level may serve as the GSL, ones of the gate electrodes 125 at an uppermost level and a second level from above may serve as the SSLs, respectively, and ones of the gate electrodes 125 at other levels may serve as word lines, respectively. However, embodiments are not limited thereto, and the levels of the gate electrodes 125 serving as the GSL, the SSL, and the word line, respectively, may be changed.

Hereinafter, a method of forming a lower circuit pattern on a second substrate 800 to be bonded with the first substrate 100 having the above structures will be described.

Referring to FIG. 40, the lower circuit pattern may be formed on the second substrate 800 including an active region 805 defined by an isolation pattern 810. The lower circuit pattern may include, e.g., transistors, lower contact plugs, lower wirings, lower vias, etc.

FIG. 40 shows two transistors, each of which may include a lower gate structure 850 on the second substrate 800 and an impurity region 802 at an upper portion of the active region 805. However, embodiments are not limited thereto, e.g., more than two transistors may be formed. The lower gate structure 850 may include a lower gate insulation pattern 820, a lower gate electrode 830, and a lower gate mask 840 sequentially stacked on the second substrate 800.

A first lower insulating interlayer 860 may be formed on the second substrate 800 to cover the transistors, and a lower contact plug 870 may be formed through the first lower insulating interlayer 860 to contact the impurity region 802. A first lower wiring 880 may be formed on the first lower insulating interlayer 860 to contact an upper surface of the lower contact plug 870, and a first lower via 890, a second lower wiring 900, a second lower via 910, and a third lower wiring 922 may be sequentially stacked on the first lower wiring 880. Fourth to sixth lower wirings 924, 926 and 928 may be formed at the same levels as the third lower wiring 922, and may be electrically connected to other structures of the lower circuit pattern. The first to sixth lower wirings 880, 900, 922, 924, 926 and 928 and the first and second lower vias 890 and 910 may be covered by a second lower insulating interlayer 930 on the first lower insulating interlayer 860.

The lower contact plug 870, the first and second lower vias 890 and 910, and the first to sixth lower wirings 880, 900, 922, 924, 926 and 928 may include a metal, e.g., tungsten, titanium, tantalum, etc., and may further include a metal nitride covering a lower surface and a sidewall thereof.

Figure 42:
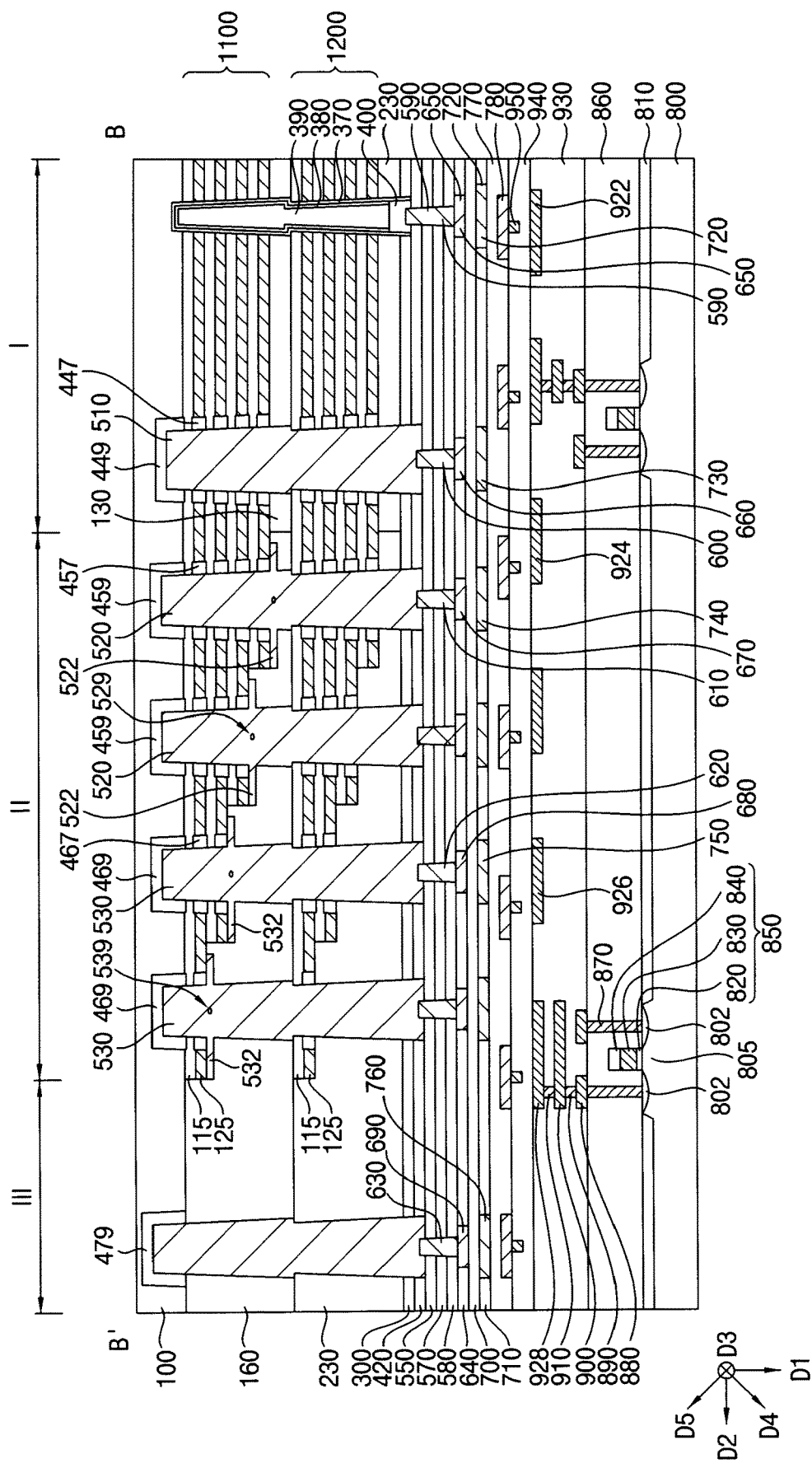
Figure 43:
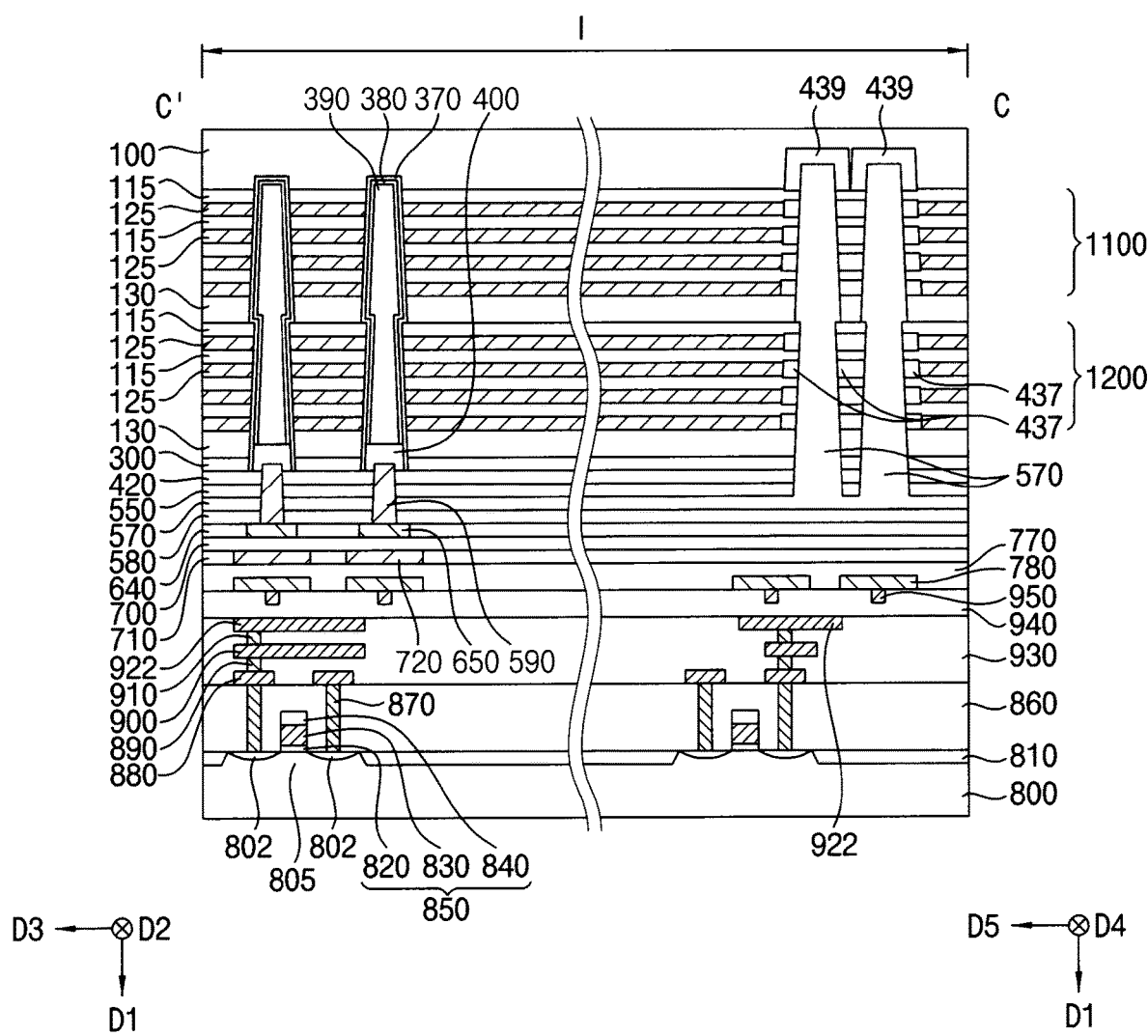

Referring to FIGS. 41 to 43, a first adhesion layer 770 may be formed on the ninth insulating interlayer 710 on the first substrate 100, and first metal patterns 780 may be formed at an upper portion of the first adhesion layer 770. A second adhesion layer 940 may be formed on the second lower insulating interlayer 930 on the second substrate 800, and second metal patterns 950 may be formed at an upper portion of the second adhesion layer 940. The first and second adhesion layers 770 and 940 may include an oxide, e.g., silicon oxide, and the first and second metal patterns 780 and 950 may include a metal, e.g., copper, aluminum, etc.

The first substrate 100 may be overturned, and the first adhesion layer 770 may be bonded with the second adhesion layer 940 on the second substrate 800, and the first metal patterns 780 and the second metal patterns 950 may contact each other. Thus, the structures on the first substrate 100 may be turned upside down, and hereinafter, will be described according to the reversed up and down directions. Additionally, portions of the second substrate 800 overlapping in the first direction D1 the first to third regions I, II and III of the first substrate 100 will be referred to as first to third regions I, II and III, respectively, of the second substrate 800.

Figure 44:
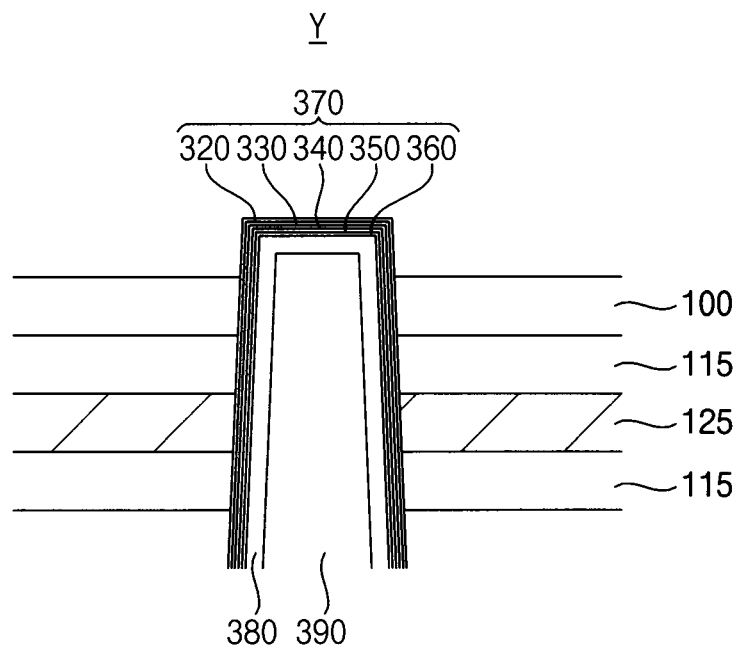

Referring to FIG. 44, an upper portion of the first substrate 100 may be removed by, e.g., a grinding process, and a portion of the first substrate 100 may be removed by, e.g., a dry etching process until an upper portion of the charge storage structure 370 is exposed.

Figure 45:
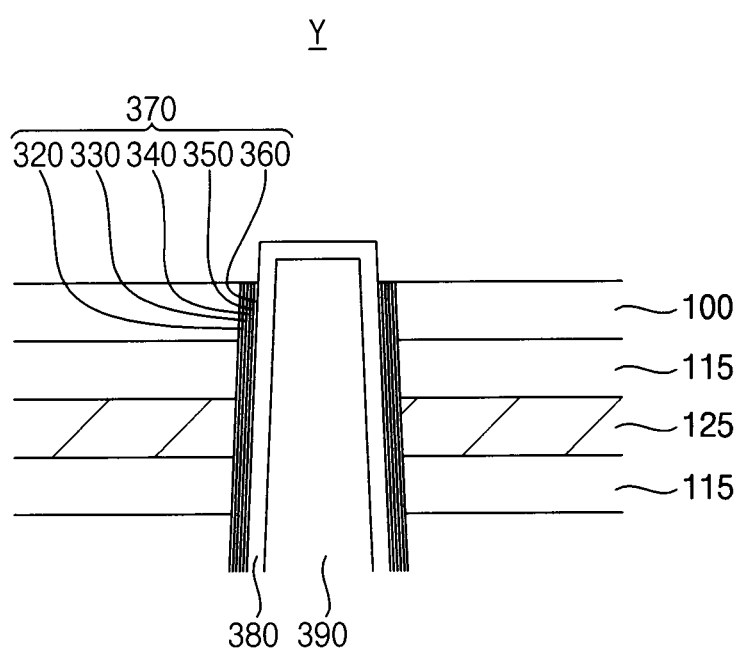

Referring to FIG. 45, the exposed upper portion of the charge storage structure 370 may be removed by, e.g., a wet etching process or a dry etching process to expose an upper surface of the channel 380.

In the drawing, uppermost surfaces of the tunnel insulation pattern 360, the charge storage pattern 350, the first and second blocking patterns 340 and 330, and the oxidation prevention pattern 320 included in the charge storage structure 370 are substantially coplanar with each other. However, embodiments are not limited thereto, e.g., the tunnel insulation pattern 360, the charge storage pattern 350, the first and second blocking patterns 340 and 330, and the oxidation prevention pattern 320 may include different materials from each other, and thus the upper surfaces thereof may not be coplanar with each other according to the etching selectivity of an etching solution or an etching gas used in the wet etching process or the dry etching process.

Figure 46:
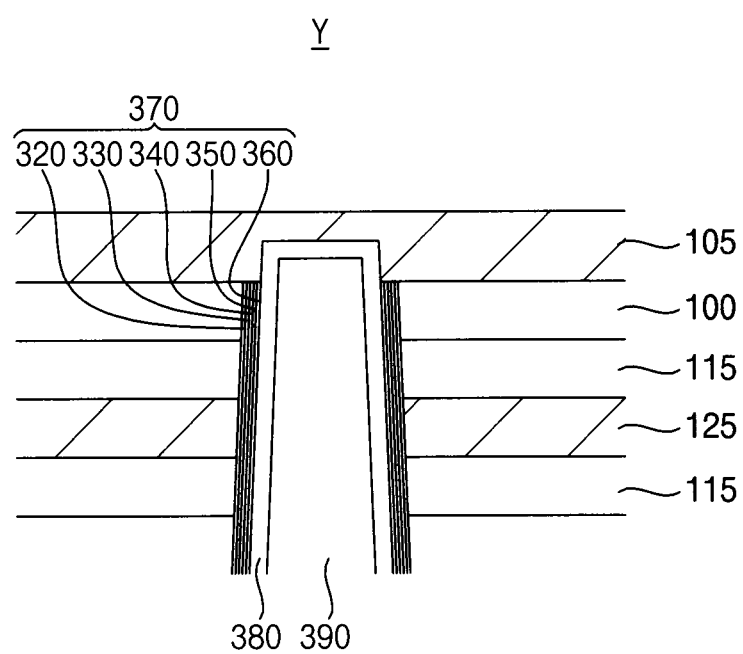

Referring to FIG. 46, a channel connection layer 105 may be formed on the first substrate 100 and the charge storage structure 370 to cover the exposed upper surface of the channel 380. In example embodiments, the channel connection layer 105 may include polysilicon doped with p-type impurities, and thus the channels 380 may be electrically connected with each other by the channel connection layer 105. The channel connection layer 105 includes p-type impurities, and thus may provide holes when body erase is performed using gate induced drain leakage (GIDL) phenomenon, so that no additional gate electrode for performing the body erase is needed. The vertical memory device may be manufactured by the above processes.

As described above, the first to fifth conductive patterns 500, 510, 520, 530 and 540 may be formed by the same etching process and deposition process, so that the cost and time for forming the first to fifth conductive patterns 500, 510, 520, 530 and 540 may be reduced. Particularly, each of the second and third conductive patterns 520 and 530 serving as a contact plug may extend through the first and second gate electrode structures, however, may be electrically connected to only one of the gate electrodes 125 at a given level through one of the conductive pads 522, 524, 532 and 534.

The steps of the first and second molds 1100 and 1200 where the first and second gate electrode structures are formed may overlap each other in the first direction D1. Thus, a horizontal area of the vertical memory device may be reduced when compared to a vertical memory device including the steps not overlapping each other in the first direction D1.

The third division pattern structure for dividing the memory blocks may be formed by forming the fourteenth hole 430 together with the thirteenth hole 310 and the fifteenth to eighteenth holes 440, 450, 460 and 470 for the channel 380 and the second to fifth conductive patterns 510, 520, 530 and 540, respectively, forming the first conductive pattern 500 in the fourteenth hole 430 and removing the first conductive pattern 500 from the fourteenth hole 430, forming the third division layer 570 in the fourteenth hole 430, and forming the second insulation pattern 437 together with the third to fifth insulation patterns 447, 457 and 467 for electrically insulating the second to fourth conductive patterns 510, 520 and 530, respectively, from the gate electrodes 125. Accordingly, the number of processes for forming the third division pattern structure may be reduced.

The vertical memory device may have following structural characteristics. The vertical memory device may include the lower circuit elements 850, 870, 880, 890, 900, 910, 922, 924, 926 and 928 on the second substrate 800 including the cell region I, the extension region II at least partially surrounding the cell region I, and the peripheral circuit region III at least partially surrounding the extension region II, the upper circuit elements 590, 600, 610, 620, 630, 650, 660, 670, 680, 690, 720, 730, 740, 750 and 760 thereover, a first gate electrode structure including ones of the gate electrodes 125 (hereinafter, referred to as first gate electrodes, respectively) spaced apart from each other in the first direction D1 over the upper circuit pattern on the cell region I and the extension region II of the second substrate 800 and having an inverse staircase shape on the extension region II of the second substrate 800, a second gate electrode structure including ones of the gate electrodes 125 (hereinafter, referred to as second gate electrodes, respectively) spaced apart from each other in the first direction D1 over the first gate electrode structure and having an inverse staircase shape on the extension region II of the second substrate 800, the channels 380 each of which may extend in the first direction D1 through both of the first and second gate electrode structures on the cell region I of the second substrate 800, the contact plugs 520 and 530 each of which may extend in the first direction D1 through the first and second gate electrode structures on the extension region II of the second substrate 800, the second conductive pattern 510 (i.e., the first through via 510) extending in the first direction D1 through the first and second gate electrode structures on the cell region I of the second substrate 800, and the second through via 540 extending in the first direction D1 on the peripheral circuit region III of the second substrate 800.

In example embodiments, second steps at respective end portions of the second gate electrodes may overlap in the first direction D1 first steps at respective end portions of the first gate electrodes on the extension region II of the second substrate 800, and each of the contact plugs 520 and 530 may extend through either the first steps or the second steps, but may be electrically connected to only one of the first steps or only one of the second steps.

In example embodiments, each of the contact plugs 520 and 530 may include a vertical portion extending in the first direction D1 and a protrusion portion protruding from the vertical portion in the horizontal direction, and the protrusion portion may contact a lower surface of the only one of the first steps or the only one of the second steps that may be electrically connected to each of the contact plugs 520 and 530.

Figure 47:
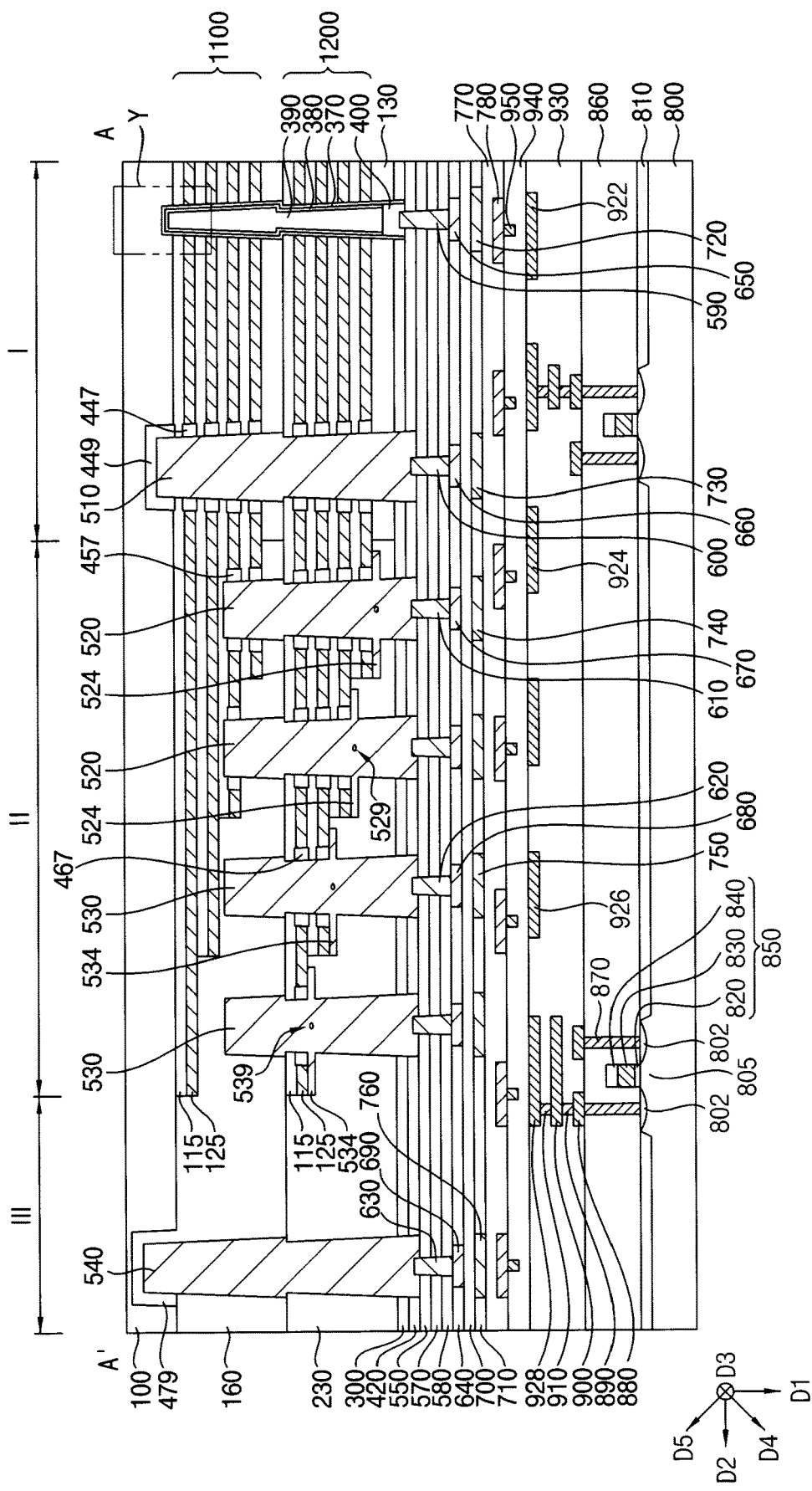
FIGS. 47 and 48 are cross-sectional views along lines A-A' and B-B', respectively, of corresponding plan views.
Figure 48:
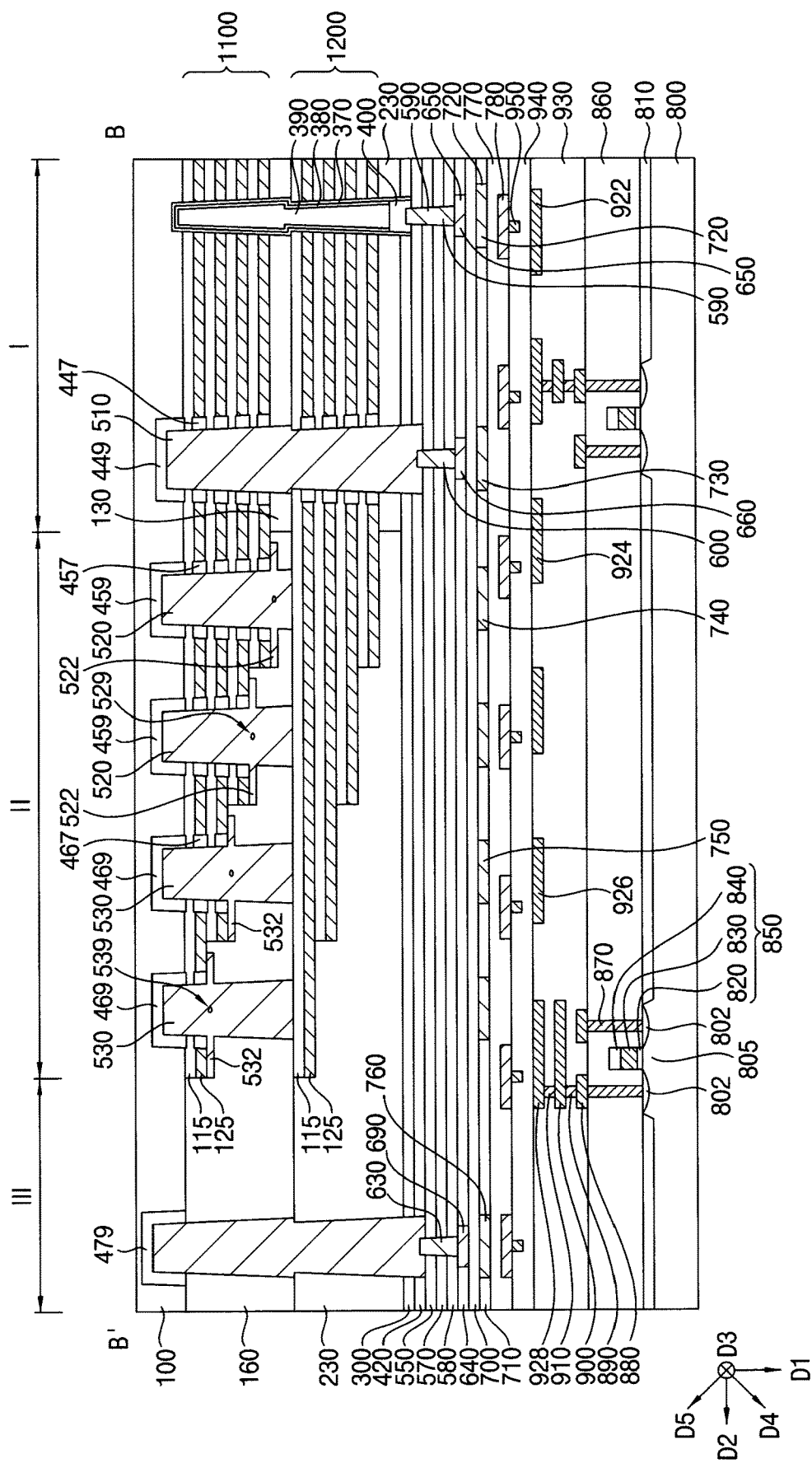

FIGS. 47 and 48 are cross-sectional views illustrating a vertical memory device in accordance with example embodiments, particularly, cross-sectional views taken along lines A-A' and B-B', respectively, of corresponding plan views. This vertical memory device may be substantially the same as or similar to that of FIGS. 41 and 42, except for third and fourth conductive patterns, and detailed descriptions thereon are omitted herein.

Referring to FIGS. 47 and 48, the third and fourth conductive patterns 520 and 530 extending through the gate electrodes 125 of the first mold 1100 to be electrically connected thereto via the first and second conductive pads 522 and 532 may not extend through the gate electrodes 125 of the second mold 1200. In this case, the third and fourth conductive patterns 520 and 530 may receive electrical signals by upper wirings on the first substrate 100 and upper vias extending through the first substrate 100 and the eighth and ninth insulation patterns 459 and 469.

Additionally, the third and fourth conductive patterns 520 and 530 extending through the gate electrodes 125 of the second mold 1200 to be electrically connected thereto via the third and fourth conductive pads 524 and 534 may not entirely extend through the gate electrodes 125 but partially extend therethrough. The third and fourth conductive patterns 520 and 530 may not be electrically connected to the gate electrodes 125 of the first mold 1100, and thus may not necessarily extend therethrough.

FIGS. 49 to 57 are cross-sectional views illustrating vertical memory devices in accordance with example embodiments, and particularly, cross-sectional views taken along lines C-C', respectively, of corresponding plan views. These vertical memory devices may be substantially the same as or similar to that of FIG. 43, except for the third division pattern structure, and thus repeated descriptions are omitted herein.

Figure 49:
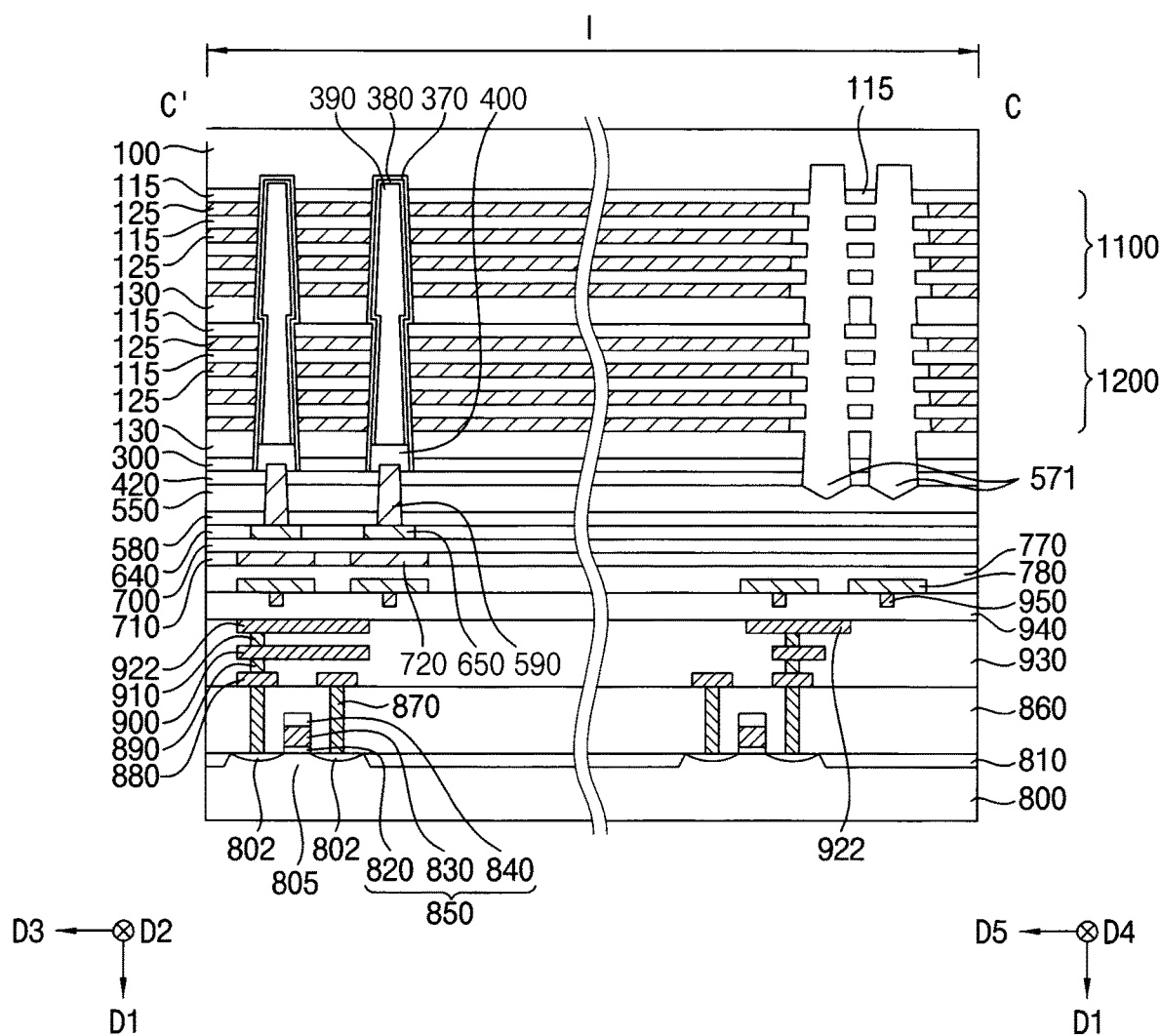
FIGS. 49 to 57 are cross-sectional views along lines C-C', respectively, of corresponding plan views.

Referring to FIG. 49, unlike that of FIG. 43, a vertical portion of a sixth division pattern 571 instead of the third division pattern, which may be a vertical portion of the third division layer 570, may be formed in the nineteenth hole 560, and a horizontal portion of the sixth division pattern 571, which may extend in the horizontal direction from the vertical portion of the sixth division pattern 517, instead of the second insulation pattern 437, may be formed in the nineteenth hole 560 and between the gate electrodes 125. Each of the vertical portion or the horizontal portion of the sixth division pattern 571 may include air or be in a vacuum state, and thus the sixth division pattern 571 may be an air gap. A lower surface of the sixth division pattern 571 may be convex downwardly.

The sixth division pattern 571 may be formed by a separate process from the process of forming the second to fifth recesses 435, 445, 455 and 465 illustrated with reference to FIGS. 25 and 26. That is, portions of the gate electrodes 125 between the nineteenth holes 560 arranged in a zigzag pattern along the second direction D2 may be removed to form the second recess 435, and thus the nineteenth holes 560 may be connected with each other.

A capping pattern may be formed on the nineteenth holes 560 using a material having a low gap-filling characteristic, or the fifth insulating interlayer 550 that may be formed subsequently may serve as the capping pattern, and thus the sixth division pattern 571 including air or being in a vacuum state may be formed.

Figure 50:
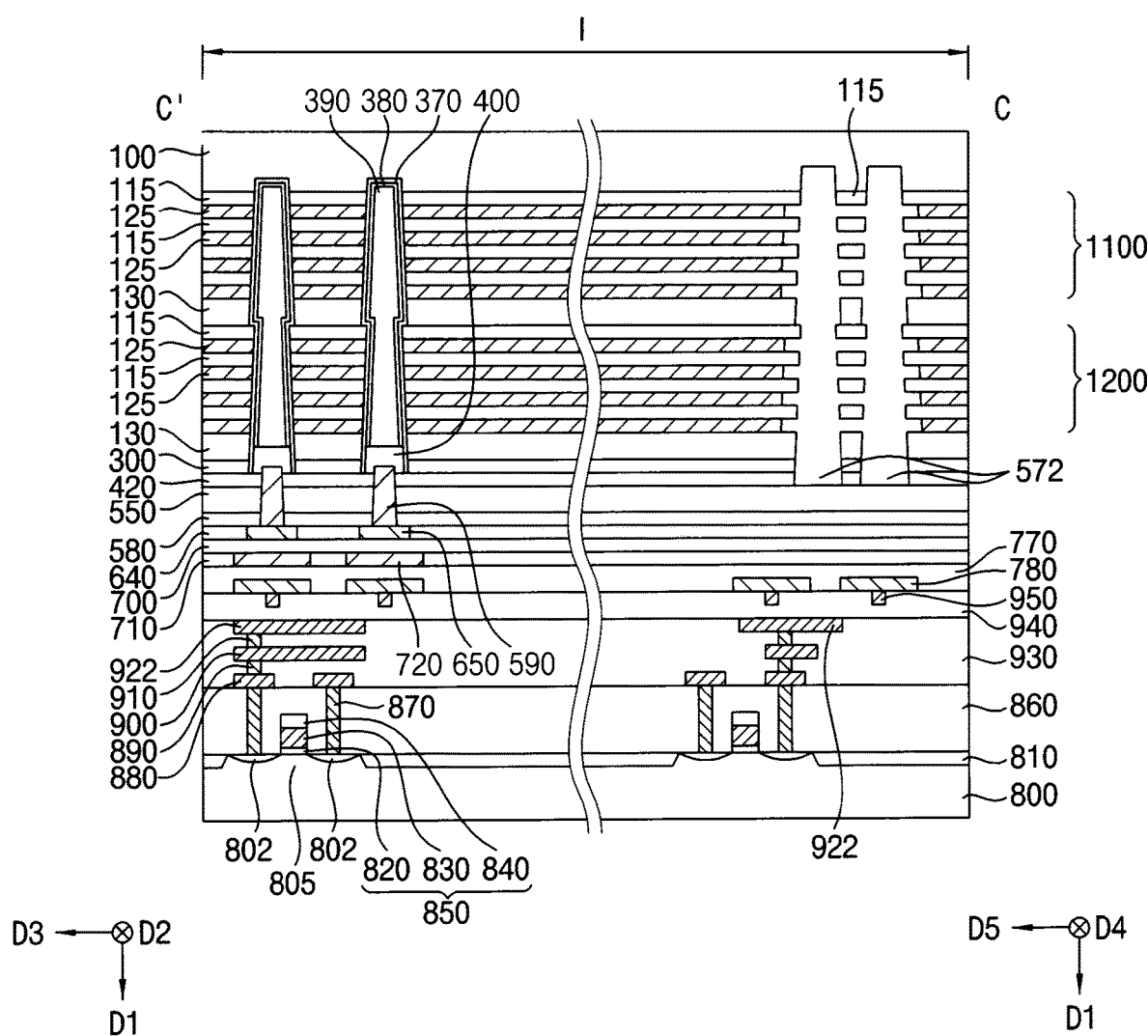

Referring to FIG. 50, unlike that of FIG. 49, the nineteenth holes 560 and the second recesses 435 may be filled with an insulating material, e.g., an oxide, so as to form a seventh division pattern 572 instead of the sixth division pattern 571. The seventh division pattern 572 may have a flat lower surface unlike that of the sixth division pattern 571.

Figure 51:
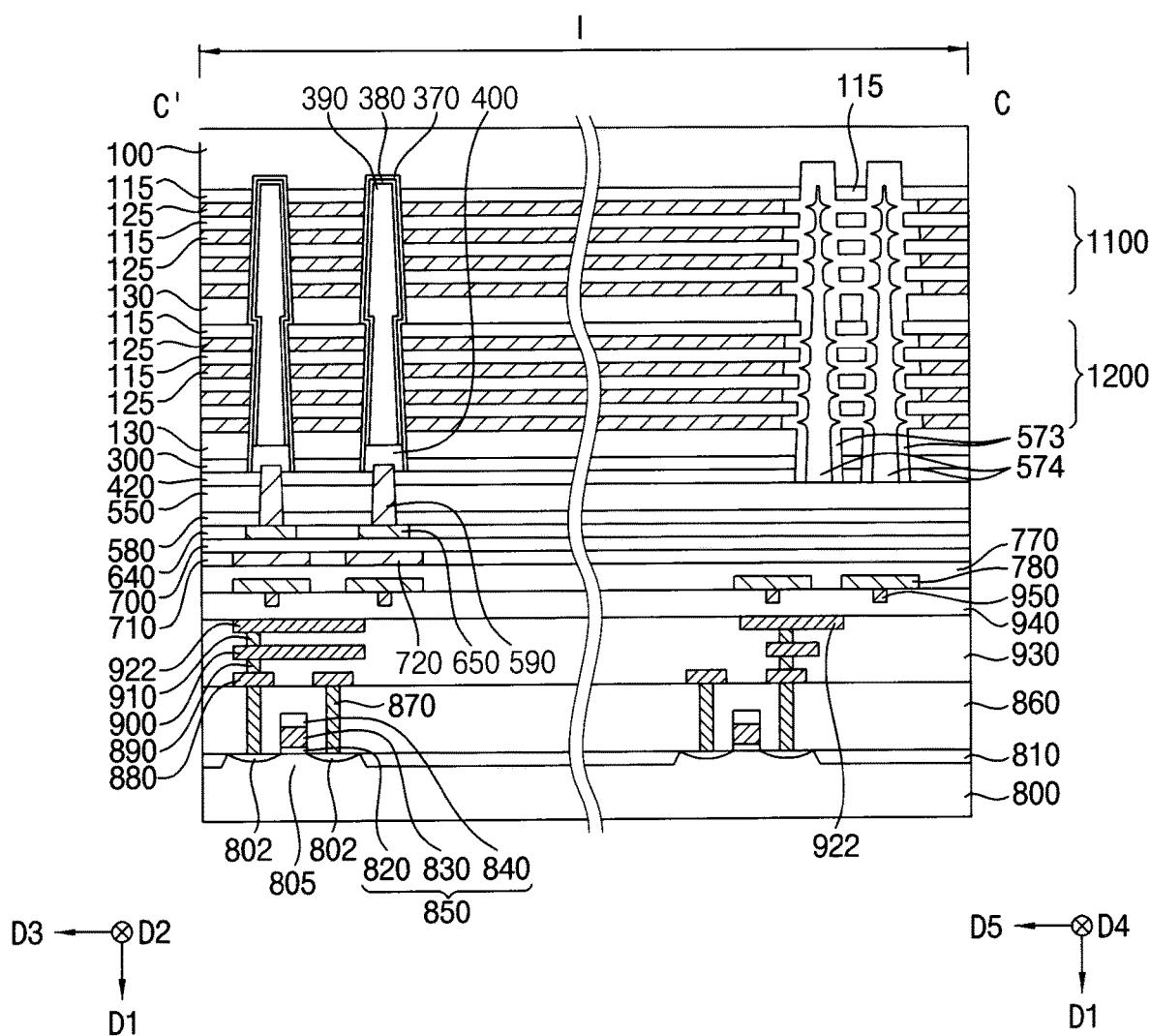
Figure 52:
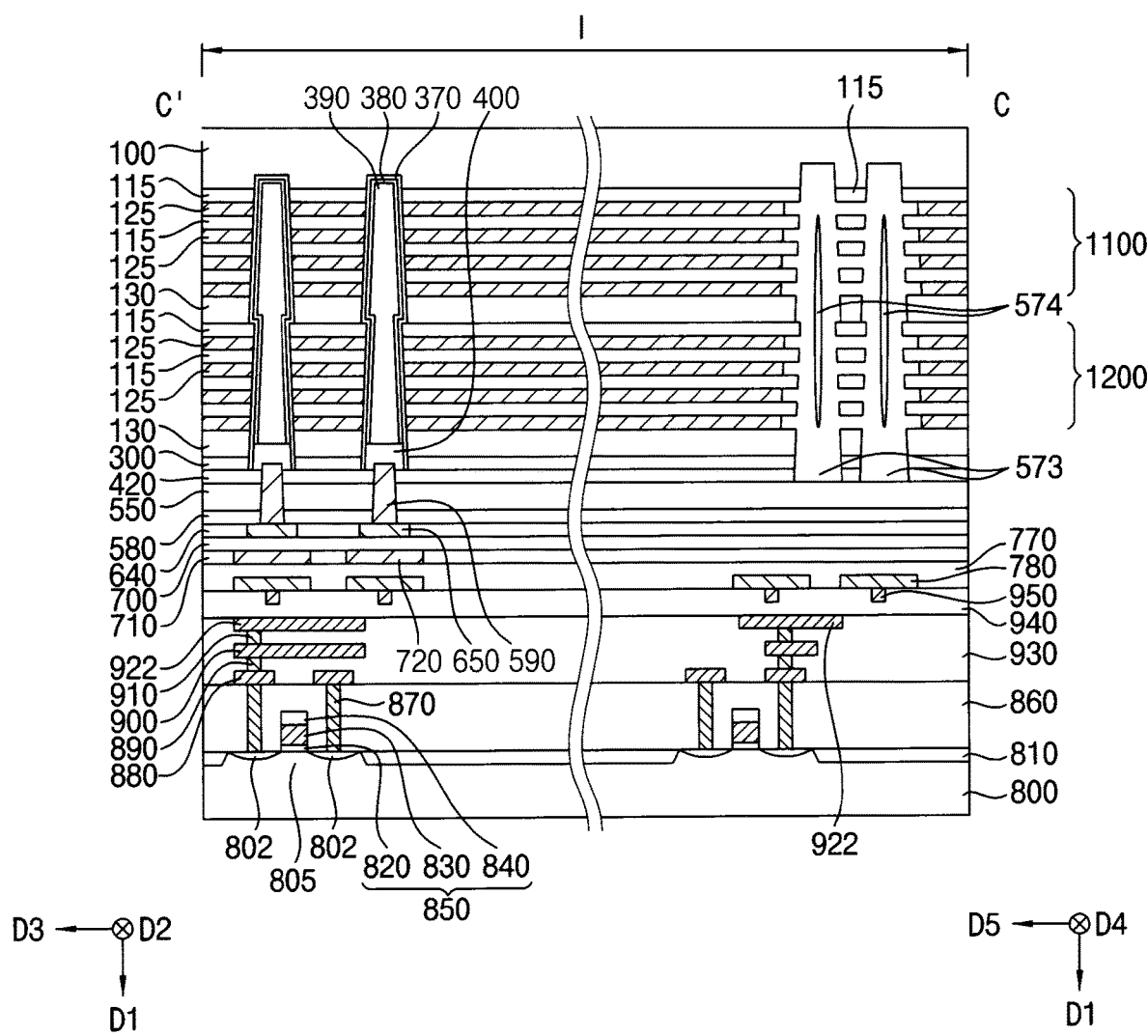

Referring to FIGS. 51 and 52, like that of FIG. 50, the nineteenth holes 560 and the second recesses 435 may be filled with an insulating material, e.g., an oxide, however, unlike that of FIG. 51, each of the nineteenth holes 560 may not be entirely filled with the insulating material. Thus, an eighth division pattern 573 may be formed on a sidewall and beneath an upper surface of each of the nineteenth holes 560, and a ninth division pattern 574 including an air or being in a vacuum state may be formed in a middle portion of each of the nineteenth holes 560.

Figure 53:
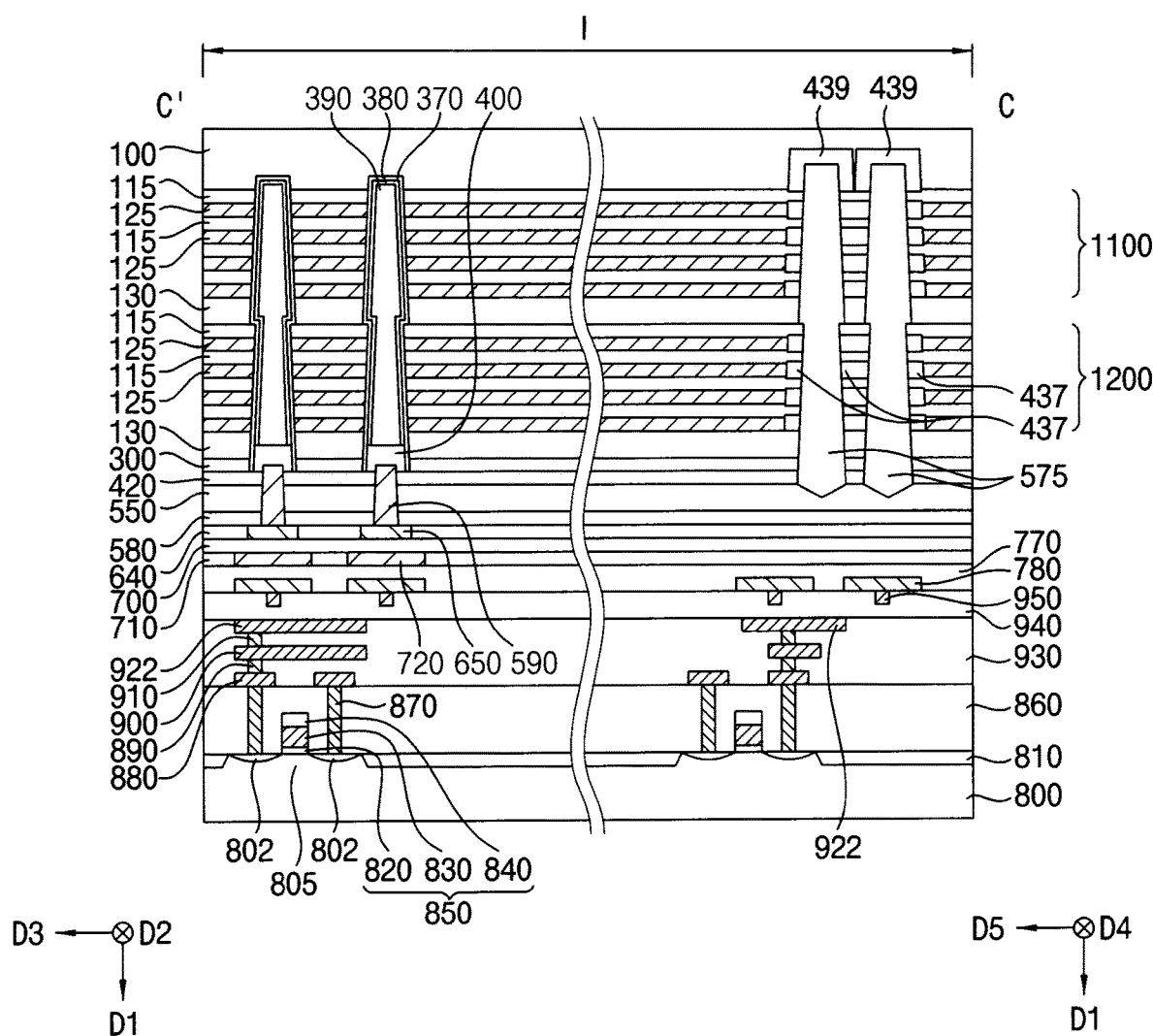

Referring to FIG. 53, unlike that of FIG. 43, a tenth division pattern 575 instead of the third division pattern, which may be the vertical portion of the third division layer 570, may be formed in the nineteenth hole 560.

The tenth division pattern 575 may include air or be in a vacuum state, and thus the tenth division pattern 575 may be an air gap. A lower surface of the tenth division pattern 575 may be convex downwardly.

The tenth division pattern 575 may be formed by forming a capping pattern on the nineteenth holes 560 using a material having a low gap-filling characteristic after forming the second to fifth insulation patterns 437, 447, 457 and 467 by the processes illustrated with reference to FIGS. 27 to 29, or the fifth insulating interlayer 550 that may be formed subsequently may serve as the capping pattern.

Figure 54:
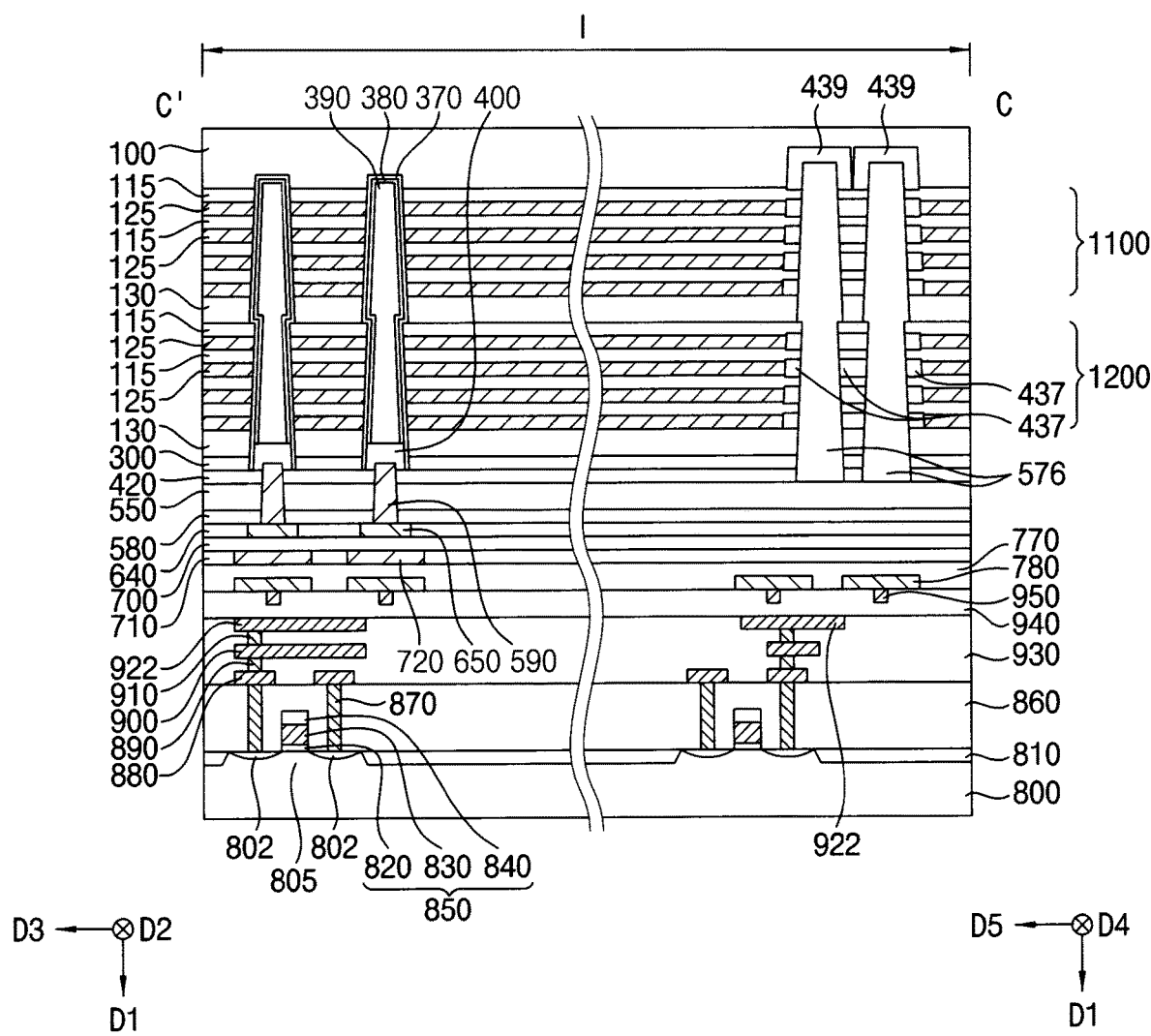

Referring to FIG. 54, unlike that of FIG. 53, an eleventh division pattern 576 including an insulating material, e.g., an oxide, instead of the tenth division pattern 575, may be formed in the nineteenth hole 560. The eleventh division pattern 576 may have a flat lower surface.

Figure 55:
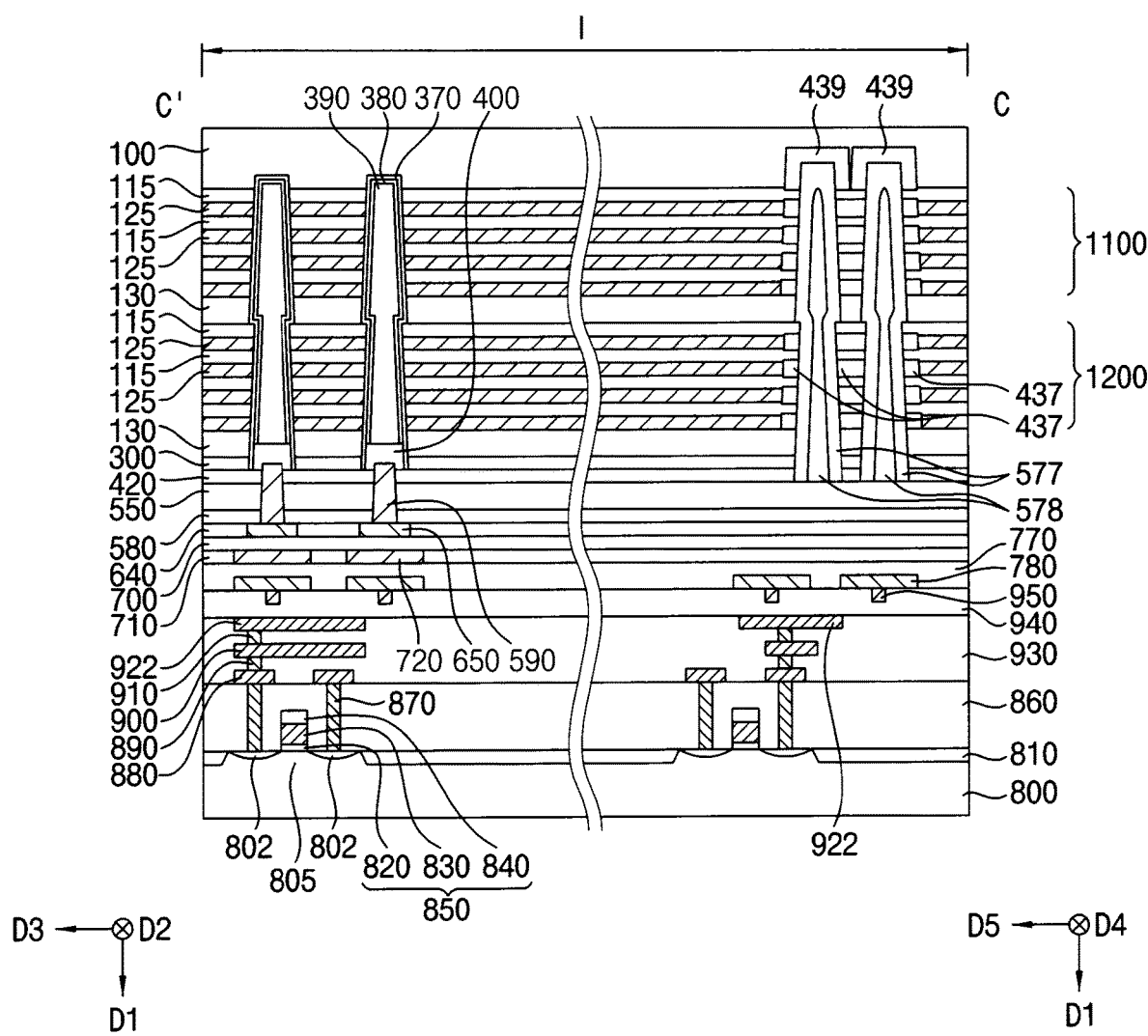

Referring to FIG. 55, similarly to that of FIG. 54, the nineteenth hole 560 may be filled with an insulating material, e.g., an oxide, however, unlike that of FIG. 53, the nineteenth hole 560 may not be entirely filled with the insulating material. Thus, a twelfth division pattern 577 may be formed on a sidewall and beneath an upper surface of the nineteenth hole 560, and a thirteenth division pattern 578 including air or being in a vacuum state may be formed in a middle portion of the nineteenth hole 560.

Figure 56:
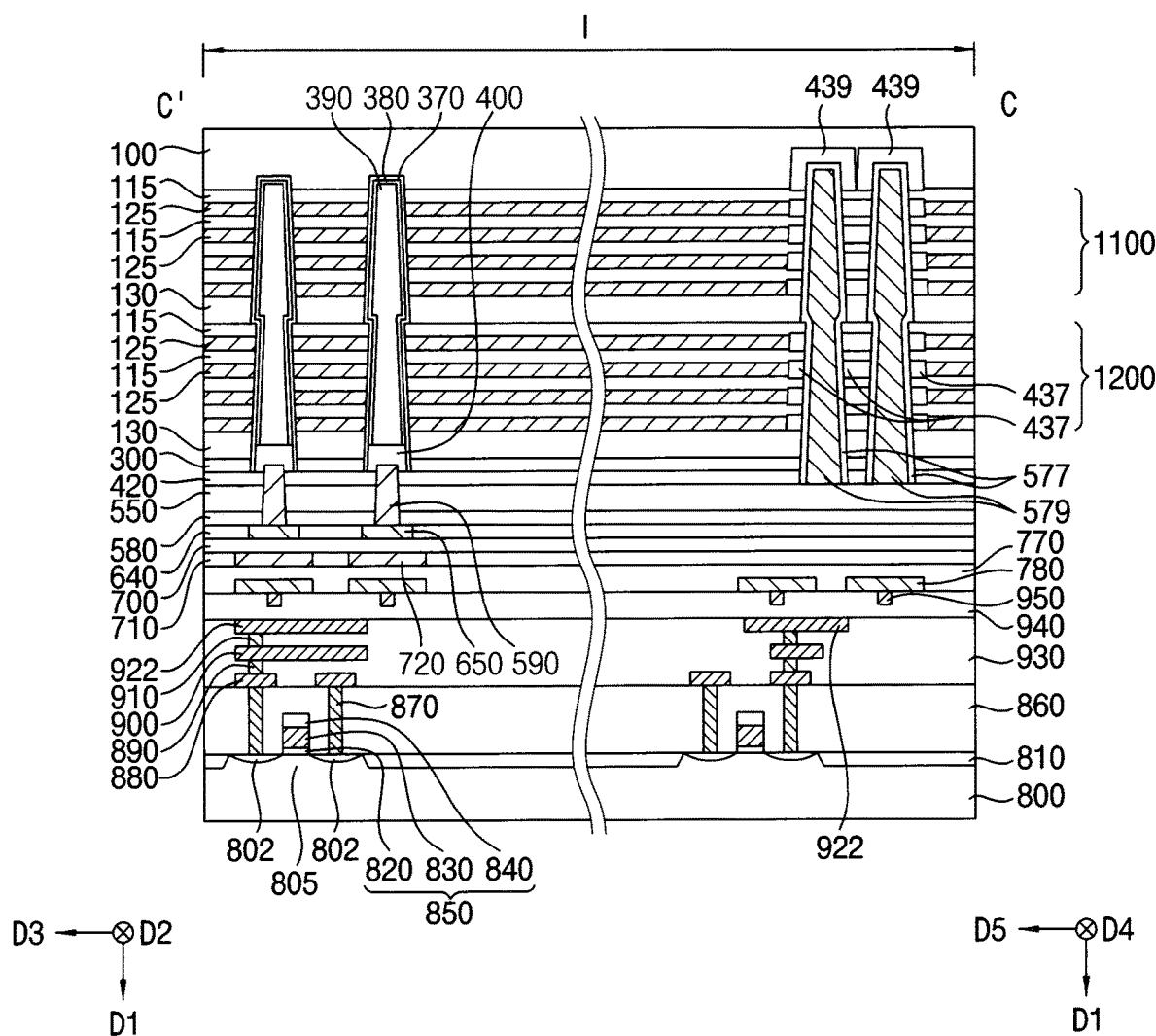

Referring to FIG. 56, similarly to that of FIG. 54, the nineteenth hole 560 may be filled with an insulating material, e.g., an oxide, however, unlike that of FIG. 53, the nineteenth hole 560 may not be entirely filled with the insulating material, and a conductive material, e.g., a metal may be filled in an inner space of the insulating material. Thus, the twelfth division pattern 577 may be formed on a sidewall and beneath an upper surface of the nineteenth hole 560, and a fourteenth division pattern 579 including the conductive material may be formed in a middle portion of the nineteenth hole 560.

Figure 57:
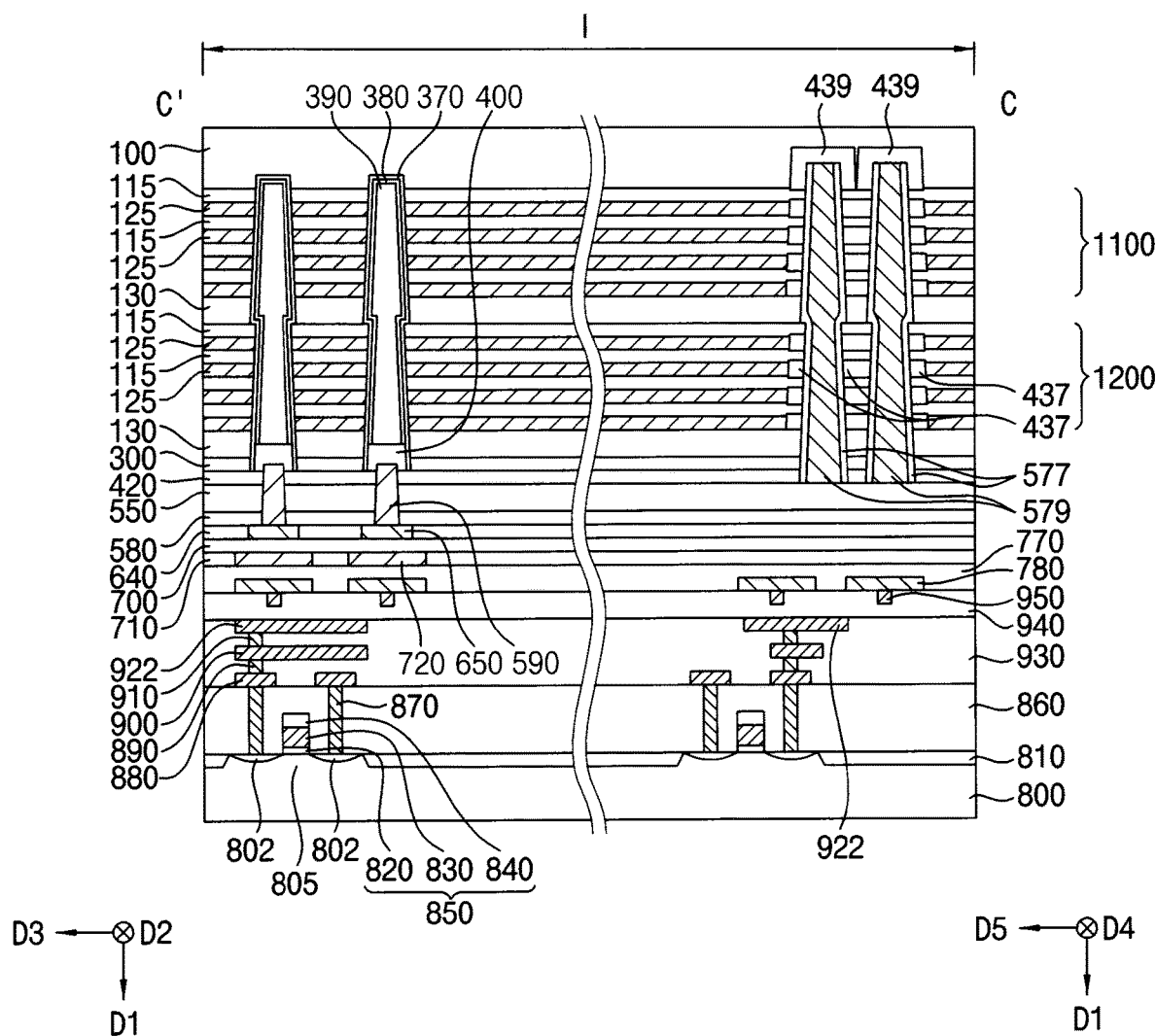

Referring to FIG. 57, similarly to that of FIG. 56, the nineteenth hole 560 may be filled with the twelfth and fourteenth division patterns 577 and 579. However, the twelfth division pattern 577 may not be formed in an upper portion of the nineteenth hole 560 adjacent to the sixth insulation pattern 439, and the fourteenth division pattern 579 may be formed therein.

Further, in some embodiments, the fourteenth division pattern 579 may extend through the sixth insulation pattern 439 to contact the first substrate 100.

Up to now, the third division pattern structure for dividing the memory blocks from each other has been formed by removing portions of the gate electrodes 125 between the nineteenth holes 560, or by removing portions of the gate electrodes 125 adjacent the nineteenth holes 560 and performing an oxidation process, however, embodiments are not limited thereto.

That is, the portions of the gate electrodes 125 between the nineteenth holes 560 may not be entirely removed, and the oxidation process may be performed on the portions thereof to form the third division pattern structure extending in the second direction D2.

As illustrated above, the third division pattern structure extending in the second direction D2 to divide the gate electrode structure in the third direction D3 may include the vertical portions extending in the first direction D1 and being spaced apart from each other in the second direction D2 in a zigzag pattern and the horizontal portion extending in the horizontal direction from a sidewall of each of the vertical portion, and the vertical portions of the third division pattern structure may be connected with each other by the horizontal portion.

The vertical portion of the third division pattern structure may include silicon oxide and/or a metal, and the horizontal portion of the third division pattern structure may include silicon oxide. Alternatively, the vertical portion of the third division pattern structure may include silicon oxide and/or air, and the horizontal portion of the third division pattern structure may include silicon oxide and/or air.

FIGS. 58 to 64 are cross-sectional views illustrating a method of manufacturing a semiconductor device in accordance with example embodiments, which are cross-sectional views taken along lines A-A' of corresponding plan views, respectively. This method may include processes substantially the same as or similar to those illustrated with reference to FIGS. 1 to 46, and thus repeated descriptions thereof are omitted herein.

Figure 58:
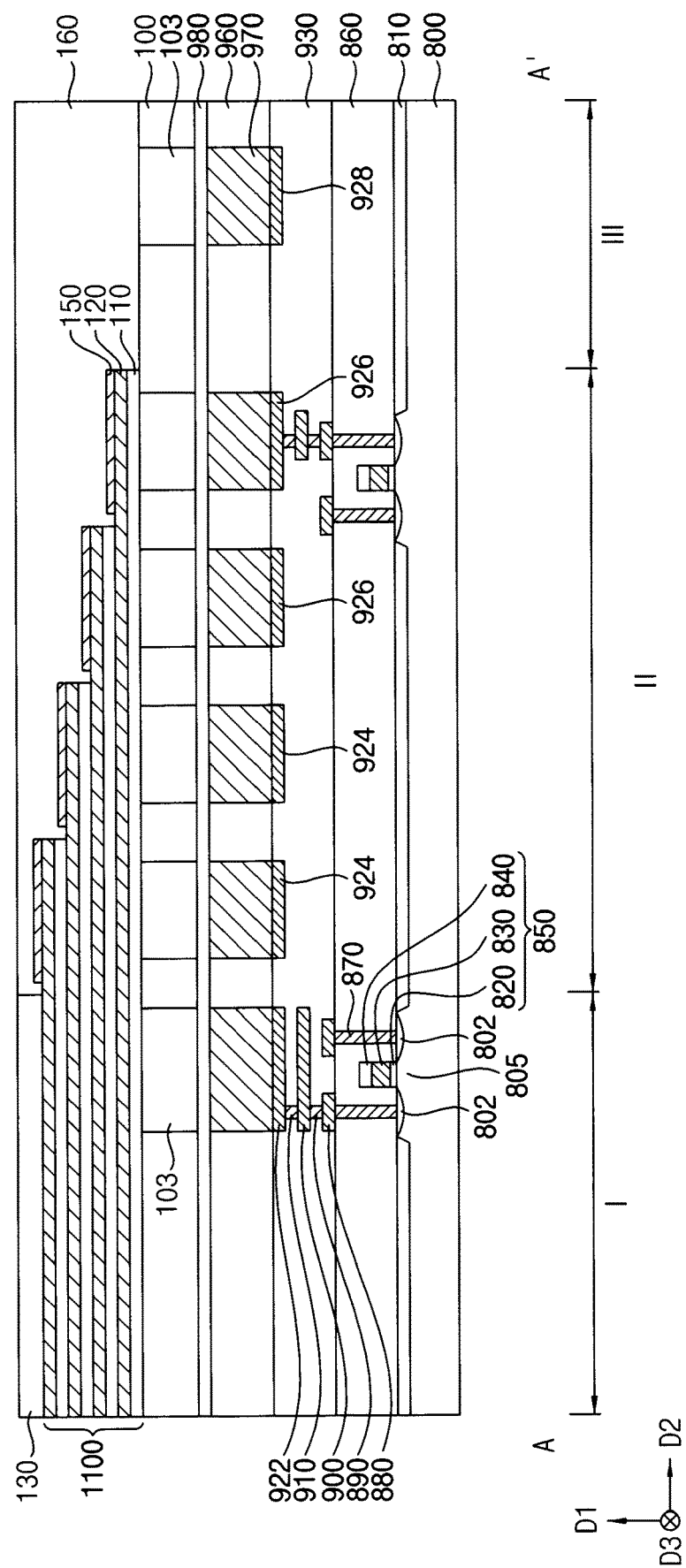
FIGS. 58 to 64B are cross-sectional views of stages in a method of manufacturing a semiconductor device in accordance with example embodiments, which are taken along lines A-A' of corresponding plan views, respectively.

Referring to FIG. 58, processes substantially the same as or similar to those illustrated with reference to FIG. 40 may be performed to form the lower circuit pattern on the second substrate 800, and third and fourth insulating interlayers 960 and 980 may be sequentially stacked on the second insulating interlayer 930 and the first to sixth lower wirings 880, 900, 922, 924, 926 and 928.

A second etch stop pattern 970 may be formed through the third lower insulating interlayer 960 to contact an upper surface of each of the first to sixth lower wirings 880, 900, 922, 924, 926 and 928. The second etch stop pattern 970 may include a material having an etching selectivity with respect to the fourth lower insulating interlayer 980 including silicon oxide, which may be polysilicon doped with n-type or p-type impurities.

Processes substantially the same as or similar to those illustrated with reference to FIGS. 1 to 5 may be performed to form the first substrate 100 on the fourth lower insulating interlayer 980, and the first mold 1100 may be formed on the first substrate 100.

However, an eleventh insulation pattern 103 may be formed through the first substrate 100 to overlap the second etch stop pattern 970 in the first direction D, which may include an oxide, e.g., silicon oxide.

In the method illustrated with reference to FIGS. 1 to 46, the gate electrodes may be formed using the first and second molds 1100 and 1200 sequentially stacked on the first substrate 100, however, a method of forming the gate electrodes using one mold, e.g., the first mold 1100 will be illustrated for the convenience of explanation, hereinafter. However, embodiments are not limited thereto, e.g., the method of forming the gate electrodes using the first and second molds 1100 and 1200 may be used.

The gate electrodes may be formed using the first mold 1100 only, and thus the processes substantially the same as or similar to those illustrated with reference to FIGS. 3 to 5, that is, the process for partially etching the sacrificial pad layer 150 of each step in the first mold 1100 to form the first sacrificial pad 152 in the first portion of the memory block may be skipped.

Figure 59:
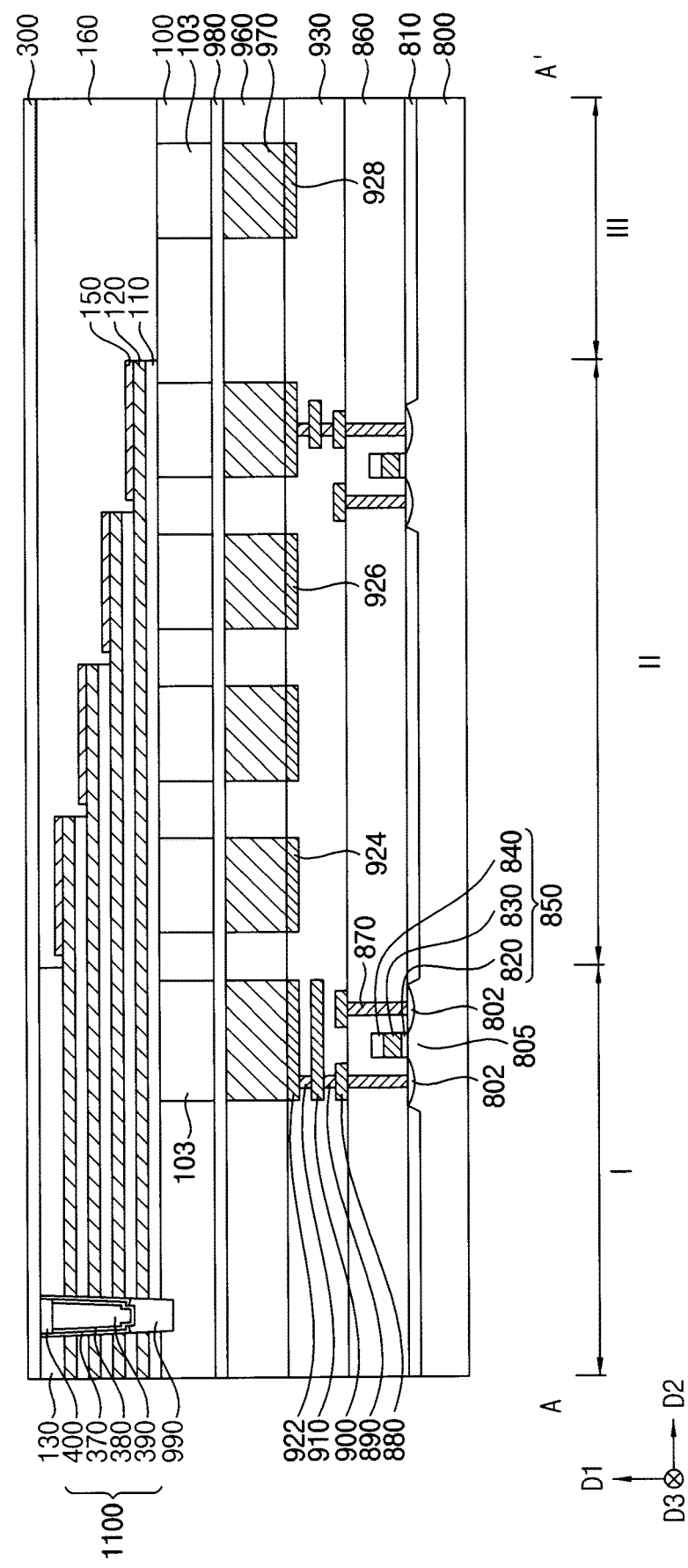

Referring to FIG. 59, processes substantially the same as or similar to those illustrated with reference to FIG. 13 may be performed to form the second division pattern 410. A channel hole extending through the first mold 1100 to expose an upper surface of the first substrate 100 may be formed, a semiconductor pattern 990 may be formed in a lower portion of the channel hole, and the charge storage structure 370, the channel 380, the filling pattern 390 and the capping pattern 400 may be formed in the channel hole.

However, the charge storage structure 370 may have a cup-like shape of which a central bottom is opened, and thus a bottom surface of the channel 380 may extend through the charge storage structure 370 to contact an upper surface of the semiconductor pattern 990.

The semiconductor pattern 990 may be formed by a selective epitaxial growth (SEG) process using the upper surface of the first substrate 100 as a seed, and may include single crystalline silicon or polysilicon.

The third insulating interlayer 300 may be formed on the second insulation layer 130, the first insulating interlayer 160, the capping pattern 400 and the charge storage structure 370.

A tenth opening may be formed to extend in the second direction D2 on the first and second regions I and II of the first substrate 100, and a fourth division pattern may be formed in the fourth opening so as to separate the memory blocks from each other in the third direction D3. The fourth division pattern may be formed at a place where the third division pattern of the third division layer 570 formed by the processes substantially the same as or similar to those illustrated with reference to FIGS. 27 to 29 and the second insulation pattern adjacent thereto are formed.

Figure 60:
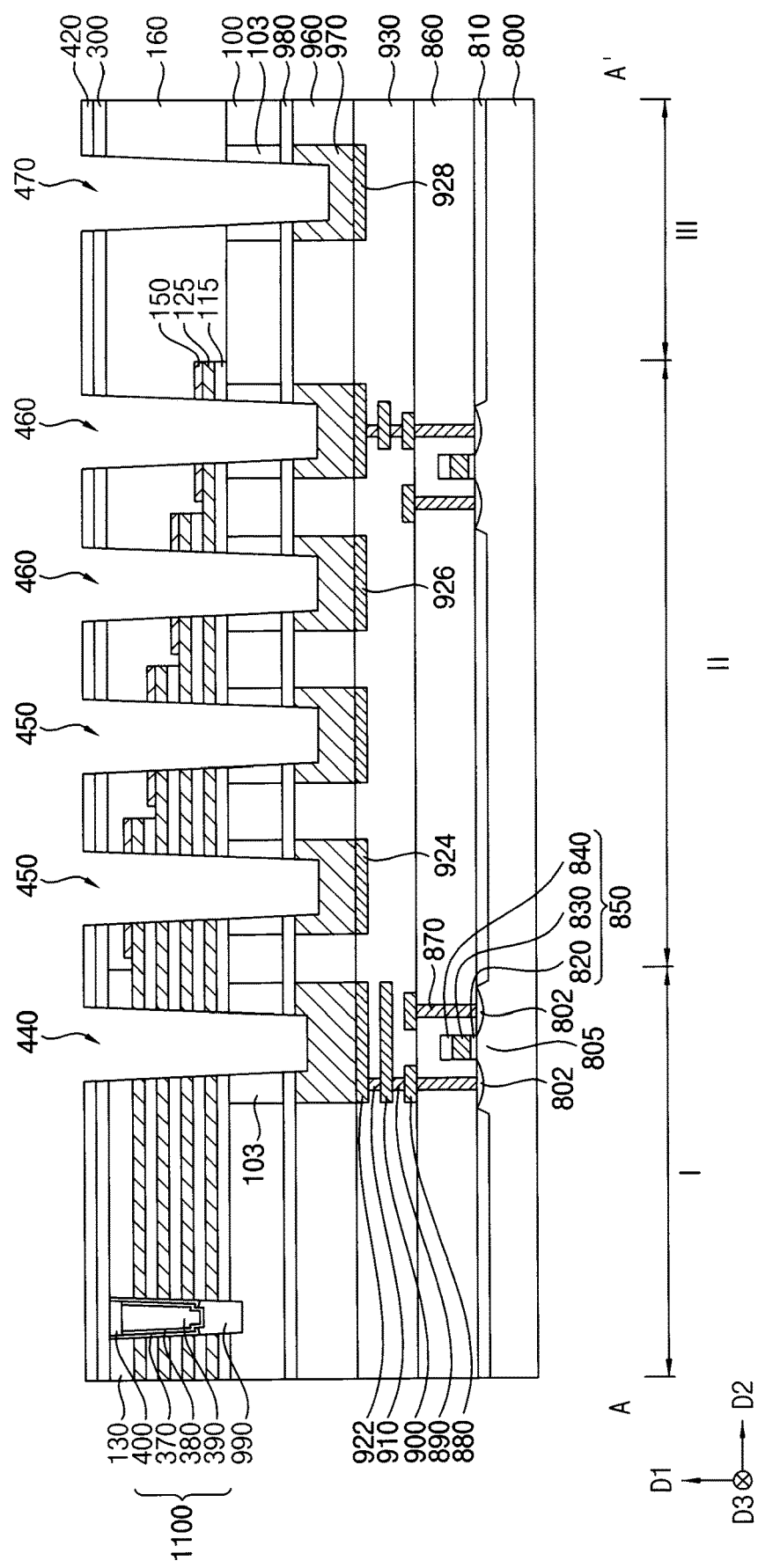

Referring to FIG. 60, processes substantially the same as or similar to those illustrated with reference to FIGS. 22 to 24 may be performed, and thus the fifteenth to eighteenth holes 440, 450, 460 and 470 may be formed through the third and fourth insulating interlayers 300 and 420, the second insulation layer 130, the first mold 1100, the eleventh insulation pattern 103 in the first substrate 100, and the fourth lower insulating interlayer 980 to expose upper surfaces of corresponding second etch stop patterns 970, respectively. However, the channel hole corresponding to the thirteenth hole 310 and the channel 380 have already been formed previously, and the tenth opening corresponding to the fourteenth hole 430 and the fourth division pattern have been also formed previously.

Figure 61:
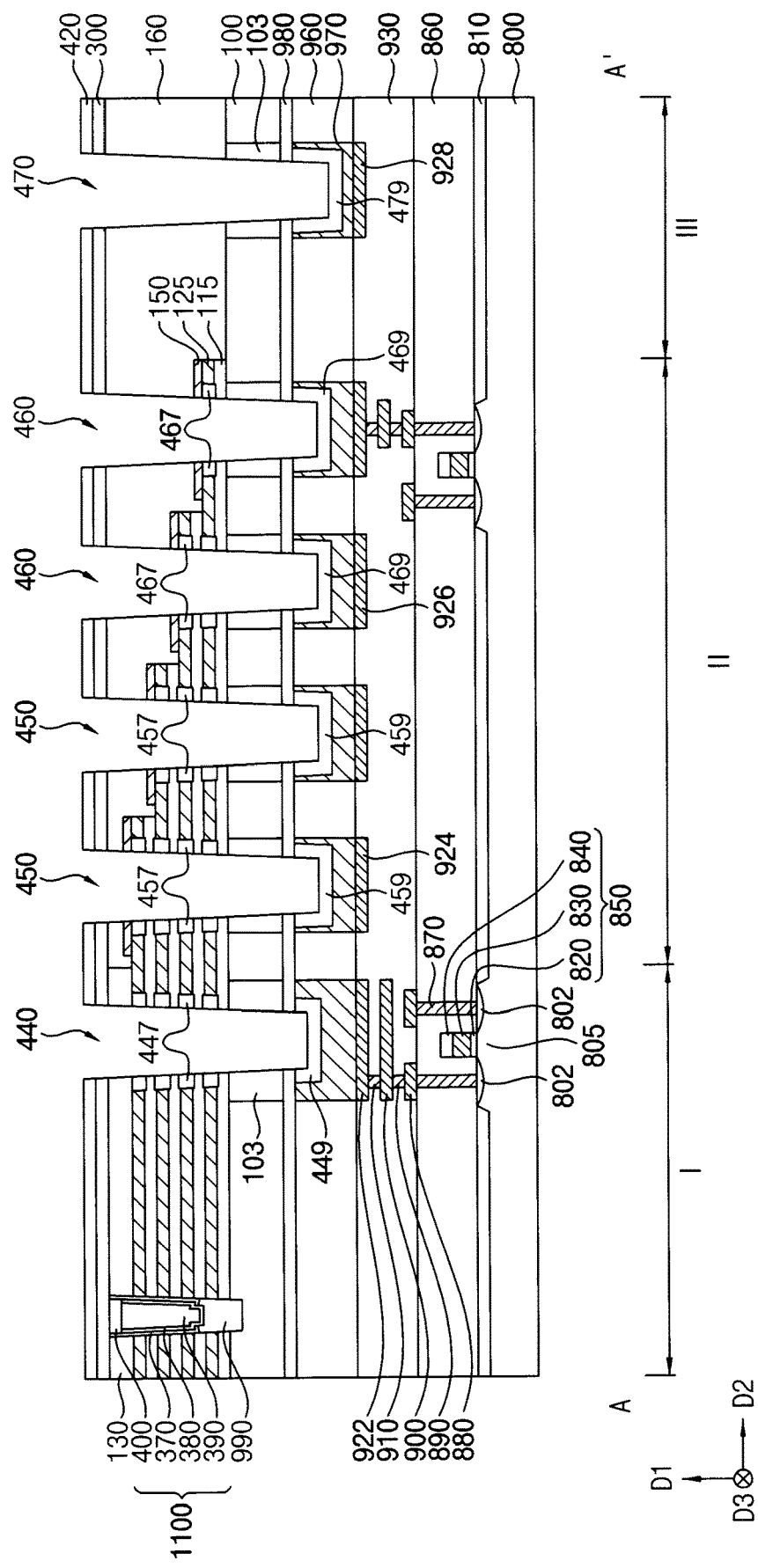

Referring to FIG. 61, processes substantially the same as or similar to those illustrated with reference to FIGS. 25 to 29 may be performed, and thus the third to fifth insulation patterns 447, 457 and 467 may be formed on sidewalls of the fifteenth to seventeenth holes 440, 450 and 460, respectively, and seventh to tenth insulation patterns 449, 459, 469 and 479 may be formed on the upper surfaces of the second etch stop pattern 970 under the fifteenth to eighteenth holes 440, 450, 460 and 470, respectively.

Figure 62:
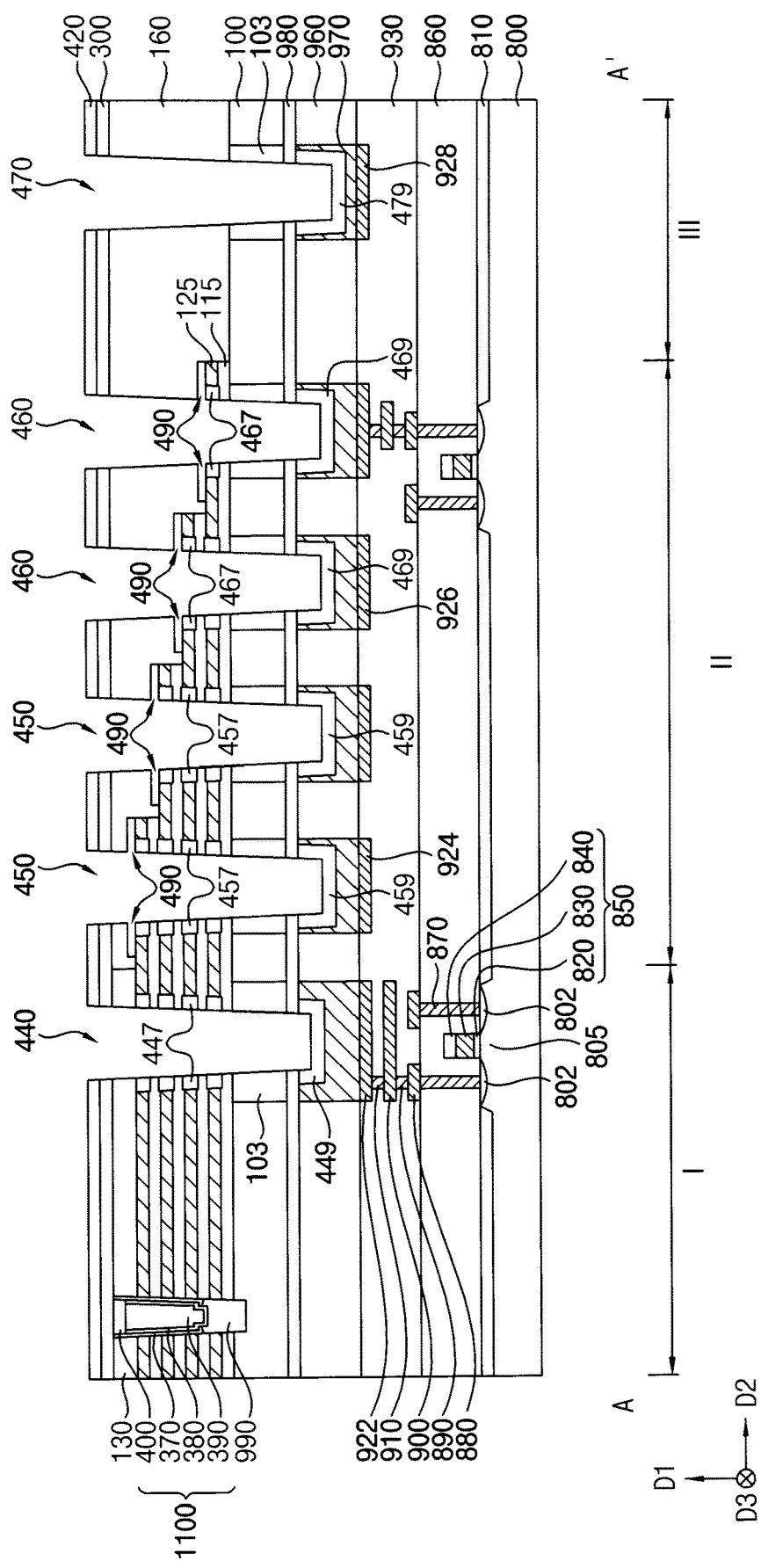

Referring to FIG. 62, processes substantially the same as or similar to those illustrated with reference to FIGS. 30 and 31 may be performed, and thus the sacrificial pad layers 150 exposed by the sixteenth and seventeenth holes 450 and 460 may be removed to form eighth recesses 490.

Figure 63A:
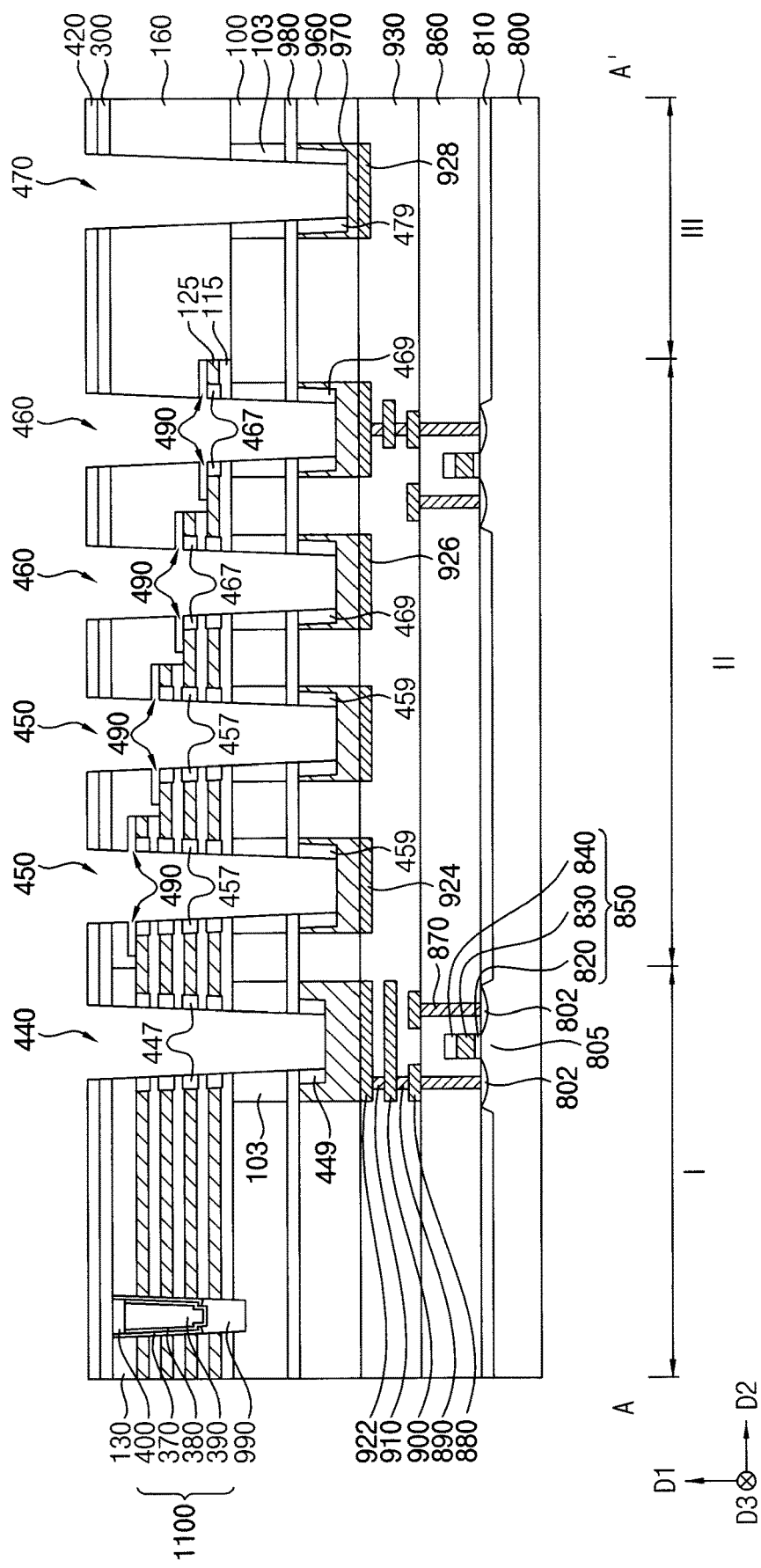

Referring to FIG. 63A, the seventh to tenth insulation patterns 449, 459, 469 and 479 on upper surfaces of the second etch stop patterns 970 may be partially removed by an etching process to expose the upper surfaces of the second etch stop patterns 970.

In example embodiments, central portions of the seventh to tenth insulation patterns 449, 459, 469 and 479 may be removed, so that the seventh to tenth insulation patterns 449, 459, 469 and 479 may remain on lower sidewalls of the fifteenth to eighteenth holes 440, 450, 460 and 470, respectively.

During the etching process, the third to fifth insulation patterns 447, 457 and 467 exposed by the eighth recesses 490 formed by processes illustrated with reference to FIG. 51 may be also removed, and thus, in some embodiments, the order of the above processes may be changed.

Figure 63B:
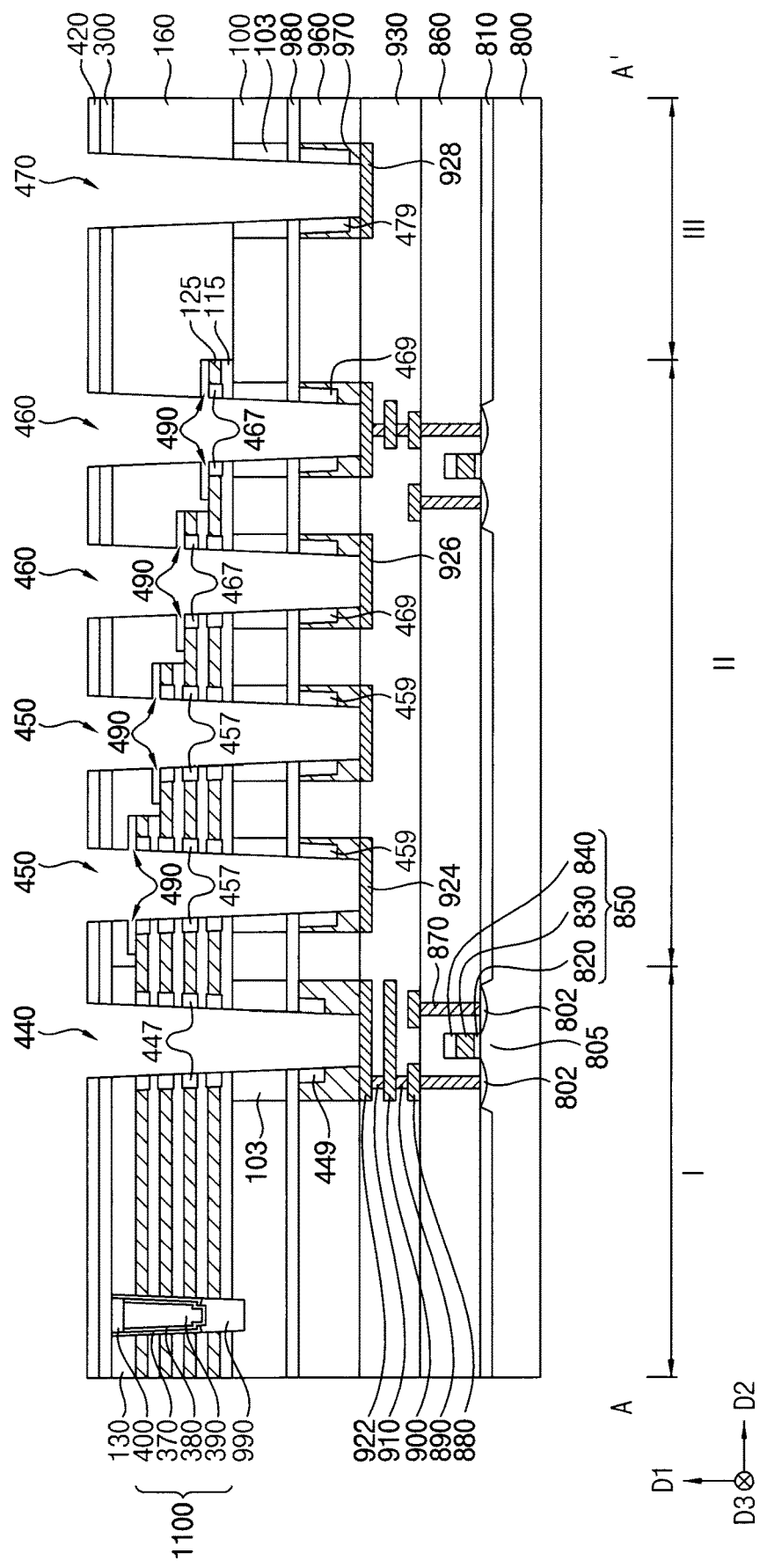

Referring to FIG. 63B, the portions of the second etch stop patterns 970 exposed by the etching process may be also removed, so that upper surfaces of the third to sixth lower wirings 922, 924, 926 and 928 may be exposed.

Figure 64A:
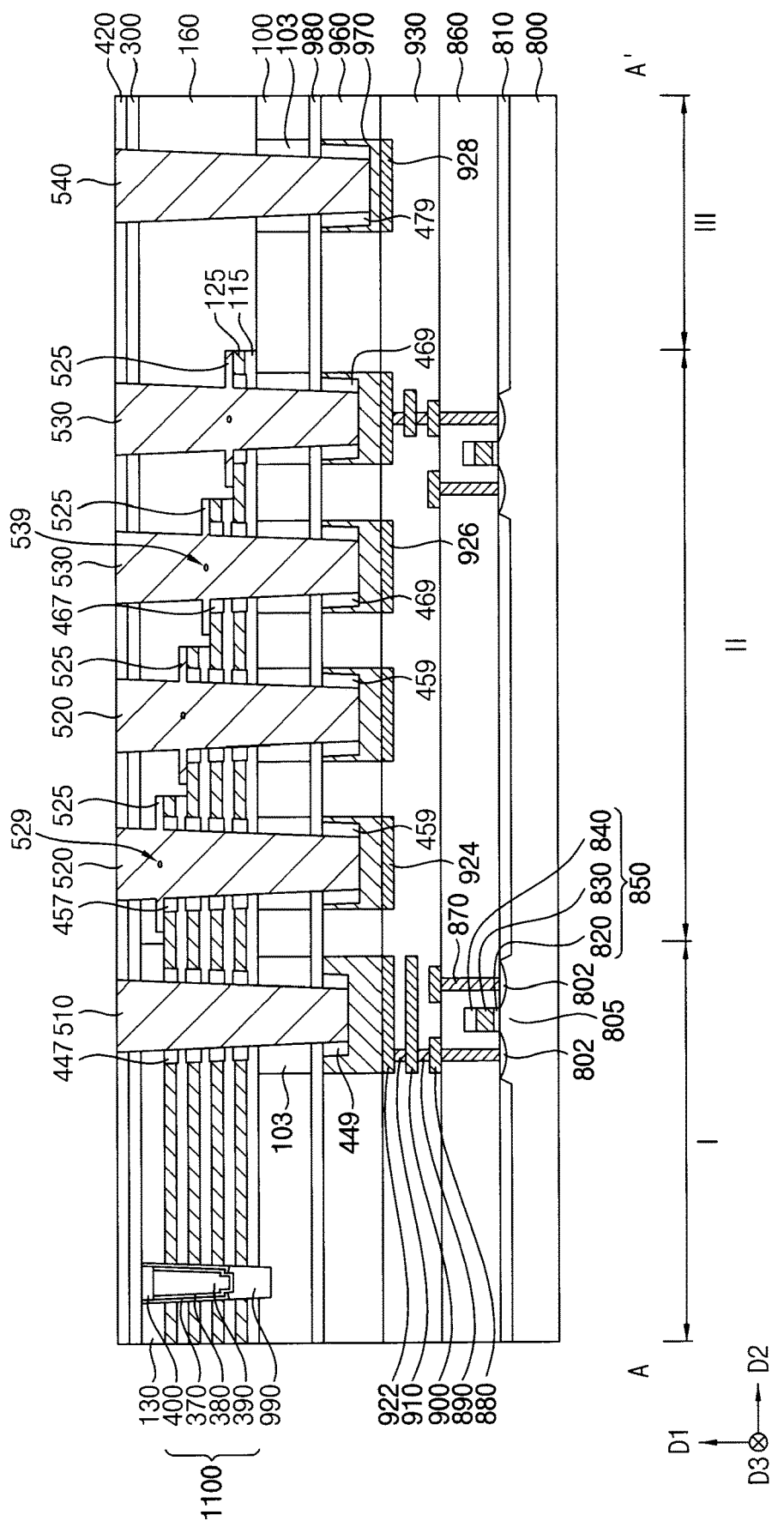
Figure 64B:
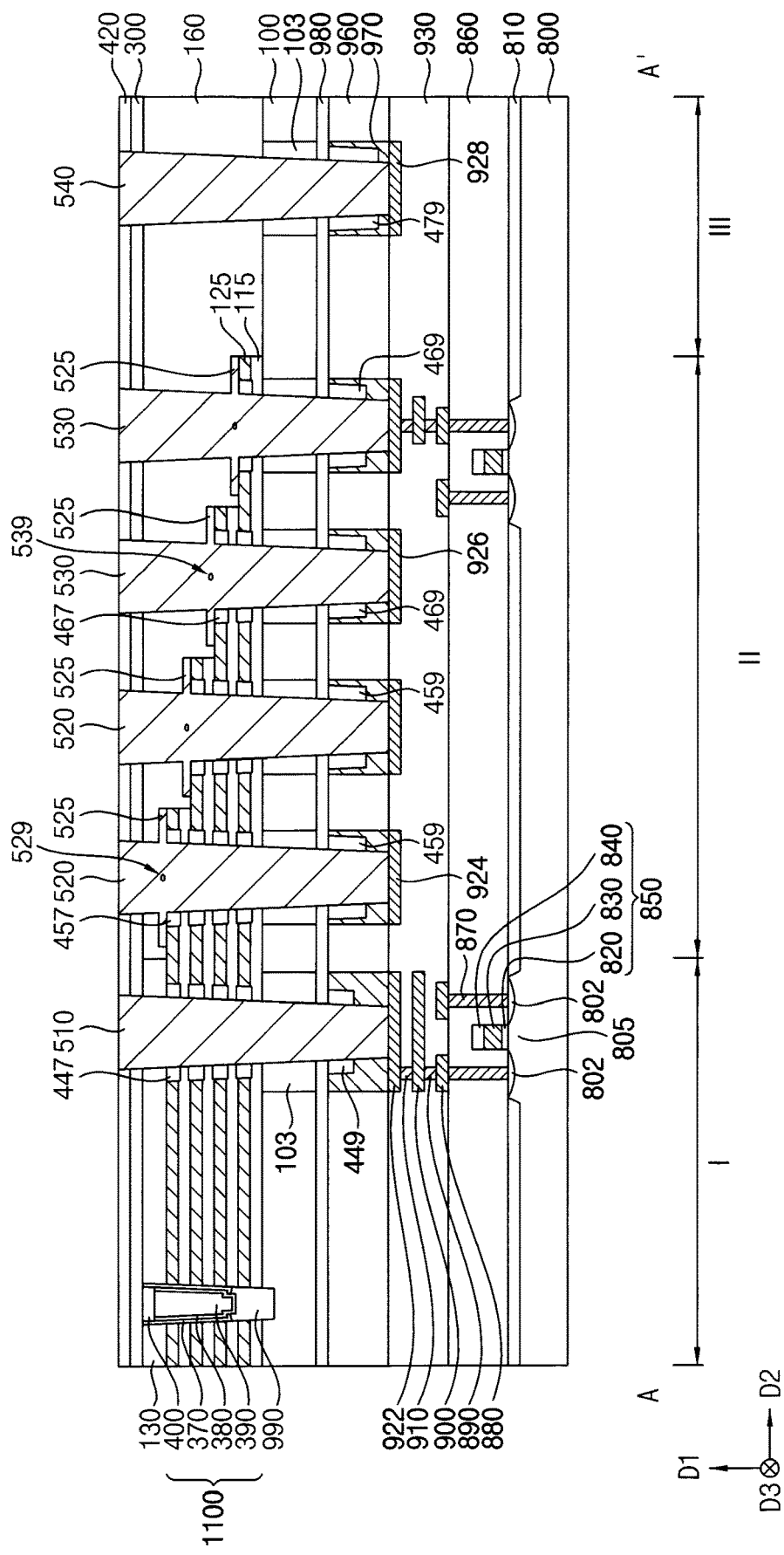

Referring to FIGS. 64A and 64B, processes substantially the same as or similar to those illustrated with reference to FIGS. 32 to 35 may be performed, so that the second to fifth conductive patterns 510, 520, 530 and 540 filling the fifteenth to eighteenth holes 440, 450, 460 and 470, respectively, may be formed.

Processes substantially the same as or similar to those illustrated with reference to FIG. 39 may be performed to complete the fabrication of the vertical memory device.

The vertical memory device manufactured by the above processes may include the lower circuit pattern on the second substrate 800 and the second etch stop patterns 970 on the lower circuit pattern, and the second to fourth conductive patterns 510, 520 and 530 may extend through the first substrate 100 to contact corresponding ones of the second etch stop patterns 970, and the fifth conductive pattern 540 may contact a corresponding one of the second etch stop patterns 970. The second etch stop patterns 970 may include a conductive material, e.g., doped polysilicon, and thus the second to fourth conductive patterns 510, 520 and 530 may be electrically connected with the third to sixth lower wirings 922, 924, 926 and 928 via the second etch stop patterns 970.

Figure 65:
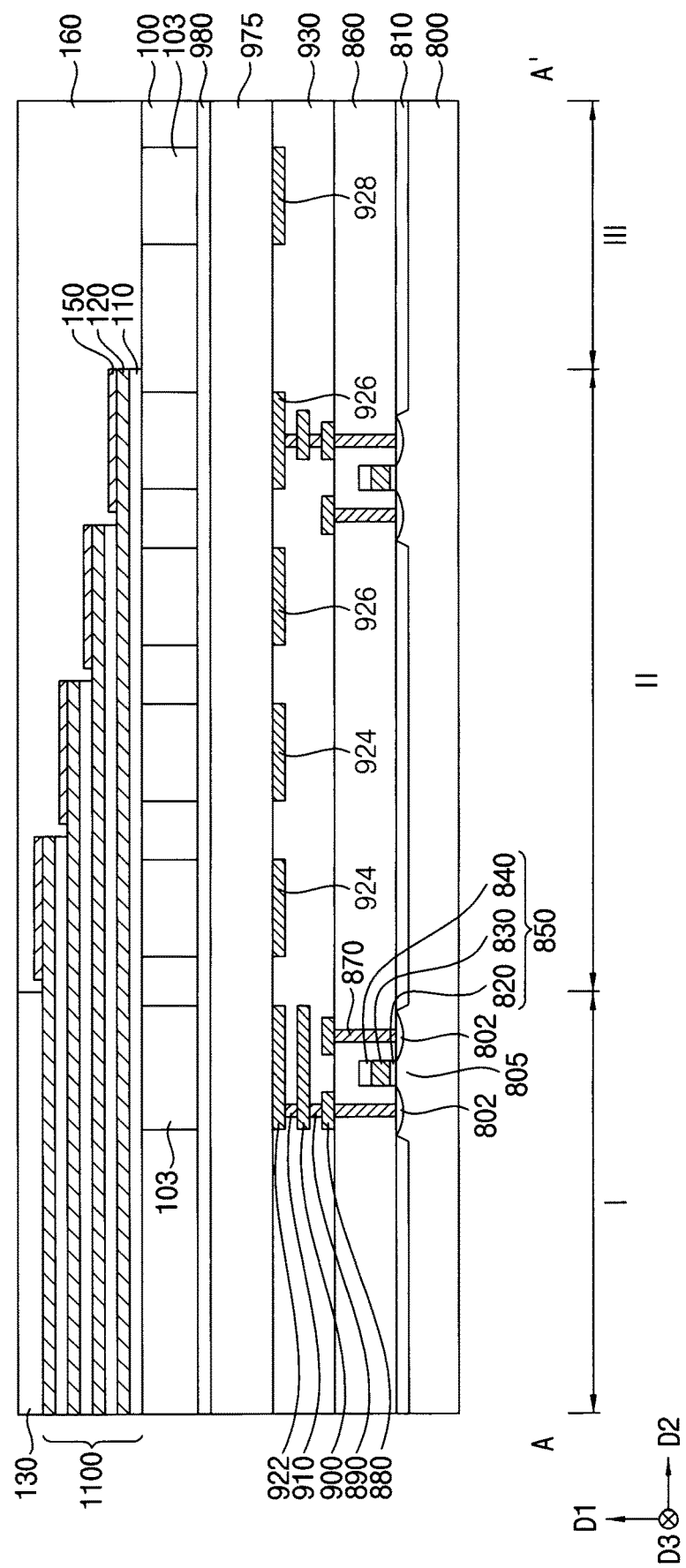
FIGS. 65 to 67 are cross-sectional views of stages in a method of manufacturing a semiconductor device in accordance with example embodiments, which are taken along lines A-A' of corresponding plan views, respectively.
Figure 66:
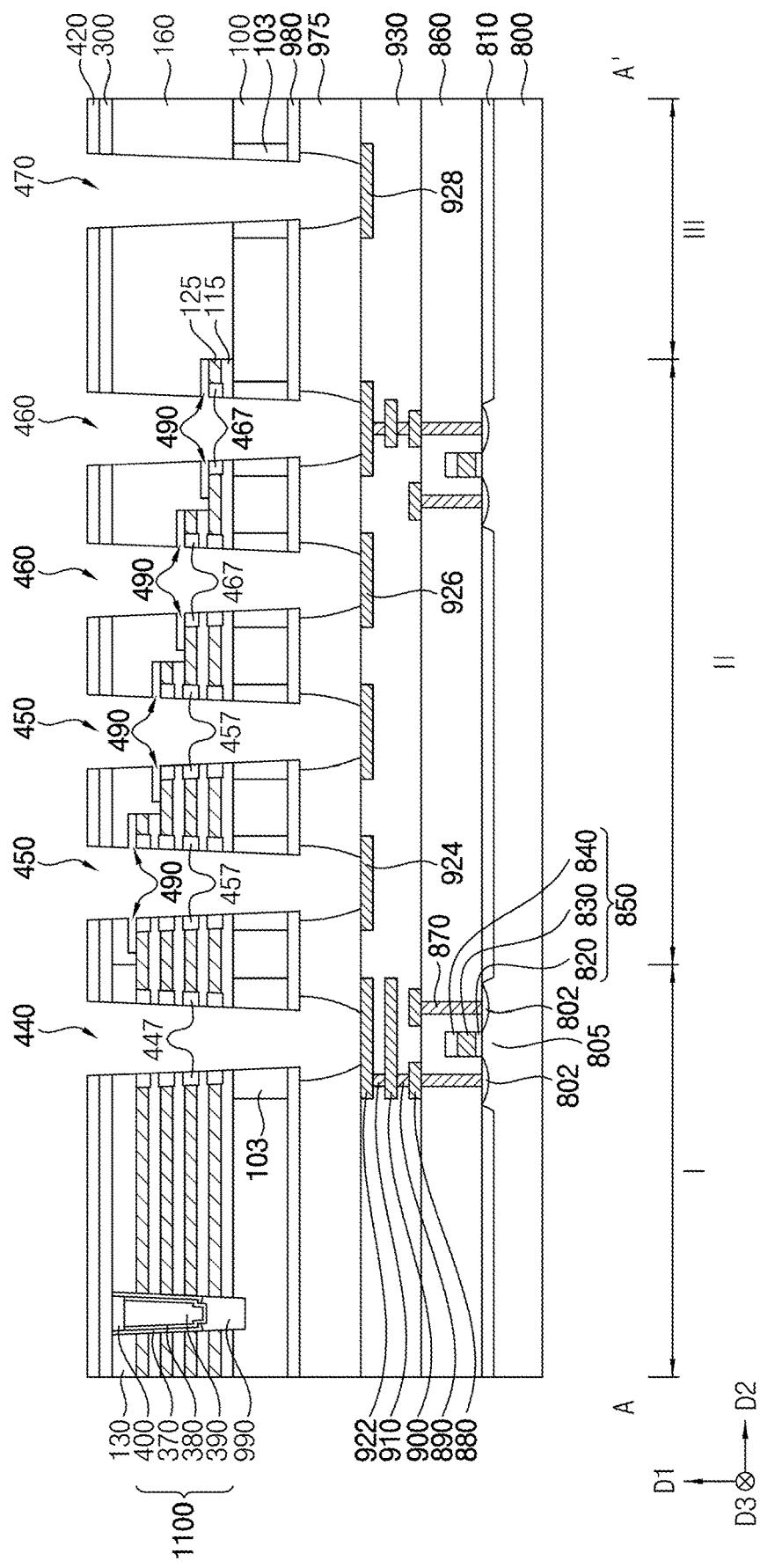
Figure 67:
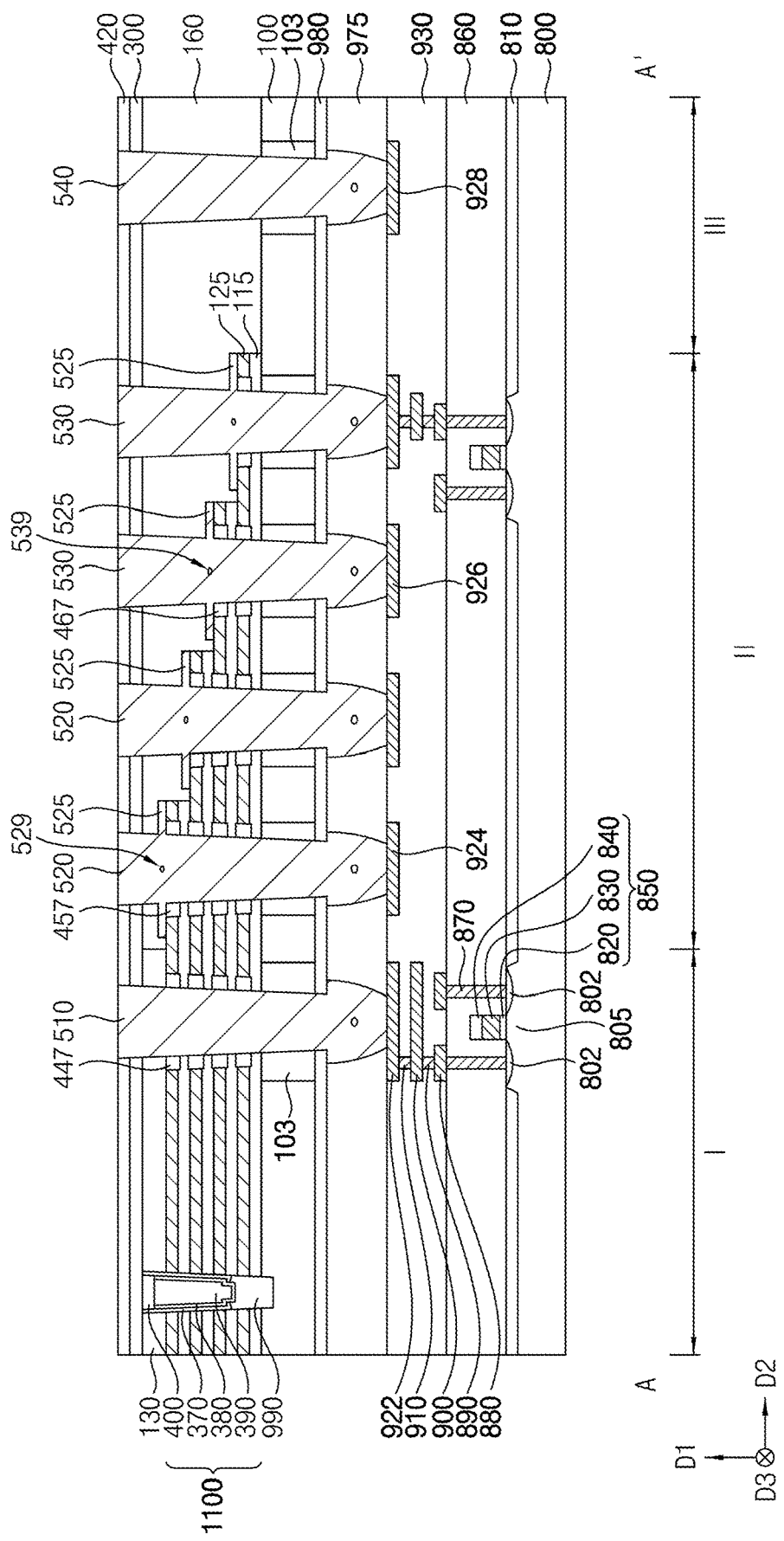

FIGS. 65 to 67 are cross-sectional views illustrating a method of manufacturing a semiconductor device in accordance with example embodiments, which are cross-sectional views taken along lines A-A' of corresponding plan views, respectively. This method may include processes substantially the same as or similar to those illustrated with reference to FIGS. 58 to 64, and thus repeated descriptions thereof are omitted herein.

Referring to FIG. 65, processes substantially the same as or similar to those illustrated with reference to FIG. 58 may be performed.

However, a third etch stop layer 975 may be formed instead of the third lower insulating interlayer 960 and the second etch stop patterns 970, which may include a metal oxide, e.g., aluminum oxide.

Referring to FIG. 66, processes substantially the same as or similar to those illustrated with reference to FIGS. 59 to 63 may be performed.

However, the processes substantially the same as or similar to those illustrated with reference to FIGS. 62 and 63 may be simultaneously performed by an etching process using, e.g., phosphoric acid, and thus the sacrificial pad layers 150 exposed by the sixteenth and seventeenth holes 450 and 460 and including a nitride and the seventh to tenth insulation patterns 449, 459, 469 and 479 exposed by the fifteenth to eighteenth holes 440, 450, 460 and 470, respectively, and including silicon oxide may be simultaneously removed. Further, the third etch stop layer 975 including a metal oxide may be partially removed during the etching process, so that upper surfaces of the third to sixth lower wirings 922, 924, 926 and 928 may be exposed.

Referring to FIG. 67, processes substantially the same as or similar to those illustrated with reference to FIG. 64 may be performed to complete the fabrication of the vertical memory device.

In example embodiments, a portion of each of the second to fourth conductive patterns 510, 520 and 530 extending through the third etch stop layer 975 including a metal oxide may have a width gradually decreasing from a top toward a bottom thereof.

Figure 68A:
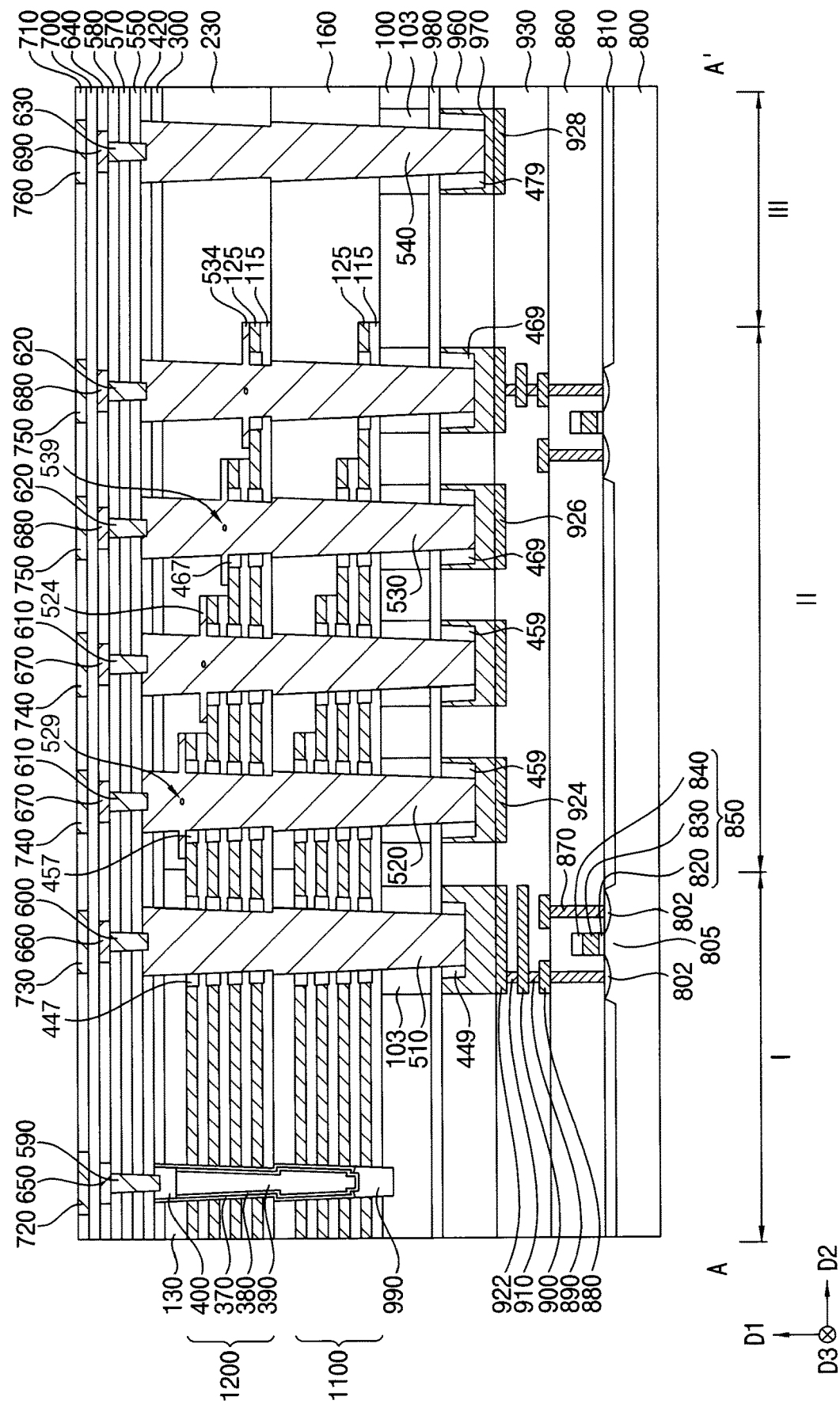
FIGS. 68A and 68B are cross-sectional views of semiconductor devices in accordance with example embodiments, along lines A-A' of corresponding plan views, respectively.
Figure 68B:
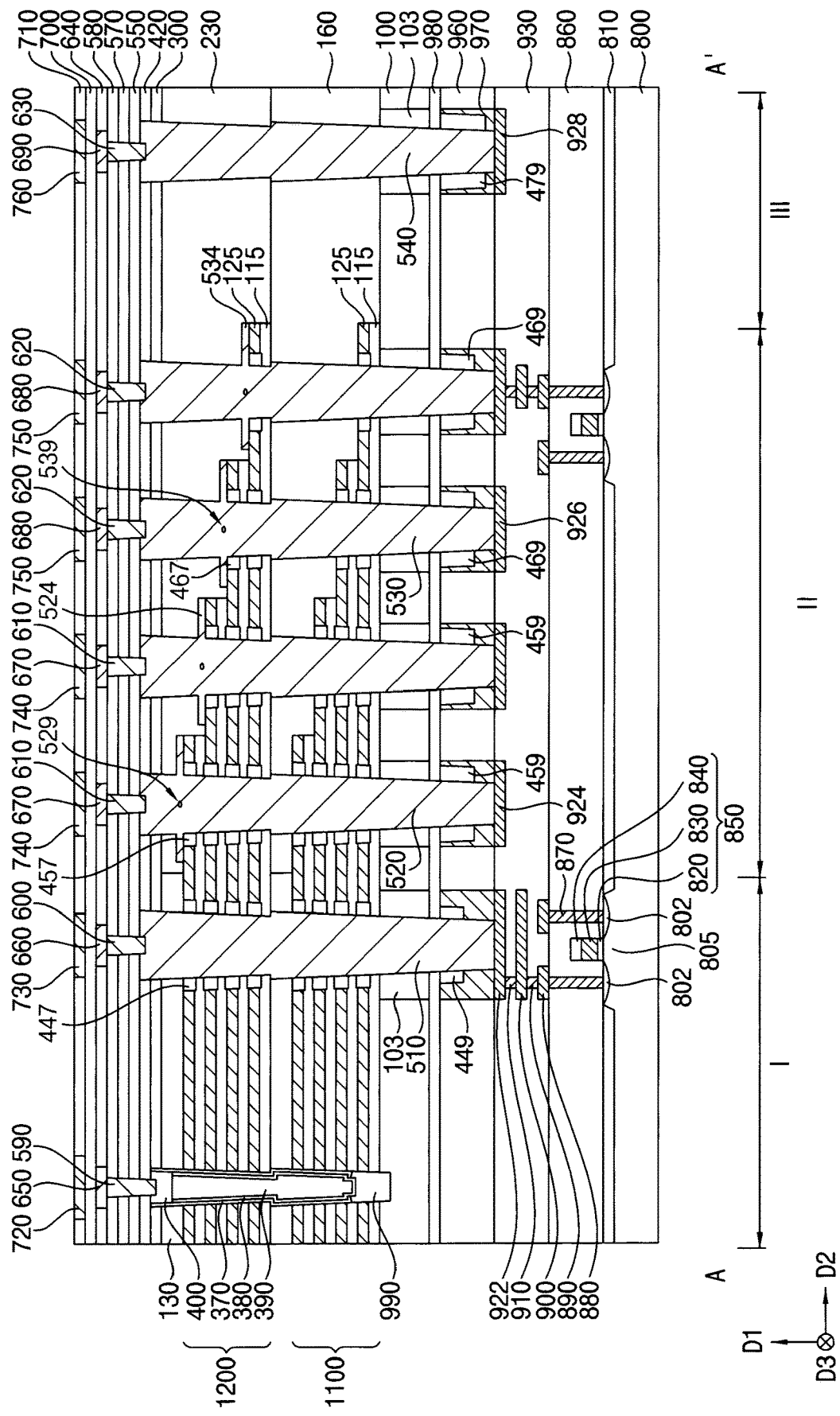

FIGS. 68A and 68B are cross-sectional views illustrating semiconductor devices in accordance with example embodiments, which are cross-sectional views taken along lines A-A' of corresponding plan views, respectively.

The vertical memory device may be manufactured by stacking the first substrate 100 having the eleventh insulation pattern 103 thereon on the structures shown in FIG. 58, that is, the lower circuit pattern on the second substrate 800, the third and fourth lower insulating interlayers 960 and 980, and the second etch stop patterns 970, and performing processes substantially the same as or similar to those illustrated with reference to FIGS. 1 to 39.

By way of summation and review, in a VNAND flash memory device, contact plugs may be formed to contact some vertically stacked gate electrodes on an extension region of a substrate by forming a through via extending through the gate electrodes on a cell region of the substrate, and a through via on a peripheral circuit region of the substrate, e.g., the contact plugs and the through vias may be formed by separate processes. However, such a method may increase process time and cost. Further, the contact plugs and the through vias may require separation in memory blocks, respectively, which may also increase the process time and cost.

In contrast, example embodiments provide a vertical memory device having improved characteristics. That is, in a method of manufacturing a vertical memory device in accordance with example embodiments, the contact plug and the through via may be formed by the same etching process and deposition process, so as to reduce the cost and time for forming the contact plug and the through via. The contact plug may extend through the gate electrode structure including the gate electrodes, while being electrically connected to only one gate electrode at a certain level among the gate electrodes by forming the conductive pad. In addition, the gate electrode structure may be formed using first and second molds sequentially stacked, and steps of the first and second molds may overlap each other in the vertical direction, so as to reduce the horizontal area of the vertical memory device, the VNAND flash memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
a first gate electrode structure on a first substrate, the first gate electrode structure including first gate electrodes spaced apart from each other in a first direction substantially perpendicular to an upper surface of the first substrate and sequentially stacked in a staircase shape, and each of the first gate electrodes extending in a second direction substantially parallel to the upper surface of the substrate;
a second gate electrode structure on the first gate electrode structure, the second gate electrode structure including second gate electrodes spaced apart from each other in the first direction and sequentially stacked in the staircase shape, and each of the second gate electrodes extending in the second direction;
a channel extending on the first substrate in the first direction through the first and second gate electrode structures; and
first and second contact plugs, each of the first and second contact plugs extending in the first direction through the first and second gate electrode structures,
wherein second steps at respective end portions of the second gate electrodes overlap and are vertically aligned with first steps at respective end portions of the first gate electrodes in the first direction, the first and second steps that are vertically aligned with each other extending to a same length in the second direction,
wherein a first length in the second direction of an uppermost one of the first electrodes is shorter than a second length in the second direction of a lowermost one of the second electrodes, and a third length in the second direction of a lowermost one of the first electrodes equals the second length in the second direction of the lowermost one of the second electrodes,
wherein the first contact plug extends through a corresponding one of the first steps and through a corresponding one of the second steps that is vertically aligned with the corresponding one of the first steps, the first contact plug being electrically connected only to the corresponding one of the first steps among the first steps and the second steps, and wherein the second contact plug extends through another corresponding one of the first steps and through another corresponding one of the second steps that is vertically aligned with the another corresponding one of the first steps, the second contact plug being electrically connected only to the another corresponding one of the second steps among the first steps and the second steps.

2. The vertical memory device as claimed in claim 1, wherein the contact plug includes:
   a vertical portion extending in the first direction; and
   a protrusion portion protruding from the vertical portion in a horizontal direction substantially parallel to the upper surface of the first substrate, the protrusion portion contacting the at least one of the first steps or the at least one of the second steps.

3. The vertical memory device as claimed in claim 2, further comprising an insulation pattern covering a sidewall of the protrusion portion of the contact plug, the insulation pattern contacting the at least one of the first steps or the at least one of the second steps.

4. The vertical memory device as claimed in claim 2, further comprising an insulation pattern partially covering a sidewall of the vertical portion of the contact plug, the insulation pattern including an oxide and contacting a sidewall of each of the first and second gate electrodes facing the vertical portion of the contact plug.

5. The vertical memory device as claimed in claim 1, further comprising:
   gate electrode stack structures, each of which includes the first and second gate electrode structures; and
   a first division pattern structure on the first substrate, the first division pattern structure extending in a second direction substantially parallel to the upper surface of the first substrate and separating the gate electrode stack structures from each other in a third direction, the third direction being substantially parallel to the upper surface of the first substrate and crossing the second direction,
   wherein each of the first and second gate electrodes extends in the second direction, the first steps and the second steps being at respective ones of the end portions of the first gate electrodes and at respective ones of the end portions the of the second gate electrodes, respectively, in the second direction, and
   wherein each of opposite sidewalls in the third direction of the first division pattern structure has concave and convex portions thereon.

6. The vertical memory device as claimed in claim 5, wherein the first division pattern structure includes:
   vertical division patterns spaced apart from each other in the second direction, the vertical division patterns being arranged in a zigzag pattern; and
   an insulation pattern on sidewalls of each of the vertical division patterns.

7. The vertical memory device as claimed in claim 5, further comprising a second division pattern structure extending in the second direction at a central portion in the third direction of each of the gate electrode stack structures on the first substrate, the second division pattern structure partially dividing each of the gate electrode stack structures in the third direction,
   wherein each of the gate electrode stack structures includes first and second portions at opposite sides, respectively, in the third direction of the second division pattern structure.

8. The vertical memory device as claimed in claim 7, wherein:
   the contact plug includes first and second contact plugs extending through the first and second portions of each of the gate electrode stack structures, respectively, and
   the first contact plug is electrically connected to one of the first steps at the first portion of each of the gate electrode stack structures, and the second contact plug is electrically connected to one of the second steps at the second portion of each of the gate electrode stack structures.

9. The vertical memory device as claimed in claim 8, wherein:
   the first contact plug is one of a plurality of first contact plugs disposed in the second direction, and the second contact plug is one of a plurality of second contact plugs disposed in the second direction, and
   each of the first contact plugs is electrically connected to the one of the first steps at the first portion of each of the gate electrode stack structures, and each of the second contact plugs is electrically connected to the one of the second steps at the second portion of each of the gate electrode stack structures.

10. The vertical memory device as claimed in claim 1, further comprising:
    a second substrate under the first substrate;
    a lower circuit pattern on the second substrate; and
    an etch stop pattern on the lower circuit pattern, the etch stop pattern including polysilicon doped with impurities,
    wherein the contact plug extends through the first substrate to contact the etch stop pattern, such that the contact plug is electrically connected to the lower circuit pattern via the etch stop pattern.

11. The vertical memory device as claimed in claim 1, further comprising:
    a second substrate under the first substrate;
    a lower circuit pattern on the second substrate; and
    an etch stop pattern on the lower circuit pattern, the etch stop pattern including polysilicon doped with impurities,
    wherein the contact plug extends through the first substrate and the etch stop pattern to be electrically connected to the lower circuit pattern.

12. The vertical memory device as claimed in claim 11, wherein the etch stop pattern includes a metal oxide, and a portion of the contact plug extending through the etch stop pattern has a width gradually decreasing from a top toward a bottom thereof.

13. The vertical memory device as claimed in claim 1, further comprising a through via extending in the first direction through the first and second gate electrode structures, the through via not extending through the first and second steps,
    wherein an upper surface of the through via is substantially coplanar with an upper surface of the contact plug, and the through via includes substantially the same material as the contact plug.

14. A vertical memory device comprising:
    gate electrode structures on a substrate, each of the gate electrode structures including gate electrodes spaced apart from each other in a first direction substantially perpendicular to an upper surface of the substrate and sequentially stacked in a staircase shape, each of the gate electrodes extending in a second direction substantially parallel to the upper surface of the substrate, and the gate electrode structures being spaced apart from each other in a third direction substantially parallel to the upper surface of the substrate and crossing the second direction;
a channel extending on the substrate in the first direction through each of the gate electrode structures; and
a division pattern structure on the substrate, the division pattern structure being electrically insulated from the channel and including:
vertical insulating portions spaced apart from each other in the second direction and arranged in a zigzag pattern, each of the vertical insulating portions extending in the first direction and completely filling an opening through an entire thickness of a corresponding one of the gate electrode structures, and
a horizontal portion extending from a sidewall of each of the vertical insulating portions in a horizontal direction substantially parallel to the upper surface of the substrate, upper surfaces of the horizontal portion and vertical insulating portions being integral and coplanar with each other,
wherein the vertical insulating portions of the division pattern structure are connected with each other via the horizontal portion, such that the division pattern structure extends in the second direction to divide the gate electrode structures in the third direction.

15. The vertical memory device as claimed in claim 14, wherein:
each of the gate electrode structures includes steps at end portions in the second direction of the gate electrodes, respectively,
the vertical memory device further includes:
contact plugs each of which extends in the first direction through ones of the steps of each of the gate electrode structures, each of the contact plugs contacting only one of the ones of the steps, and
a through via extending in the first direction through each of the gate electrode structures, the through via not extending through any of the steps,
wherein an upper surface of the through via is substantially coplanar with upper surfaces of the contact plugs, and the through via includes a substantially same material as the contact plugs.

16. The vertical memory device as claimed in claim 15, wherein upper surfaces of the division patterns are higher than the upper surfaces of the through via and the contact plugs, and an upper surface of the channel is lower than the upper surfaces of the through via and the contact plugs.

17. The vertical memory device as claimed in claim 15, wherein the vertical insulating portions of the division pattern structure include a silicon oxide, and the horizontal portion of the division pattern structure includes the silicon oxide.

18. The vertical memory device as claimed in claim 15, wherein the vertical insulating portions of the division pattern structure are arranged in rows extending in the second direction, the rows being adjacent to each other in the third direction and offset relative to each other in the second direction to define the zigzag pattern, such that a vertical insulating portion in one row is between two vertical insulating portions in an adjacent row and in contact with the two vertical insulating portions in the adjacent row via the horizontal portion.

19. A vertical memory device comprising:
a first gate electrode structure on a substrate, the first gate electrode structure including first gate electrodes spaced apart from each other in a first direction substantially perpendicular to an upper surface of the substrate and sequentially stacked in a staircase shape, and each of the first gate electrodes extending in a second direction substantially parallel to the upper surface of the substrate;
a second gate electrode structure on the first gate electrode structure, the second gate electrode structure including second gate electrodes spaced apart from each other in the first direction and sequentially stacked in the staircase shape, and each of the second gate electrodes extending in the second direction;
a channel extending on the substrate in the first direction through the first and second gate electrode structures;
first contact plugs, each extending in the first direction through the first and second gate electrode structures; and
second contact plugs, each extending in the first direction through the first and second gate electrode structures,
wherein second steps at end portions in the second direction of the second gate electrodes, respectively, overlap in the first direction and are aligned in the first direction with first steps at end portions in the second direction of the first gate electrodes, respectively, the first and second steps that are aligned with each other in the first direction extending to a same length in the second direction,
wherein each of the first contact plugs includes:
a first vertical portion extending in the first direction through the first and second gate electrode structures, and
a first protrusion portion protruding from the first vertical portion in a horizontal direction substantially parallel to the upper surface of the substrate,
wherein the first protrusion portion of each of the first contact plugs contacts an upper surface of a corresponding one of the first gate electrodes to be electrically connected thereto,
wherein each of the second contact plugs includes:
a second vertical portion extending in the first direction through the first and second gate electrode structures, and
a second protrusion portion protruding from the second vertical portion in the horizontal direction,
wherein the second protrusion portion of each of the second contact plugs contacts an upper surface of a corresponding one of the second gate electrodes to be electrically connected thereto, and
wherein a first length in the second direction of an uppermost one of the first electrodes is shorter than a second length in the second direction of a lowermost one of the second electrodes, and a third length in the second direction of a lowermost one of the first electrodes equals the second length in the second direction of the lowermost one of the second electrodes.

20. The vertical memory device as claimed in claim 19, wherein:
each of the first and second gate electrode structures includes first and second portions disposed in a third direction substantially parallel to the upper surface of the substrate and crossing the second direction, and
each of the first contact plugs extends at least through the first portion of the first gate electrode structure among the first portions of the first and second gate electrode structures, and each of the second contact plugs extends at least through the second portion of the second gate electrode structure among the second portions of the first and second gate electrode structures.

\* \* \* \* \*